United States Patent
Ikeda et al.

(10) Patent No.: US 9,748,291 B2
(45) Date of Patent: Aug. 29, 2017

(54) IMAGING DEVICE HAVING A THIRD CIRCUIT WITH A REGION OVERLAPPING WITH A FOURTH CIRCUIT

(71) Applicant: Semiconductor Energy Laboratory Co., Ltd., Atsugi-shi, Kanagawa-ken (JP)

(72) Inventors: Takayuki Ikeda, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 45 days.

(21) Appl. No.: 14/859,530

(22) Filed: Sep. 21, 2015

(65) Prior Publication Data

US 2016/0093652 A1 Mar. 31, 2016

(30) Foreign Application Priority Data

Sep. 26, 2014 (JP) ................................. 2014-196247

(51) Int. Cl.
*H01L 29/786* (2006.01)
*H01L 27/146* (2006.01)
(Continued)

(52) U.S. Cl.
CPC .. *H01L 27/14612* (2013.01); *H01L 27/14634* (2013.01); *H01L 27/14645* (2013.01);
(Continued)

(58) Field of Classification Search
CPC . H01L 29/7869; H01L 27/124; H01L 29/786; H01L 29/78648; H01L 27/146; H01L 31/032; H01L 31/027
(Continued)

(56) References Cited

U.S. PATENT DOCUMENTS 4,860,076 A 8/1989 Tabei et al.
5,198,673 A 3/1993 Rougeot et al.
(Continued)

FOREIGN PATENT DOCUMENTS

CN 102782840 A 11/2012
EP 1737044 A 12/2006
(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Que T Le
(74) *Attorney, Agent, or Firm* — Fish & Richardson P.C.

(57) ABSTRACT

An imaging device which offers an image with high quality and is suitable for high-speed operation is provided. The imaging device includes a first region to an n-th region (n is a natural number of 2 or more and 16 or less) each including a first circuit, a second circuit, a third circuit, and a fourth circuit. The first to third circuits each include a transistor in which silicon is used in an active layer or an active region. The fourth circuit includes a photoelectric conversion element and a transistor in which an oxide semiconductor is used in an active layer. The first circuit includes a region overlapping with the fourth circuit. The third circuit includes a region overlapping with the fourth circuit.

18 Claims, 49 Drawing Sheets

(51) Int. Cl.
    *H01L 29/24*     (2006.01)
    *H01L 31/0272*     (2006.01)
    *H01L 31/032*     (2006.01)

(52) U.S. Cl.
    CPC .. *H01L 27/14659* (2013.01); *H01L 27/14663* (2013.01); *H01L 29/24* (2013.01); *H01L 29/7869* (2013.01); *H01L 31/0272* (2013.01); *H01L 31/0322* (2013.01); *H01L 27/14621* (2013.01); *H01L 27/14627* (2013.01)

(58) Field of Classification Search
    USPC .......................................... 250/208.1, 214 R
    See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,378,391 | B2 | 2/2013 | Koyama et al. |
| 9,307,171 | B2 * | 4/2016 | Kawahito ............ H04N 5/3745 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0205903 | A1 | 9/2005 | Hioki |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0224162 | A1 | 9/2009 | Inuiya et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0307558 | A1 | 12/2010 | Yamazaki et al. |
| 2012/0293698 | A1 | 11/2012 | Sukegawa et al. |
| 2013/0285046 | A1 | 10/2013 | Yamazaki |
| 2014/0240566 | A1 | 8/2014 | Shizukuishi |
| 2015/0279884 | A1 | 10/2015 | Kusumoto |
| 2015/0312500 | A1 | 10/2015 | Sukegawa et al. |
| 2016/0064443 | A1 | 3/2016 | Inoue et al. |
| 2016/0064444 | A1 | 3/2016 | Inoue et al. |

FOREIGN PATENT DOCUMENTS

| | | |
|---|---|---|
| EP | 2226847 A | 9/2010 |
| EP | 2528093 A | 11/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-303266 A | 10/2005 |
| JP | 2006-086493 A | 3/2006 |
| JP | 2007-096055 A | 4/2007 |
| JP | 2007-123861 A | 5/2007 |
| JP | 2009-267912 A | 11/2009 |

(56) References Cited

FOREIGN PATENT DOCUMENTS

| | | |
|---|---|---|
| JP | 2011-119711 A | 6/2011 |
| JP | 2011-159958 A | 8/2011 |
| JP | 2013-084647 A | 5/2013 |
| JP | 2013-243355 A | 12/2013 |
| JP | 2014-030170 A | 2/2014 |
| JP | 2015-084424 A | 4/2015 |
| KR | 2012-0111730 A | 10/2012 |
| TW | 201143020 | 12/2011 |
| WO | WO-2004/114391 | 12/2004 |
| WO | WO-2011/083722 | 7/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-cryst. Solids (Journal of Non-crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and SC2O3-A2O3-BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 :Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystaline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Phsyical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical PApers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 ; SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium DIgest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW'02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2015/056953) Dated Dec. 15, 2015.
Written Opinion (Application No. PCT/IB2015/056953) Dated Dec. 15, 2015.

\* cited by examiner

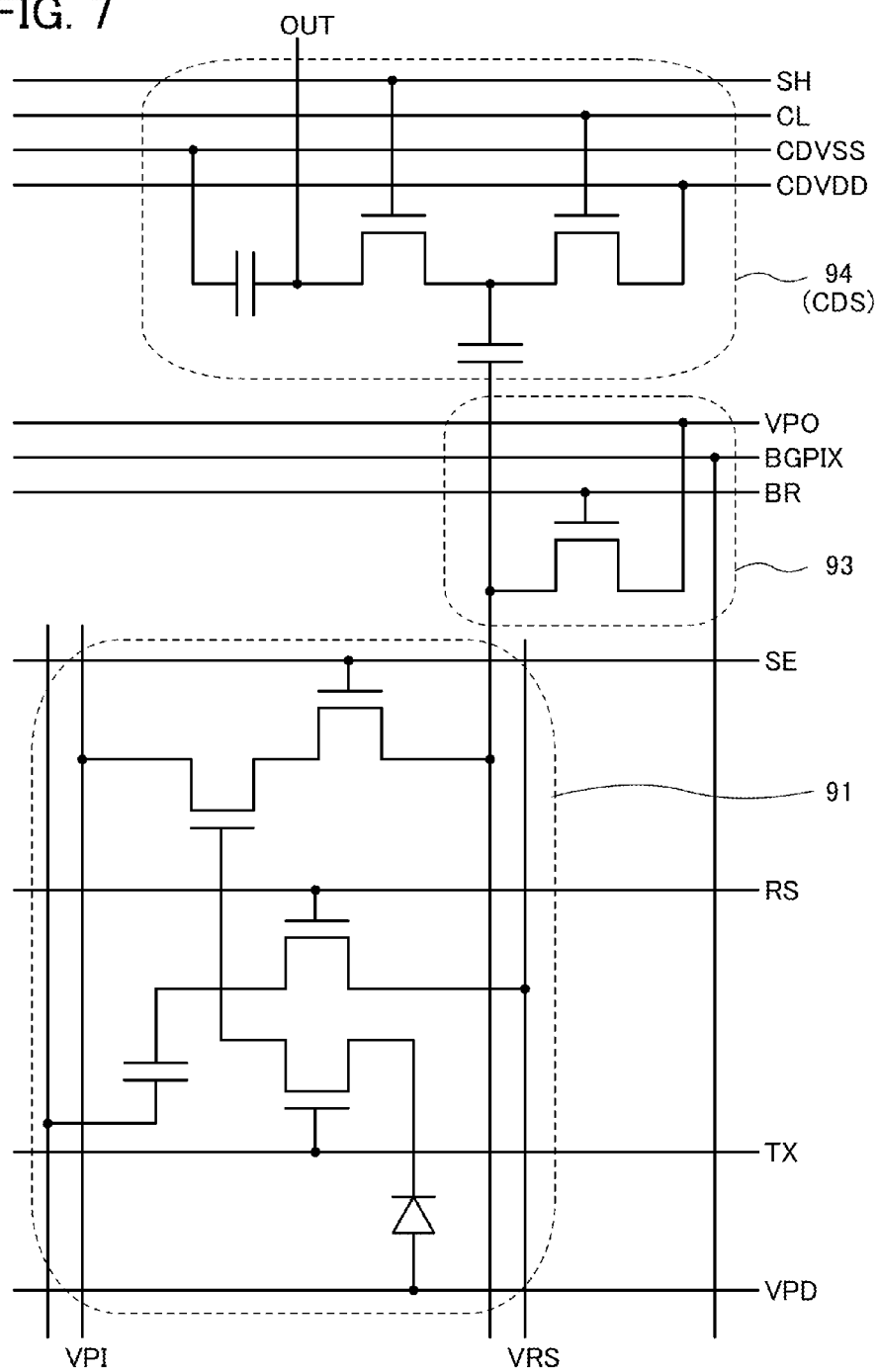

FIG. 19A1
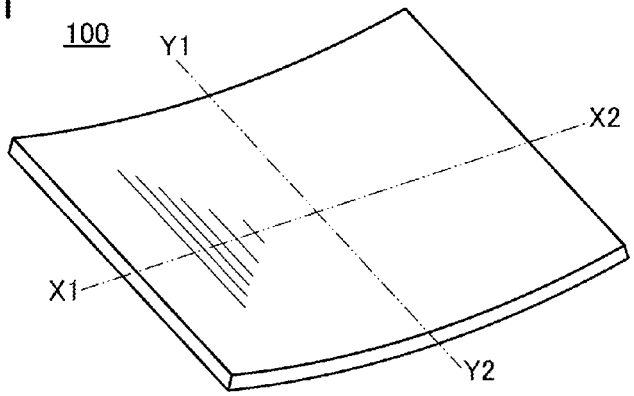
FIG. 19A2
FIG. 19A3
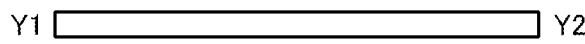
FIG. 19B1
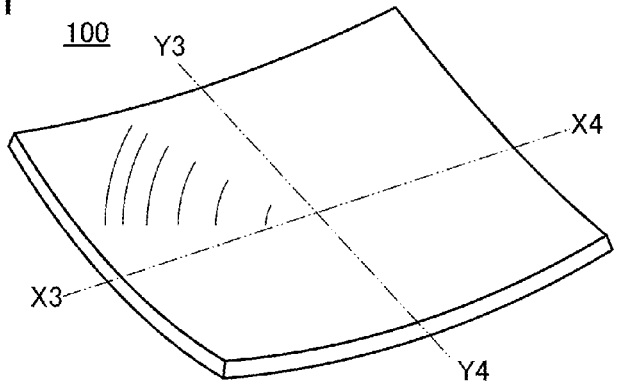
FIG. 19B2
FIG. 19B3
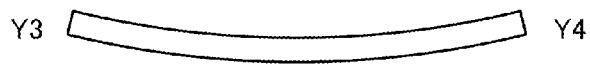

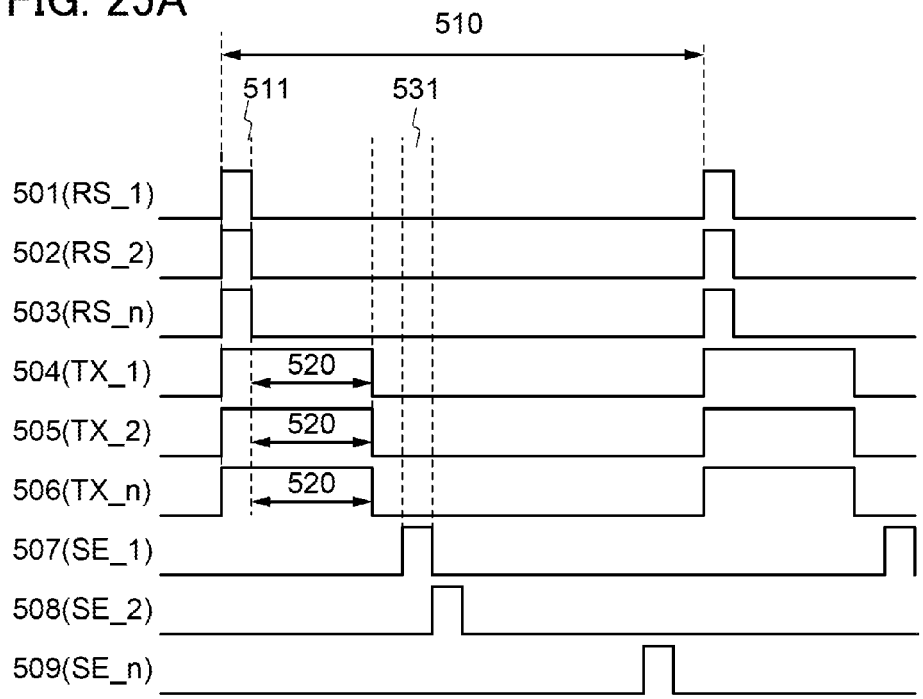
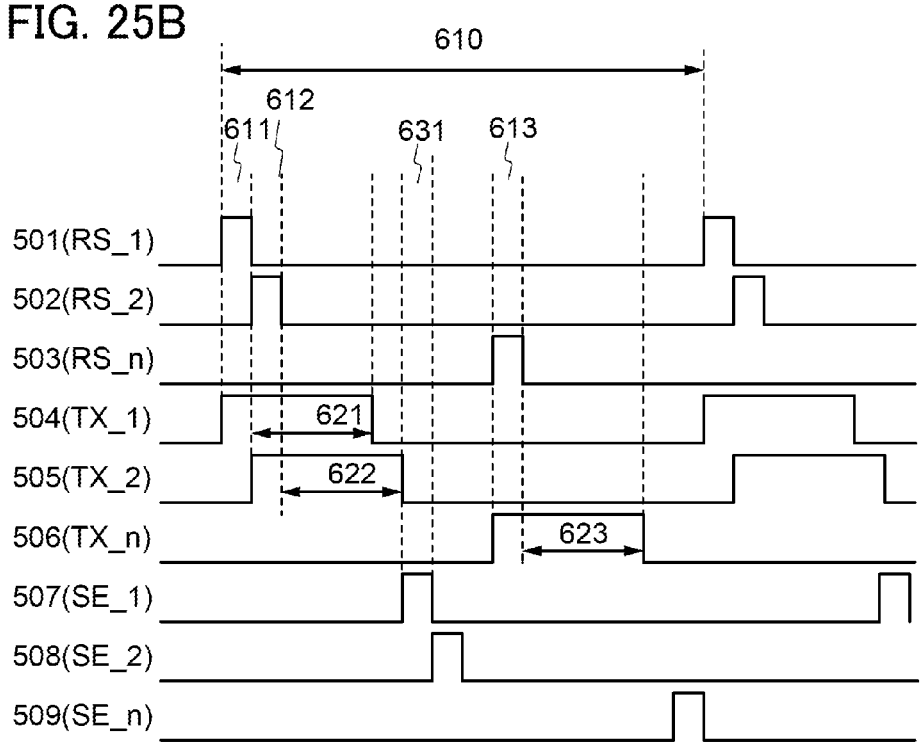

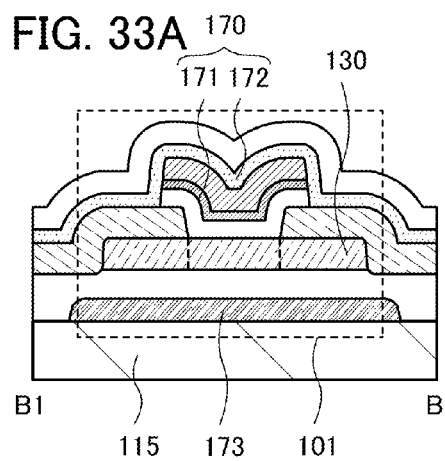
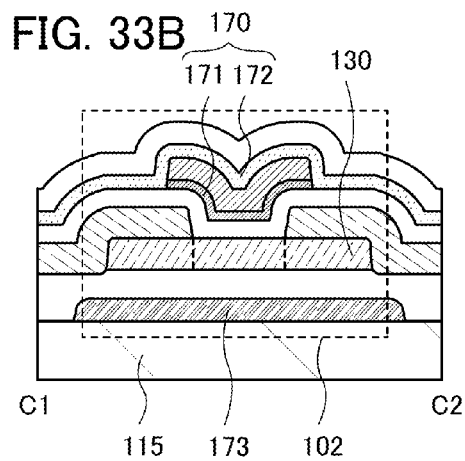
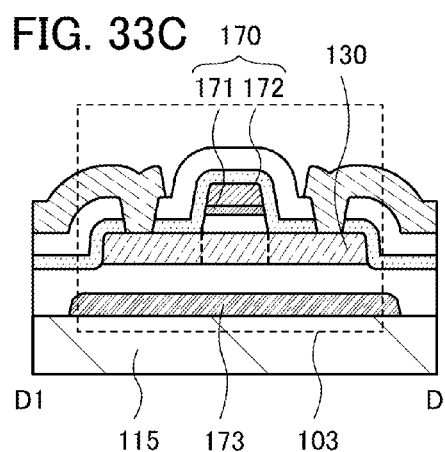
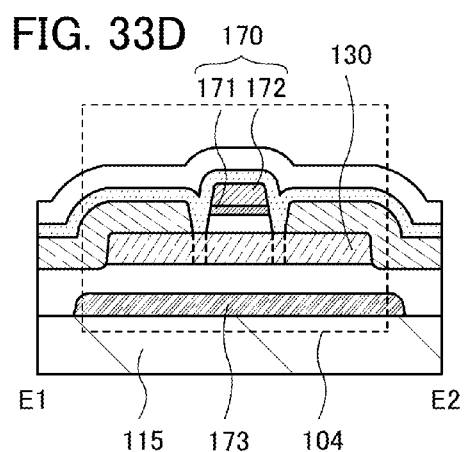
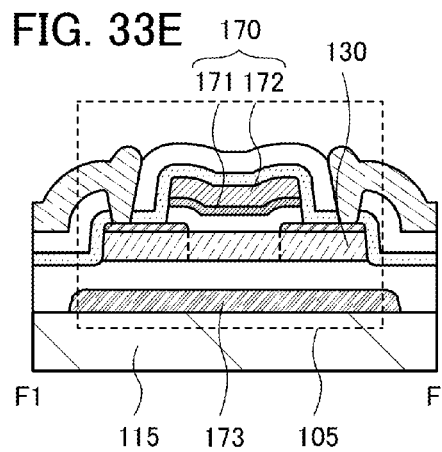
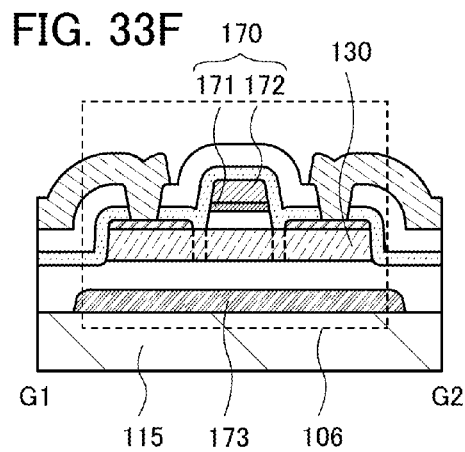

IMAGING DEVICE HAVING A THIRD CIRCUIT WITH A REGION OVERLAPPING WITH A FOURTH CIRCUIT

TECHNICAL FIELD

One embodiment of the present invention relates to an imaging device including an oxide semiconductor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

BACKGROUND ART

A technique by which transistors are formed using semiconductor thin films formed over a substrate having an insulating surface has been attracting attention. The transistor is used in a wide range of electronic devices such as an integrated circuit (IC) and a display device. As semiconductor materials which can be used for the transistors, silicon-based semiconductors have been widely used, but oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

Patent Document 3 discloses that an imaging device in which a transistor including an oxide semiconductor and having an extremely low off-state current is used in part of a pixel circuit and a transistor including silicon with which a complementary metal oxide semiconductor (CMOS) circuit can be formed is used in a peripheral circuit.

Patent Document 4 discloses an imaging device in which a transistor including silicon, a transistor including an oxide semiconductor, and a photodiode including a crystalline silicon layer are stacked.

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119711
[Patent Document 4] Japanese Published Patent Application No. 2013-243355

DISCLOSURE OF INVENTION

Imaging devices are incorporated in a variety of portable information terminals, and the increase in definition, the reduction in size and power consumption, and the like are required for the imaging devices. Furthermore, an imaging device which satisfies the requirements and can be formed at a lower cost is expected.

When the definition of the imaging device is increased, that is, the number of pixels is increased, high-speed operation is required. To operate the imaging device at high speed, the contrivance of the circuit configuration is needed in addition to the improvement in physical property of semiconductor materials and the like.

An object of one embodiment of the present invention is to provide an imaging device that is suitable for high-speed operation. Another object of one embodiment of the present invention is to provide an imaging device with high resolution. Another object of one embodiment of the present invention is to provide a highly integrated imaging device. Another object of one embodiment of the present invention is to provide an imaging device with low power consumption. Another object of one embodiment of the present invention is to provide an imaging device formed at low cost. Another object of one embodiment of the present invention is to provide an imaging device capable of taking an image under a low illuminance condition. Another object of one embodiment of the present invention is to provide an imaging device with a wide dynamic range. Another object of one embodiment of the present invention is to provide an imaging device which can be used in a wide temperature range. Another object of one embodiment of the present invention is to provide an imaging device with a high aperture ratio. Another object of one embodiment of the present invention is to provide an imaging device with high reliability. Another object of one embodiment of the present invention is to provide a novel imaging device or the like. Another object of one embodiment of the present invention is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device in which a circuit including a transistor formed using a semiconductor substrate, a circuit including a transistor formed using an oxide semiconductor, and a photoelectric conversion element are stacked.

One embodiment of the present invention is an imaging device including a first region to an n-th region (n is a natural number of 2 or more and 16 or less) each including a first circuit, a second circuit, a third circuit, and a fourth circuit. The first to third circuits each include a transistor in which silicon is used in an active layer or an active region. The fourth circuit includes a photoelectric conversion element and a transistor in which an oxide semiconductor is used in an active layer. The first circuit is configured to read out a signal from the third circuit. The second circuit is configured to output a signal for driving the fourth circuit. The third circuit is configured to process a signal output from the fourth circuit. The fourth circuit is configured to convert light into the signal. The first circuit includes a region overlapping with the fourth circuit. The third circuit includes a region overlapping with the fourth circuit.

The oxide semiconductor preferably contains In, Zn, and M (M is Al, Ti, Ga, Sn, Y, Zr, La, Ce, Nd, or Hf).

The photoelectric conversion element can contain selenium in a photoelectric conversion layer.

The first circuit and the second circuit each can include a shift register circuit and a buffer circuit.

The third circuit can include a correlated double sampling (CDS) circuit, an analog-to-digital converter (ADC) circuit, and a latch circuit.

The first circuit can be divided and positioned in two regions.

The second circuit can be divided and positioned in two regions.

The first circuit, the second circuit, and the third circuit can be provided in a first layer. The transistor in which the oxide semiconductor is used in the active layer included in the fourth circuit can be provided in a second layer. The photoelectric conversion element can be provided in a third layer. The second layer can be provided between the first layer and the third layer.

According to one embodiment of the present invention, an imaging device that is suitable for high-speed operation can be provided. An imaging device with high resolution can be provided. A highly integrated imaging device can be provided. An imaging device with low power consumption can be provided. An imaging device formed at low cost can be provided. An imaging device capable of taking an image under a low illuminance condition can be provided. An imaging device with a wide dynamic range can be provided. An imaging device which can be used in a wide temperature range can be provided. An imaging device with a high aperture ratio can be provided. An imaging device with high reliability can be provided. A novel imaging device or the like can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF DRAWINGS

In the accompanying drawings:

FIG. 7 illustrates a circuit of an imaging device;

FIGS. 19A1, 19A2, 19A3, 19B1, 19B2, and 19B3 illustrate bent imaging devices;

FIGS. 25A and 25B are timing charts illustrating operations in a global shutter system and a rolling shutter system, respectively;

FIGS. 33A to 33F each illustrate a cross section of a transistor in a channel length direction;

BEST MODE FOR CARRYING OUT THE INVENTION

Figure 1A:
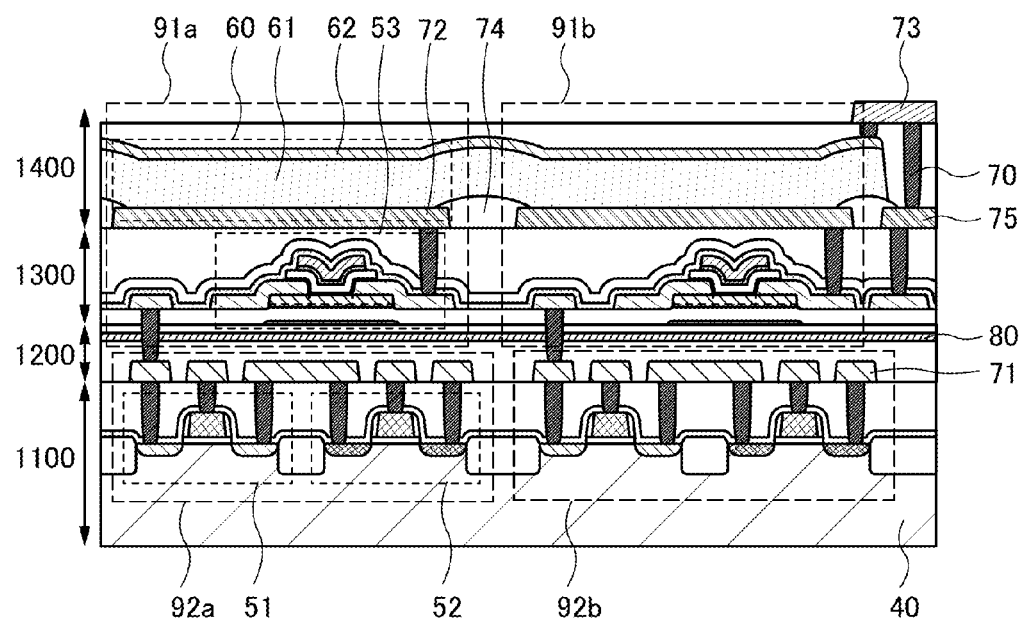
FIGS. 1A and 1B are cross-sectional views illustrating imaging devices.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, another element may be provided between elements having a connection relation illustrated in drawings and texts, without being limited to a predetermined connection relation, for example, the connection relation illustrated in the drawings and the texts.

Here, X and Y each denote an object (e.g., a device, an element, a circuit, a wiring, an electrode, a terminal, a conductive film, and a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is provided between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

(Embodiment 1)

In this embodiment, an imaging device that is one embodiment of the present invention is described with reference to drawings.

FIG. 1A is a cross-sectional view illustrating the structure of the imaging device of one embodiment of the present invention and illustrates a cross section of part of a region in which a circuit 91a, a circuit 91b, a circuit 92a, and a circuit 92b are formed. The circuit 91a includes a transistor 53 including an oxide semiconductor layer as an active layer and a photoelectric conversion element 60 including a photoelectric conversion layer 61. Furthermore, the circuit 92a is provided to have a region overlapping with the circuit 91a. The circuit 92a includes transistors 51 and 52 each including an active region in a silicon substrate 40. Note that the above transistors and photoelectric conversion element 60 are electrically connected to wirings and conductors 70 embedded in insulating layers.

Furthermore, the circuit 91b is provided to have a structure similar to that of the circuit 91a and has a region overlapping with the circuit 92b including a transistor with an active region in the silicon substrate 40. Although an example in which the circuit 92b has a structure similar to that of the circuit 92a is shown, the structures of the circuits 92a and 92b may be different from each other.

Note that the above-described electrical connection between the components is only an example. Furthermore, wirings, electrodes, and the like which are provided over the same surface or formed by the same process are denoted by the same reference numeral, and all the conductors embedded in the insulating layers are denoted by the same reference numeral 70. Although the wirings, the electrodes, and the conductors 70 are illustrated as independent components in the drawings, components that are electrically connected to each other in the drawings may be regarded as one component in an actual device.

The imaging device includes a first layer 1100 including the transistors 51 and 52 provided using the silicon substrate 40, an insulating layer, the conductor 70, and the like; a second layer 1200 including a wiring 71, the conductor 70, an insulating layer, and the like; a third layer 1300 including the transistor 53, the conductor 70, an insulating layer, and the like; and a fourth layer 1400 including a wiring 72, a wiring 73, a wiring 75, the conductor 70, an insulating layer, and the like. The first layer 1100, the second layer 1200, the third layer 1300, and the fourth layer 1400 are stacked in this order.

Here, the second layer 1200 may have a structure including a multilayer wiring. Furthermore, the second layer 1200 serves as an electrical shield, a thermal shield, and an optical shield, and contributes to stable operation of the transistors formed in the first layer 1100 and the third layer 1300.

There are a case where one or more of the wirings are not provided and a case where another wiring or transistor is included in any of the layers. Furthermore, another layer may be included in the stacked-layer structure. In addition, one or more of the layers are not included in some cases. The insulating layers each function as an interlayer insulating film or a passivation film.

The silicon substrate 40 is not limited to a bulk silicon substrate and can be a substrate made of germanium, silicon germanium, silicon carbide, gallium arsenide, aluminum gallium arsenide, indium phosphide, gallium nitride, or an organic semiconductor.

Figure 1B:
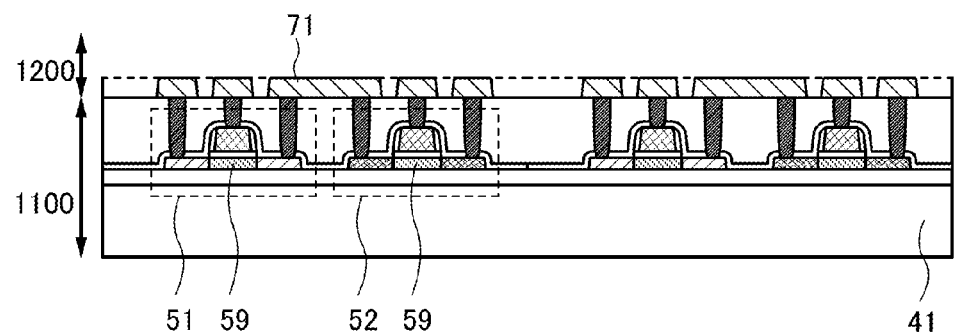

As illustrated in FIG. 1B, the transistors 51 and 52 may each be a transistor including an active layer 59 formed of a silicon thin film. In this case, a glass substrate, a semiconductor substrate, or the like can be used as a substrate 41. The active layer 59 can be formed using polycrystalline silicon or single crystal silicon of a silicon-on-insulator (SOI) structure.

In the stack, an insulating layer 80 is provided between the first layer 1100 including the transistors 51 and 52 and the third layer 1300 including the transistor 53.

Dangling bonds of silicon are terminated with hydrogen in insulating layers provided in the vicinities of the active regions of the transistors 51 and 52. Therefore, the hydrogen has an effect of improving the reliability of the transistors 51 and 52. Meanwhile, hydrogen in insulating layers which are provided in the vicinity of the oxide semiconductor layer that is the active layer of the transistor 53 or the like causes generation of carriers in the oxide semiconductor layer. Therefore, the hydrogen may reduce the reliability of the transistor 53 or the like. Therefore, in the case where one layer including the transistor using a silicon-based semiconductor material and the other layer including the transistor using an oxide semiconductor are stacked, it is preferable that the insulating layer 80 having a function of preventing diffusion of hydrogen be provided between the layers. Hydrogen is confined in the one layer by the insulating layer 80, whereby the reliability of each of the transistors 51 and 52 can be improved. Furthermore, diffusion of hydrogen from the one layer to the other layer is inhibited, whereby the reliability of the transistor 53 or the like can also be increased.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

In the photoelectric conversion element 60, a selenium-based material, which has high quantum efficiency to visible light, is preferably used for the photoelectric conversion layer 61. Accordingly, a photoelectric conversion element with high sensitivity in which the amount of amplification of electrons with respect to the amount of incident light is large due to an avalanche phenomenon can be obtained. Thus, the photoelectric conversion element formed using a selenium-based material is suitable for imaging even in a low illuminance environment. Furthermore, the selenium-based material has a high light-absorption coefficient, which leads to an advantage that the photoelectric conversion layer 61 is easily formed to be thin.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient than those of amorphous selenium.

Furthermore, the photoelectric conversion layer 61 may be a layer including a compound of copper, indium, and selenium (CIS). Alternatively, a layer including a compound of copper, indium, gallium, and selenium (CIGS) may be used. With the CIS layer or the CIGS layer, a photoelectric conversion element that can utilize an avalanche phenomenon in a manner similar to that of a single layer of selenium can be formed.

In the photoelectric conversion element 60 using the selenium-based material, for example, the photoelectric conversion layer 61 can be provided between a light-transmitting conductive layer 62 and a wiring 72 formed using a metal material and the like. Furthermore, to prevent leakage current and the like, an oxide semiconductor layer containing zinc oxide or the like may be provided in contact with the photoelectric conversion layer 61.

Figure 45A:
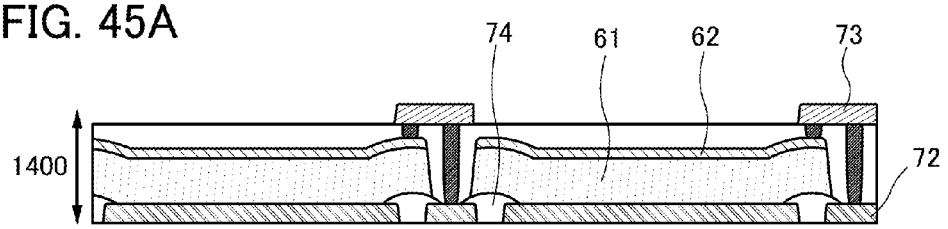
FIGS. 45A to 45D are cross-sectional views each illustrating a connection configuration of a photoelectric conversion element.
Figure 45B:
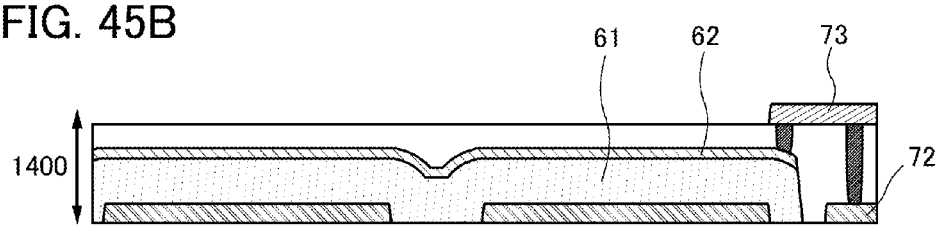
Figure 45C:
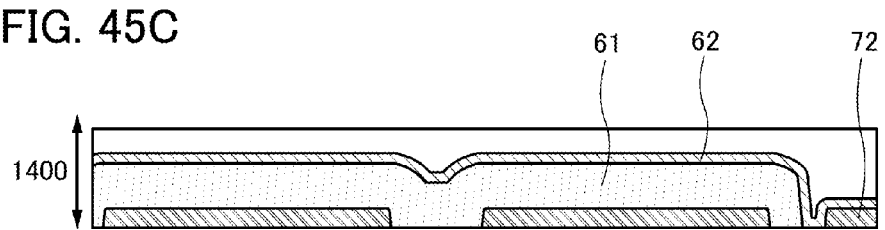
Figure 45D:
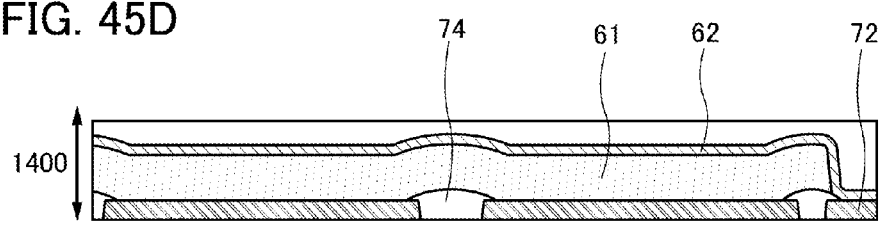

Although the photoelectric conversion layer 61 and the light-transmitting conductive layer 62 are not divided between circuits in FIG. 1A, the photoelectric conversion layer 61 and the light-transmitting conductive layer 62 may be divided between circuits as illustrated in FIG. 45A. Furthermore, a partition wall 74 formed of an insulator is preferably provided in a region between pixels where the wiring 72 is not provided not to generate a crack in the photoelectric conversion layer 61 and the light-transmitting conductive layer 62; however, the partition wall 74 is not necessarily provided as illustrated in FIG. 45B. Alternatively, as illustrated in FIGS. 45C and 45D, the light-transmitting conductive layer 62 may be directly in contact with the wiring 72.

A diode element formed using a silicon substrate with a PN junction or a PIN junction can be used as the photoelectric conversion element 60. Alternatively, a PIN diode element formed using an amorphous silicon film, a microcrystalline silicon film, or the like may be used.

Figure 2:
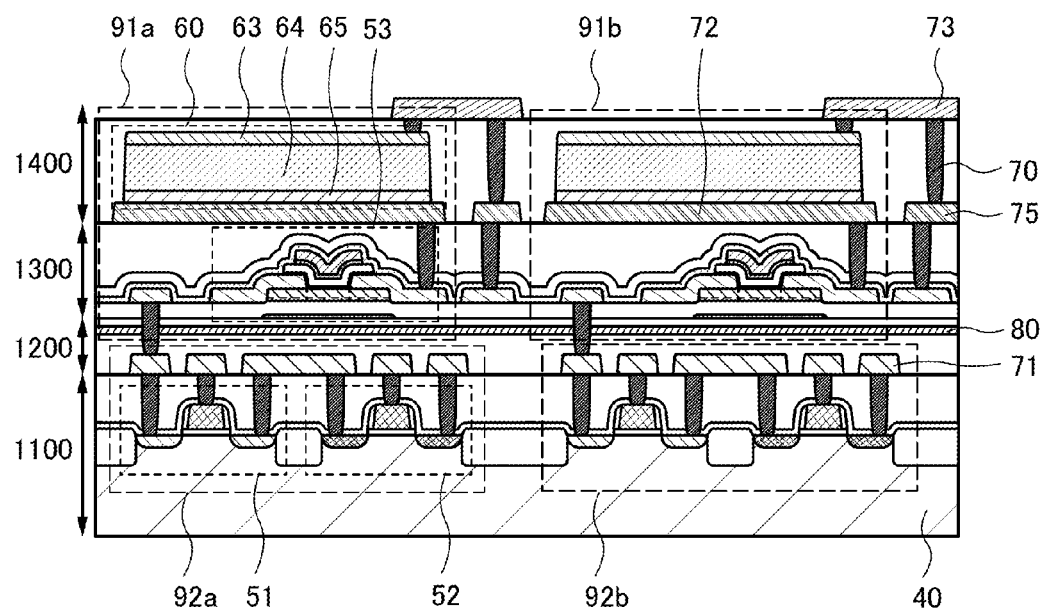
FIG. 2 is a cross-sectional view illustrating an imaging device.

FIG. 2 shows an example in which a thin film PIN photodiode is used for the photoelectric conversion element 60. In the photodiode, an n-type semiconductor layer 65, an i-type semiconductor layer 64, and a p-type semiconductor layer 63 are stacked in this order. The i-type semiconductor layer 64 is preferably formed using amorphous silicon. The p-type semiconductor layer 63 and the n-type semiconductor layer 65 can each be formed using amorphous silicon, microcrystalline silicon, or the like which includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element 60 illustrated in FIG. 2, the n-type semiconductor layer 65 functioning as a cathode is electrically connected to the wiring 72 which is electrically connected to the transistor 53. Furthermore, the p-type semiconductor layer 63 functioning as an anode is electrically connected to the wiring 75 through the conductors 70 and the wiring 73.

Note that as to the connection configuration of the photoelectric conversion element 60 with wirings or the like, what the anode is connected to and what the cathode is connected to in the circuits 91*a* and 91*b* in FIG. 2 may be reversed.

In any case, the photoelectric conversion element 60 is preferably formed so that the p-type semiconductor layer 63 serves as a light-receiving surface. The p-type semiconductor layer 63 serves as a light-receiving surface, whereby the output current of the photoelectric conversion element 60 can be increased.

Furthermore, any of examples shown in FIGS. 3A to 3F may be applied to the structure of the photoelectric conversion element 60 having a configuration of a PIN thin film photodiode and the connection configuration among the photoelectric conversion element 60, the transistor 53, and the wirings. Note that the structure of the photoelectric conversion element 60, the connection configuration between the photoelectric conversion element 60 and the wirings, and the connection configuration between the transistor 53 and the wirings are not limited thereto and other configurations may be applied.

Figure 3A:
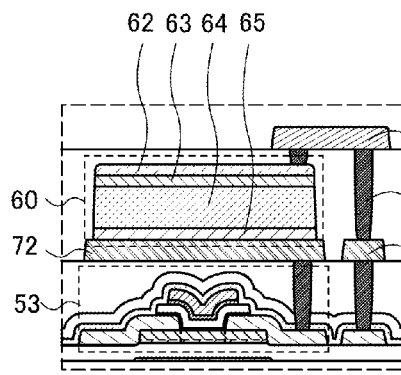
FIGS. 3A to 3F are cross-sectional views each illustrating a connection configuration of a photoelectric conversion element.

FIG. 3A illustrates a structure provided with the light-transmitting conductive layer 62 in contact with the p-type semiconductor layer 63 of the photoelectric conversion element 60. The light-transmitting conductive layer 62 functions as an electrode and can increase the output current of the photoelectric conversion element 60.

For the light-transmitting conductive layer 62, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 62 is not limited to a single layer, and may be a stacked layer of different films.

Figure 3B:
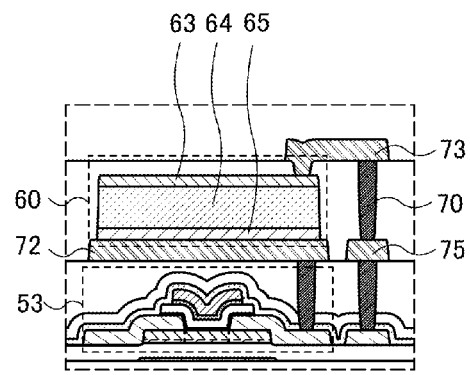

FIG. 3B illustrates a structure in which the p-type semiconductor layer 63 of the photoelectric conversion element 60 is electrically connected directly to the wiring 73.

Figure 3C:
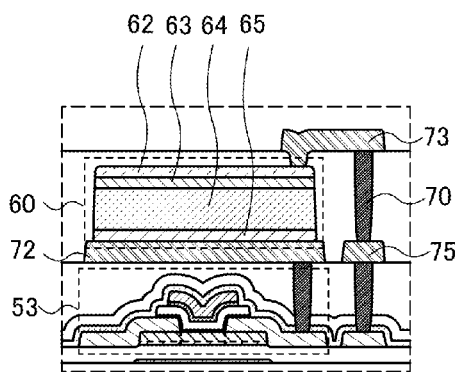

FIG. 3C illustrates a structure in which the light-transmitting conductive layer 62 in contact with the p-type semiconductor layer 63 of the photoelectric conversion element 60 is provided, and the wiring 73 is electrically connected to the light-transmitting conductive layer 62.

Figure 3D:
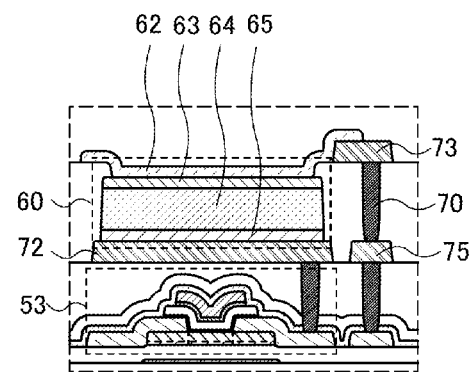

FIG. 3D illustrates a structure in which an opening portion exposing the p-type semiconductor layer 63 is provided in an insulating layer covering the photoelectric conversion element 60, and the light-transmitting conductive layer 62 that covers the opening portion is electrically connected to the wiring 73.

Figure 3E:
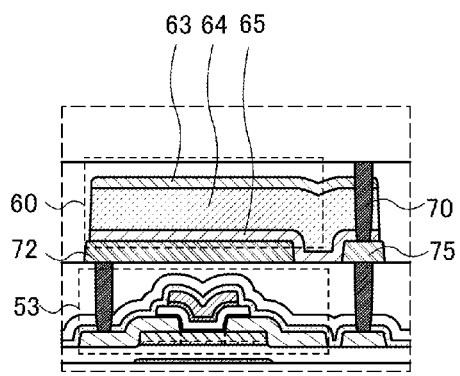

FIG. 3E illustrates a structure provided with the conductor 70 which penetrates the photoelectric conversion element 60. In the structure, the wiring 75 is electrically connected to the p-type semiconductor layer 63 through the conductor 70. Note that in the drawing, the wiring 72 electrically connected to the transistor 53 appears to be electrically connected to the wiring 75 through the n-type semiconductor layer 65. However, a resistance in the lateral direction of the n-type semiconductor layer 65 is high; therefore, when an appropriate distance is provided between the wiring 75 and the wiring 72, the resistance between the wiring 75 and the wiring 72 is extremely high. Thus, the photoelectric conversion element 60 can have diode characteristics without a short circuit between the anode and the cathode. Note that two or more conductors 70 that are electrically connected to the p-type semiconductor layer 63 may be provided.

Figure 3F:
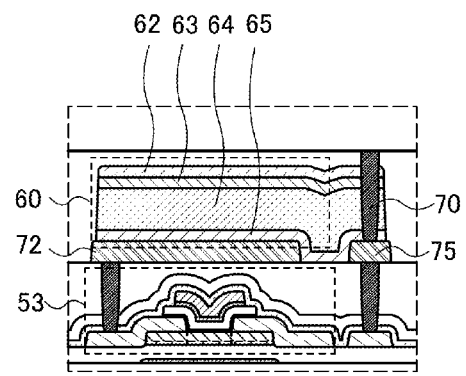

FIG. 3F illustrates a structure in which the photoelectric conversion element 60 in FIG. 3E is provided with the light-transmitting conductive layer 62 in contact with the p-type semiconductor layer 63.

Note that each of the photoelectric conversion elements 60 illustrated in FIGS. 3D to 3F has an advantage of having a large light-receiving area because wirings and the like do not overlap a light-receiving region.

The photoelectric conversion element 60 formed using the above selenium-based material, amorphous silicon, or the like can be formed through general semiconductor manufacturing processes such as a deposition process, a lithography process, and an etching process. Furthermore, the resistance of the selenium-based material is high; thus, a structure in which the photoelectric conversion layer 61 is not divided between the circuits can be employed as illustrated in FIG. 1A. Therefore, the imaging device of one embodiment of the present invention can be manufactured with a high yield at low cost. Meanwhile, to form a photodiode in which the photoelectric conversion layer 61 is formed using crystalline silicon, processes with high difficulty, such as a polishing process and a bonding process, are needed.

Figure 4A:
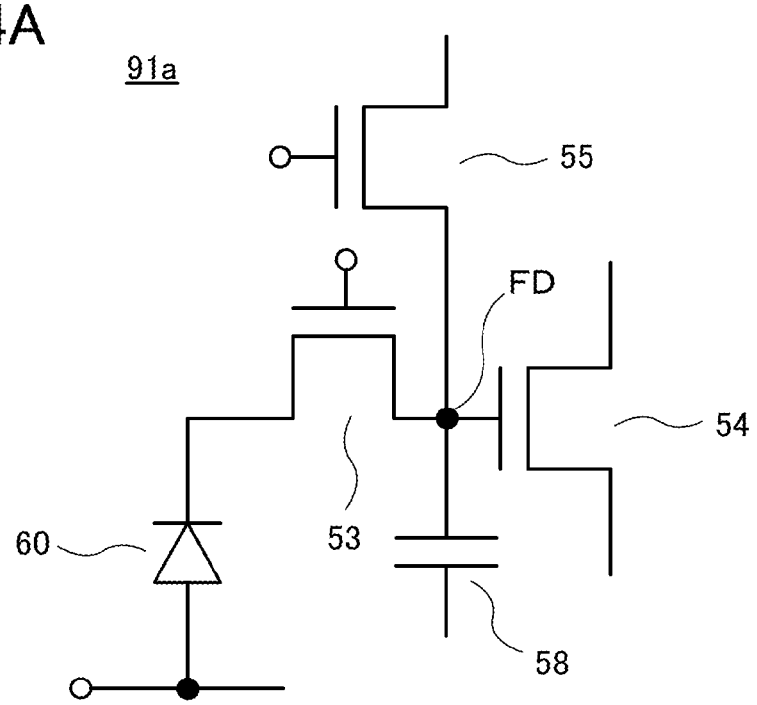
FIGS. 4A and 4B illustrate circuits of an imaging device.

The circuit 91*a* can function as a pixel circuit and can have a configuration shown in the circuit diagram of FIG. 4A. One of a source and a drain of the transistor 53 is electrically connected to a cathode of the photoelectric conversion element 60. The other of the source and the drain of the transistor 53, a gate of a transistor 54 (not illustrated in FIG. 1A), one of a source and a drain of a transistor 55 (not illustrated in FIG. 1A) are electrically connected to a charge storage portion (FD). Note that the circuit 91*b* can have a circuit configuration similar to that of the circuit 91*a*.

Specifically, the charge storage portion (FD) is formed of the depletion layer capacitance of the sources or the drains of the transistors 53 and 55, the gate capacitance of the transistor 54, wiring capacitance, and the like. Although a capacitor 58 which functions as part of the charge storage portion (FD) is provided in FIG. 4A, the capacitor is not necessarily provided.

Here, the transistor 53 can function as a transfer transistor for controlling the potential of the charge storage portion (FD) in response to output of the photoelectric conversion element 60. The transistor 54 can function as an amplifying transistor configured to output a signal corresponding to the potential of the charge storage portion (FD). The transistor 55 can function as a reset transistor for initializing the potential of the charge storage portion (FD).

Figure 4B:
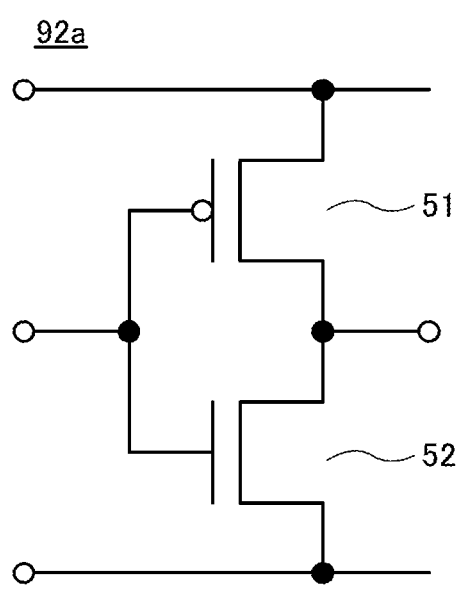

The circuit 92*a* reads out a signal output from the circuit 91*a* or the like, performs a process for converting the signal, or the like and can include a CMOS inverter shown in the circuit diagram of FIG. 4B, for example. A gate of the transistor 51 (p-channel) is electrically connected to a gate of the transistor 52 (n-channel). One of a source and a drain of one transistor is electrically connected to one of a source and a drain of the other transistor. The other of the source and the drain of the one transistor is electrically connected to a wiring and the other of the source and the drain of the other transistor is electrically connected to another wiring. Note that the circuit 92*b* can have a circuit configuration similar to that of the circuit 92*a*; however, another circuit configuration can also be employed.

In the circuit of FIG. 4A, a transistor in which an active layer is formed using an oxide semiconductor (hereinafter referred to as an OS transistor) is preferably used. Furthermore, in the circuit of FIG. 4B, transistors in each of which an active region is provided in a silicon substrate or an active layer is formed using silicon (hereinafter referred to as a Si transistor) can be typically used; however, an n-channel transistor may be an OS transistor.

Extremely low off-state current characteristics of the OS transistor can widen the dynamic range of imaging. In the circuit shown in FIG. 4A, an increase in the intensity of light entering the photoelectric conversion element 60 reduces the potential of the charge storage portion (FD). Since the OS transistor has an extremely small off-state current, a current corresponding to the gate potential can be accurately output even when the gate potential is extremely low. Thus, it is possible to widen the detection range of illuminance, i.e., the dynamic range.

A period during which charge can be retained in the charge storage portion (FD) can be extremely long owing to the low off-state current characteristics of the transistors 53 and 55. Therefore, a global shutter system, in which accumulation operation is performed in all the pixel circuits at the same time, can be used without a complicated circuit configuration and operation method, and thus, an image with little distortion can be easily obtained even in the case of a moving object.

In addition, the OS transistor has lower temperature dependence of change in electrical characteristics than the Si transistor, and thus can be used at an extremely wide range of temperatures. Therefore, an imaging device and a semiconductor device which include the OS transistors are suitable for use in automobiles, aircrafts, and spacecrafts.

Moreover, the OS transistor has higher drain withstand voltage than the Si transistor. In a photoelectric conversion element in which the above selenium-based material is used for a photoelectric conversion layer, relatively high voltage (e.g., 10 V or more) is preferably applied to easily cause the avalanche phenomenon. Therefore, by combination of the OS transistor and the photoelectric conversion element in which the above selenium-based material is used for the photoelectric conversion layer, a highly reliable imaging device can be obtained.

In the circuit 91*a*, the photoelectric conversion element 60 and the transistor 53 can be formed to overlap each other; thus, the integration degree of pixels can be increased. In other words, the resolution of the imaging device can be increased. For example, the imaging device of one embodiment of the present invention is suitable for an imaging device whose number of pixels is 4k2k, 8k4k, 16k8k, or the like.

In the imaging device in FIG. 1A, no photoelectric conversion element is provided on/in the silicon substrate 40. Therefore, an optical path for the photoelectric conversion element can be secured without being influenced by the transistors or wirings, and thus, a pixel with a high aperture ratio can be formed.

Note that the structure of the transistor and the photoelectric conversion element included in each of the imaging devices described in this embodiment is only an example. Therefore, for example, the circuits 91a and 91b each may be formed using a transistor in which an active region or an active layer includes silicon or the like. Furthermore, the circuits 92a and 92b each may be formed using a transistor including an oxide semiconductor layer as an active layer. In addition, the silicon substrate 40 may be used as a photoelectric conversion layer of the photoelectric conversion element 60.

Furthermore, the imaging device of one embodiment of the present invention includes a region where the circuits 91a and 92a overlap each other; thus, the imaging device can be reduced in size.

Figure 5:
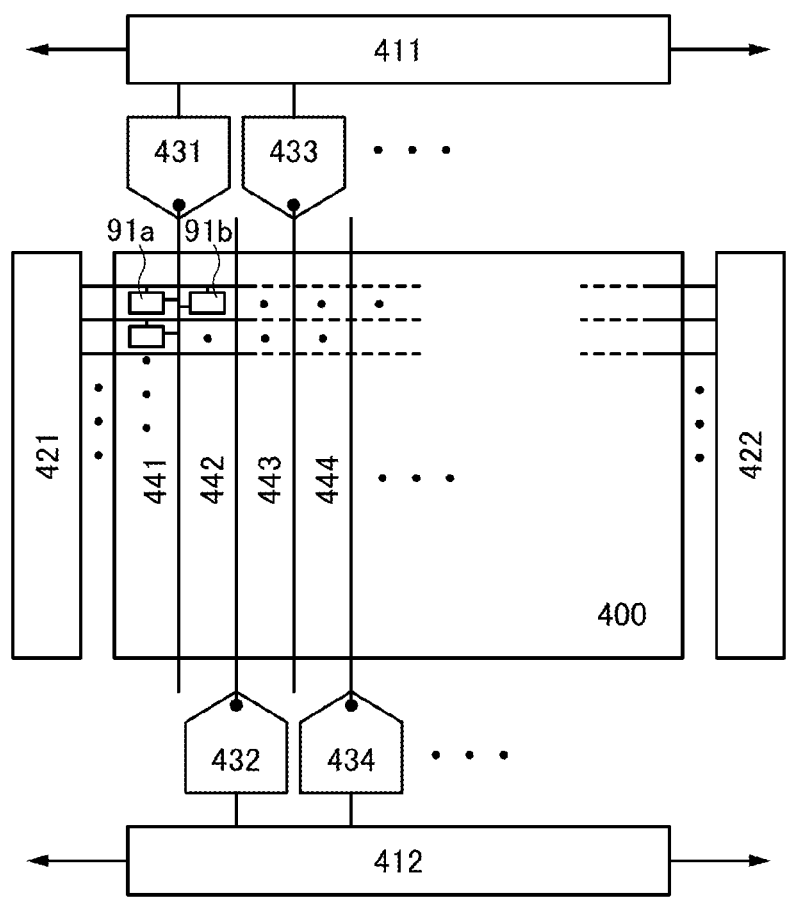
FIG. 5 is a top view illustrating a structure of an imaging device.

FIG. 5 is a block diagram of a general imaging device, and shows some of components (a pixel portion 400, circuits 411, 412, 421, 422, 431, 432, 433, and 434, and data lines 441, 442, 443, and 444) included in the imaging device.

In the pixel portion 400, pixel circuits such as the circuit 91a and 91b are arranged in a matrix and the output portions of the pixel circuits are electrically connected to the data lines 441 to 444 and the like. For example, when the number of pixels arranged in the horizontal direction in FIG. 5 is 7680 and each data line is shared between two adjacent pixels arranged in the horizontal direction, the number of data lines is 3840.

The data lines 441, 442, 443, and 444 are electrically connected to the circuits 431, 432, 433, and 434, respectively.

The circuits 431 and 433 are electrically connected to the circuit 411 and the circuits 432 and 434 are electrically connected to the circuit 412. Signals which are read out by the circuits 411 and 412 are output from one end or both ends of the circuits 411 and 412 and input to an external circuit.

Furthermore, the circuits 421 and 422 are electrically connected to each of the pixel circuits provided in the pixel portion 400. Note that the circuits 421 and 422 may be combined and provided in one region.

Figure 6A:
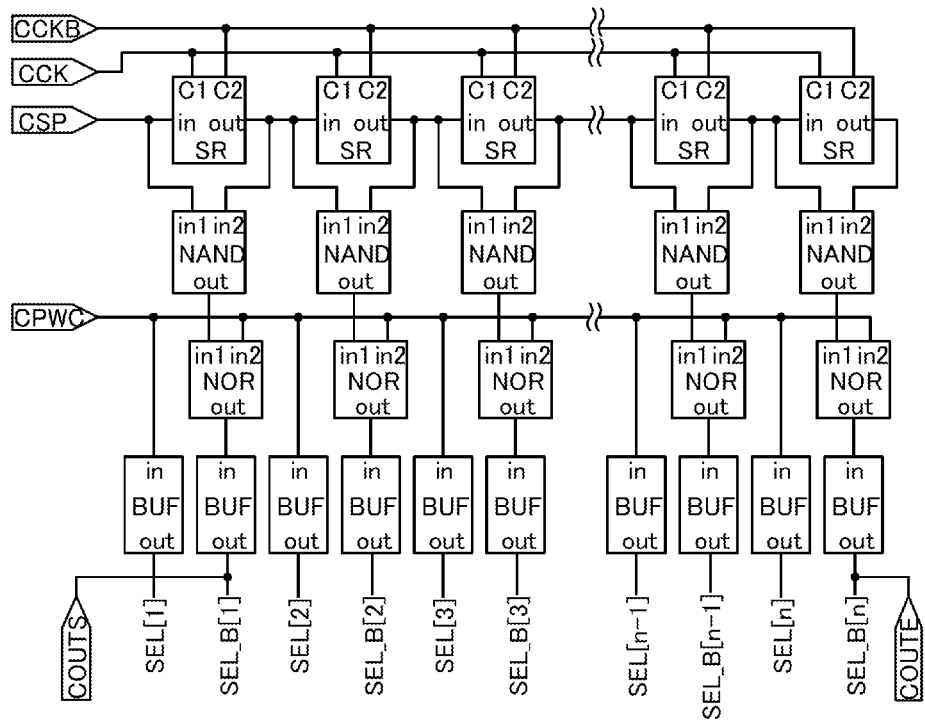
FIGS. 6A to 6C illustrate circuits of an imaging device.
Figure 6B:
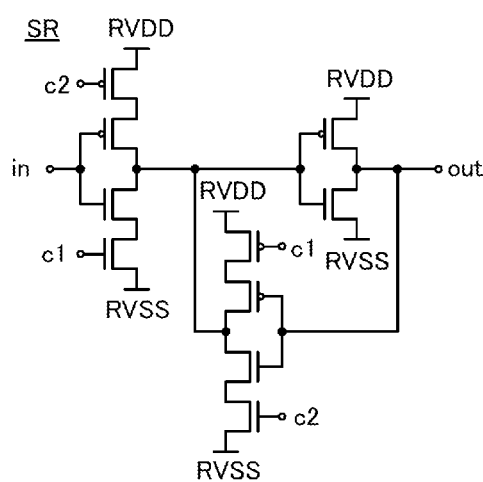
Figure 6C:
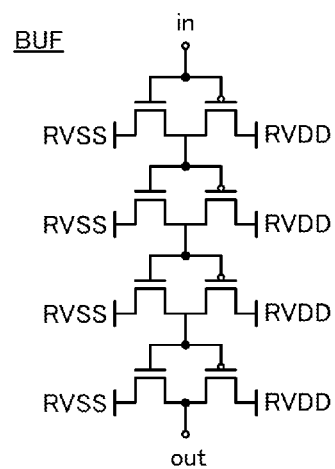

Here, the circuits 411 and 412 can function as column drivers. For example, the circuits 411 and 412 each can have a configuration of a block diagram shown in FIG. 6A. In the circuit, a shift register circuit (SR) in FIG. 6B and a buffer circuit (BUF) in FIG. 6C are included.

Furthermore, the circuits 431 to 434 can have a function of performing processing such as conversion of a signal output from a pixel circuit. For example, the circuits 431 to 434 include a correlated double sampling (CDS) circuit, an analog-to-digital converter (ADC) circuit, a latch circuit, and the like.

A correlated double sampling (CDS) circuit 94 is connected to the output portion of a pixel circuit 91 through the data line as illustrated in FIG. 7. Note that a circuit 93 is a circuit of a current source or the like.

Figure 8A:
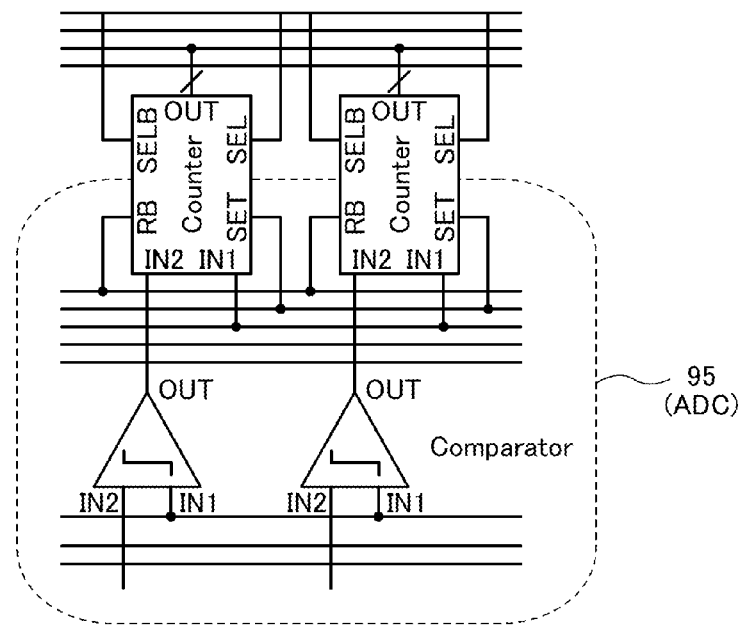
FIGS. 8A and 8B illustrate circuits of an imaging device.
Figure 8B:
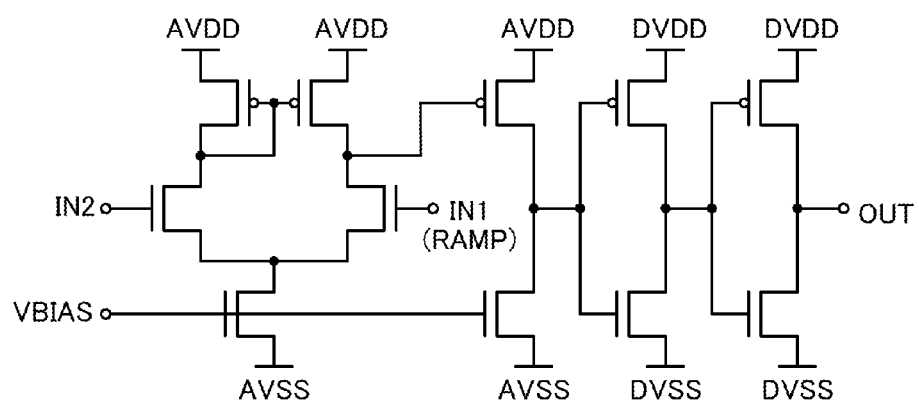

An analog-to-digital converter (ADC) circuit 95 includes a comparator and part of a counter circuit as illustrated in FIG. 8A. The comparator can have a circuit configuration shown in FIG. 8B, for example. The output portion (OUT) of the CDS circuit 94 in FIG. 7 can be connected to IN2 of the comparator.

Figure 9A:
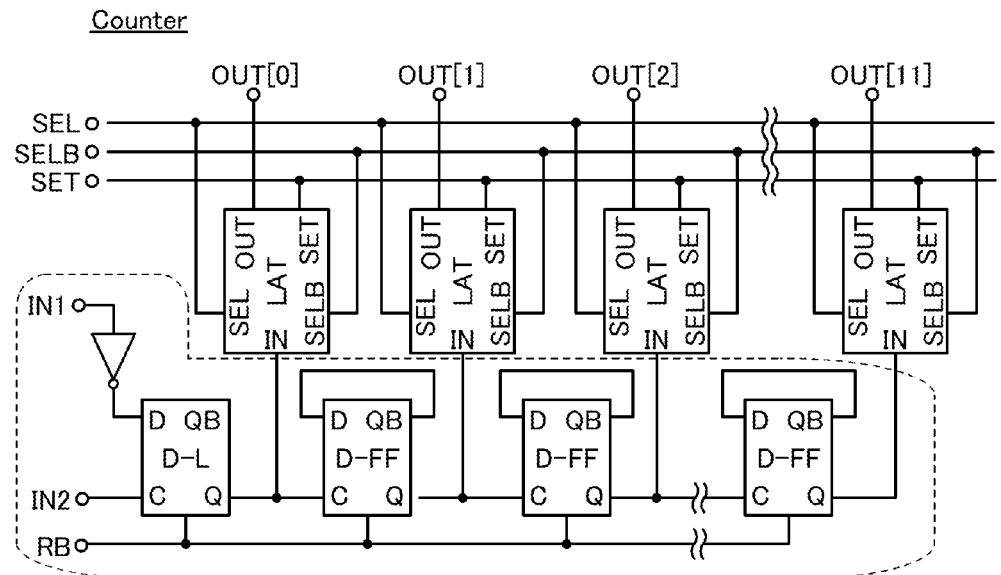
FIGS. 9A and 9B illustrate circuits of an imaging device.

The counter circuit can have a circuit configuration shown in FIG. 9A, for example. Note that a region surrounded by a dashed line in FIG. 9A corresponds to part of the ADC circuit 95.

Figure 9B:
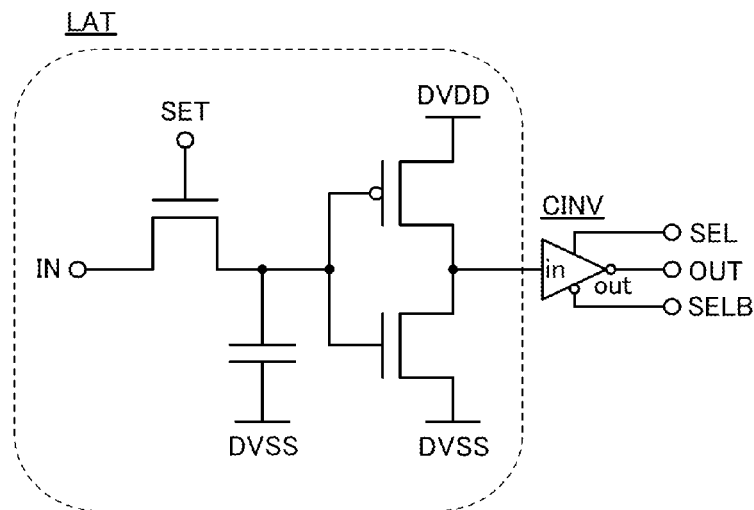

The counter circuit includes a latch circuit (LAT) shown in a region surrounded by a dashed line in FIG. 9B. In addition, a clocked inverter is included in the column driver and wirings SEL and SEL_B are connected to an output portion out of the buffer circuit in FIGS. 6A and 6C.

Figure 10:
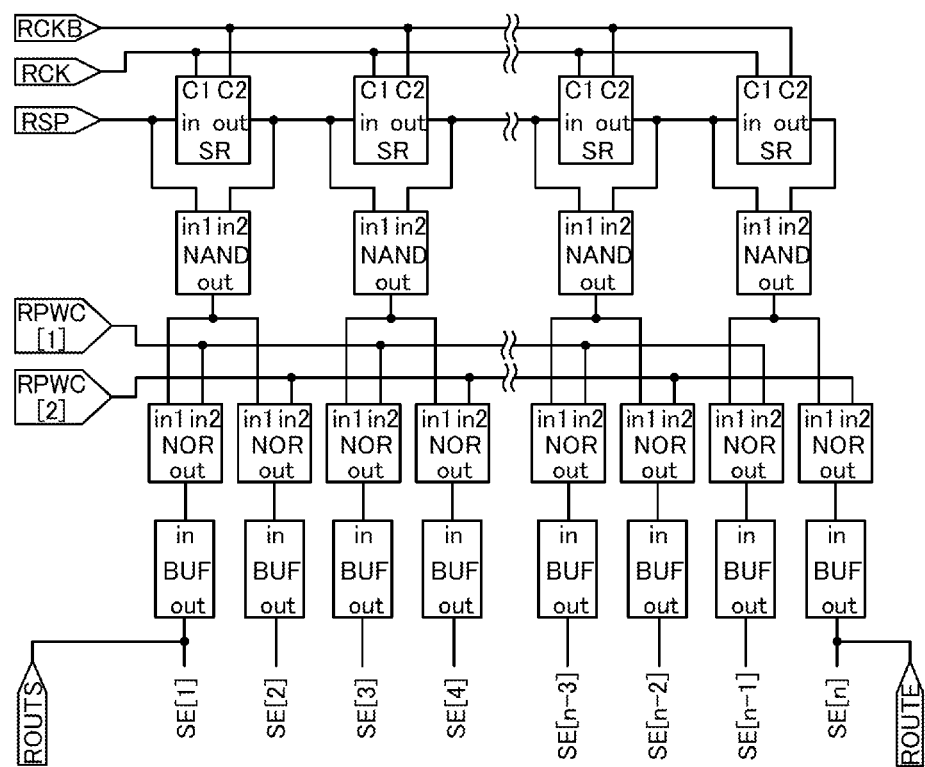
FIG. 10 illustrates a circuit of an imaging device.

Furthermore, the circuits 421 and 422 can function as row drivers. For example, the circuits 421 and 422 each can have a configuration of a block diagram shown in FIG. 10. A wiring SE in FIG. 7 is connected to the output portion out of the buffer circuit in the circuit.

The imaging device in FIG. 5 includes the above-described circuits; however, when the number of pixels is increased to achieve higher definition of an image, areas of the circuit to read out a signal from a pixel (e.g., the circuits 411 and 412) and the circuit to process a signal (e.g., the circuits 431 to 434) are increased; thus, it is difficult to reduce the size of the imaging device in some cases. In addition, when the number of pixels is increased, high-speed operation is required; however, when the circuit area is increased, parasitic resistance, parasitic capacitance, and the like are increased, which prevents high-speed operation in some cases.

Figure 11A:
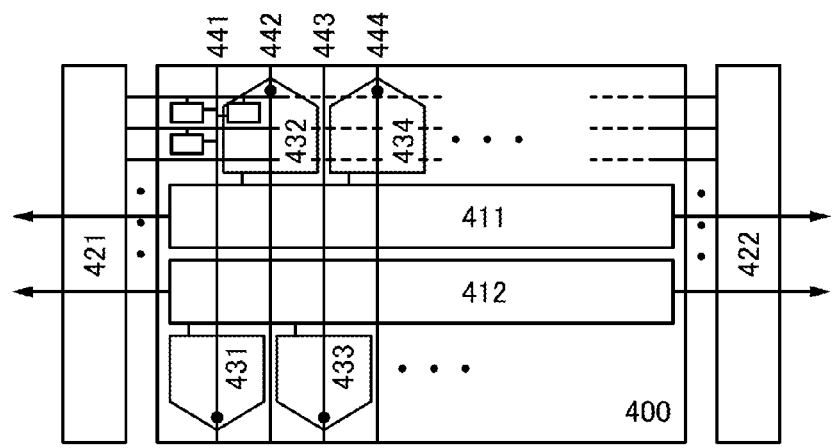
FIGS. 11A and 11B are top views each illustrating a structure of an imaging device.

Thus, in the imaging device of one embodiment of the present invention, the circuits 411 and 412 are positioned to overlap with the pixel portion 400 as illustrated in FIG. 11A. In addition, the circuits 431 to 434 are positioned to overlap with the pixel portion 400. With such an arrangement, the imaging device can be reduced in size. The shift register circuit and the like can be shared between the circuits 411 and 412. Although the circuits 431 to 434 are connected to data lines on the end sides of the pixel portion, the circuits 431 to 434 may be connected to data lines on the sides close to the center of the pixel portion.

Figure 11B:
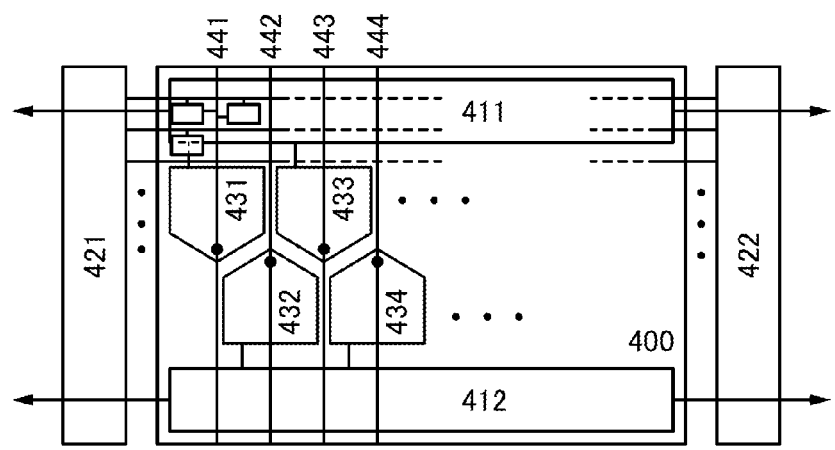

The imaging device of one embodiment of the present invention may have a structure in FIG. 11B. In FIG. 11B, connection portions between the circuits 431 to 434 and the respective data lines are positioned in the vicinity of the center portion of the pixel portion; thus, influences of wiring resistance on the data lines can be reduced.

Figure 12:
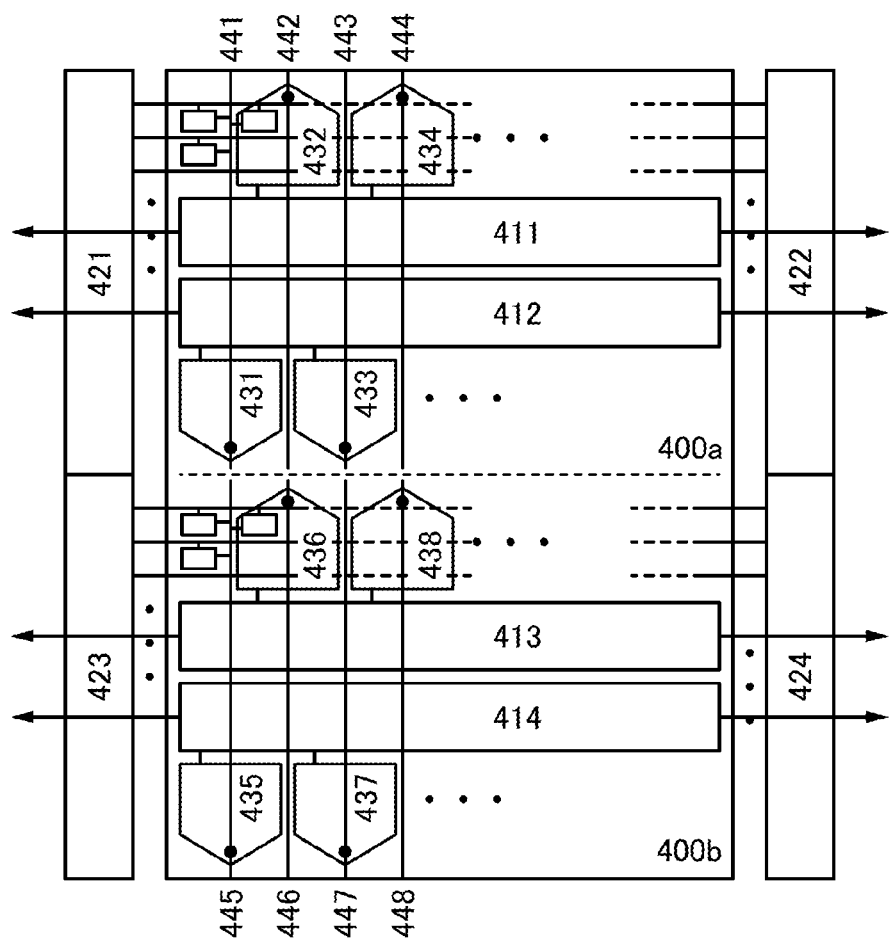
FIG. 12 is a top view illustrating a structure of an imaging device.

The imaging device of one embodiment of the present invention may have a structure illustrated in FIG. 12. In FIG. 12, the pixel portion is divided into two pixel portions 400a and 400b. The pixel portion 400a overlaps with the circuits 411 and 412 each functioning as a column driver, the circuits 431 to 434 each functioning as a circuit for processing a signal, and the data lines 441 to 444. In addition, the pixel portion 400a is connected to the circuits 421 and 422 each functioning as a row driver. The pixel portion 400b overlaps with circuits 413 and 414 each functioning as a column driver, circuits 435 to 438 each functioning as a circuit for processing a signal, and data lines 445 to 448. In addition, the pixel portion 400b is connected to circuits 423 and 424 each functioning as a row driver.

In FIG. 12, as described above, with different circuits, the pixel portions 400a and 400b can be separately driven and the signal processing can be performed separately in the pixel portions 400a and 400b. Therefore, the signal processing and the reading out of the signal in the pixel portion 400a can be performed while other signal processing and reading out are performed in the pixel portion 400b, and the imaging device can be operated at substantially high speed even if the operation frequency is reduced. Thus, even in an imaging device in which the number of pixels is 4k2k or more, double-frame rate driving, quadruple-frame rate driving, or 8-fold frame rate driving can be performed. Furthermore, like the structures in FIGS. 11A and 11B, the structure in FIG. 12 makes it possible to reduce the size of the imaging device, for example.

While the OS transistor has an advantage that the off-state current is smaller than that of the Si transistor, the OS transistor has slightly lower current driving capability than the Si transistor. Thus, in the case where the OS transistor is used as the transistor 54 in the pixel circuit in FIG. 4A, the imaging device is strongly influenced by the wiring resistance of the data lines and the parasitic capacitance, and it is difficult to operate at high speed and reduce power consumption in some cases. Therefore, with the structure in which the pixel portion is divided as shown in FIG. 12, the current driving capability of the OS transistor can be compensated and high-speed operation of the imaging device and reduction in power consumption become possible.

Figure 13:
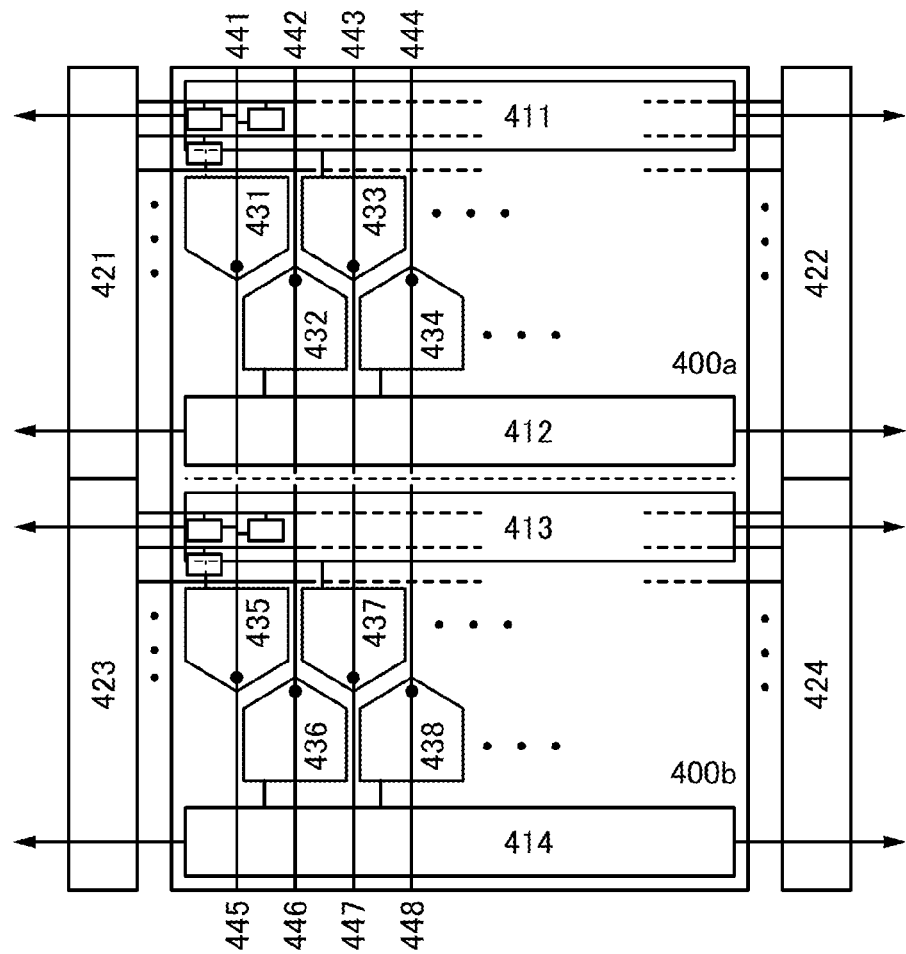
FIG. 13 is a top view illustrating a structure of an imaging device.

The imaging device of one embodiment of the present invention may have a structure illustrated in FIG. 13. In FIG. 13, a structure in which the pixel portion is divided is shown as in FIG. 12, and the structure makes it possible to achieve high-speed operation. In addition, like the structure in FIG. 11B, the structure makes it possible to reduce the size of the imaging device and to reduce the influences of wiring resistance on the data lines.

Figure 14A:
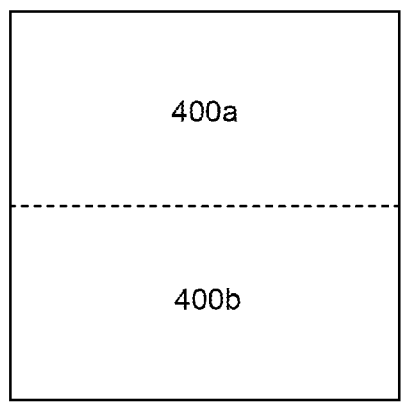
FIGS. 14A to 14D illustrate variations of divisions of a pixel portion.
Figure 14B:
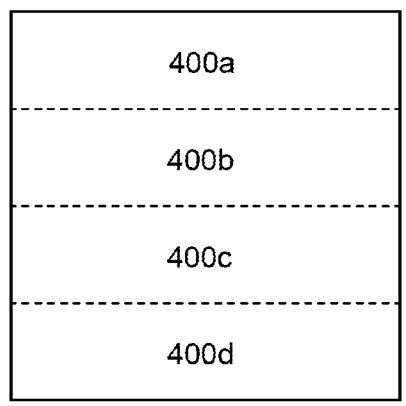
Figure 14C:
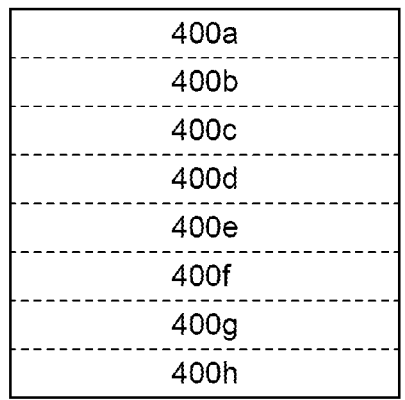
Figure 14D:
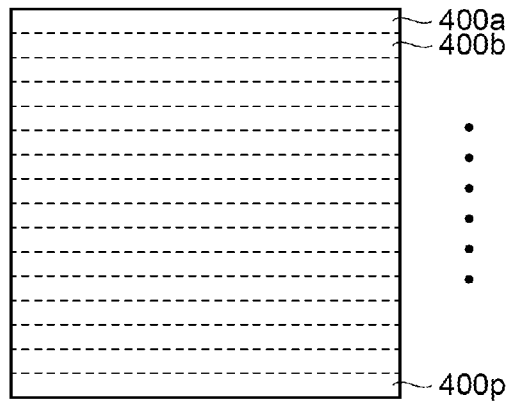

In FIG. 12 and FIG. 13, the pixel portion is divided into the two pixel portions 400a and 400b as illustrated in FIG. 14A; however, the division number is not limited thereto. For example, as illustrated in FIG. 14B, the pixel portion may be divided into four pixel portions 400a to 400d. Alternatively, as illustrated in FIG. 14C, the pixel portion may be divided into eight pixel portions 400a to 400h. Alternatively, as illustrated in FIG. 14D, the pixel portion may be divided into sixteen pixel portions 400a to 400p. Alternatively, the pixel portion can be divided by a given number which can divide the number of pixels in the perpendicular direction.

Figure 15:
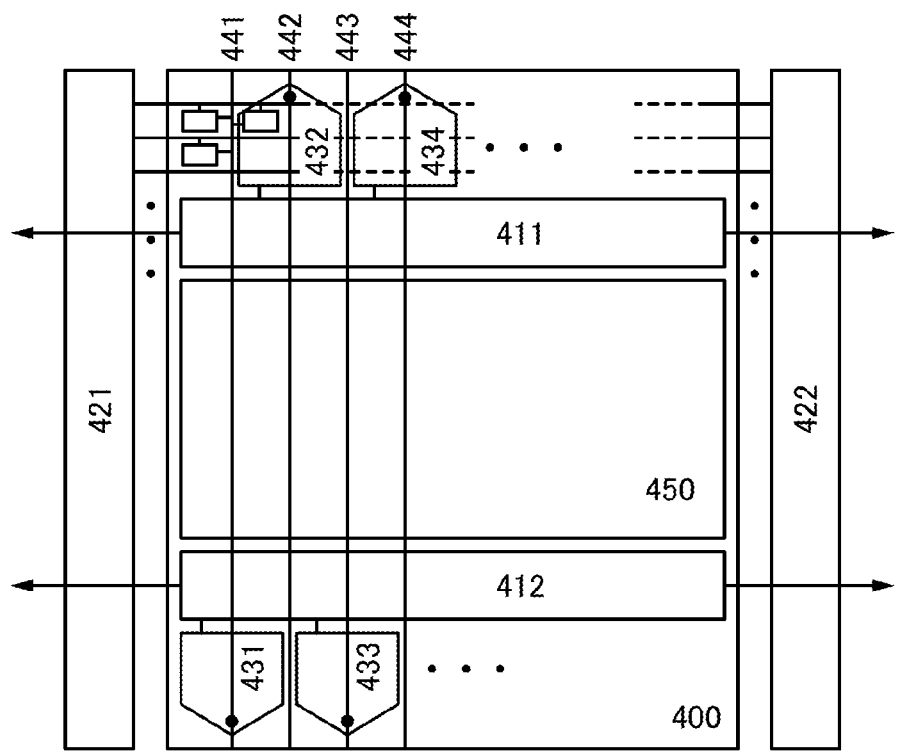
FIG. 15 is a top view illustrating a structure of an imaging device.

The imaging device of one embodiment of the present invention may have a structure illustrated in FIG. 15. In the structure in FIG. 15, a circuit 450 is added to the structure in FIG. 11A, and the circuit 450 is positioned to overlap with the pixel portion 400. The circuit 450 includes a power supply circuit, a timing circuit, a memory circuit, and/or an image processing circuit, for example. Although the circuit 450 is provided in one region in FIG. 15, the circuit 450 may be divided and positioned in a plurality of regions.

Figure 16:
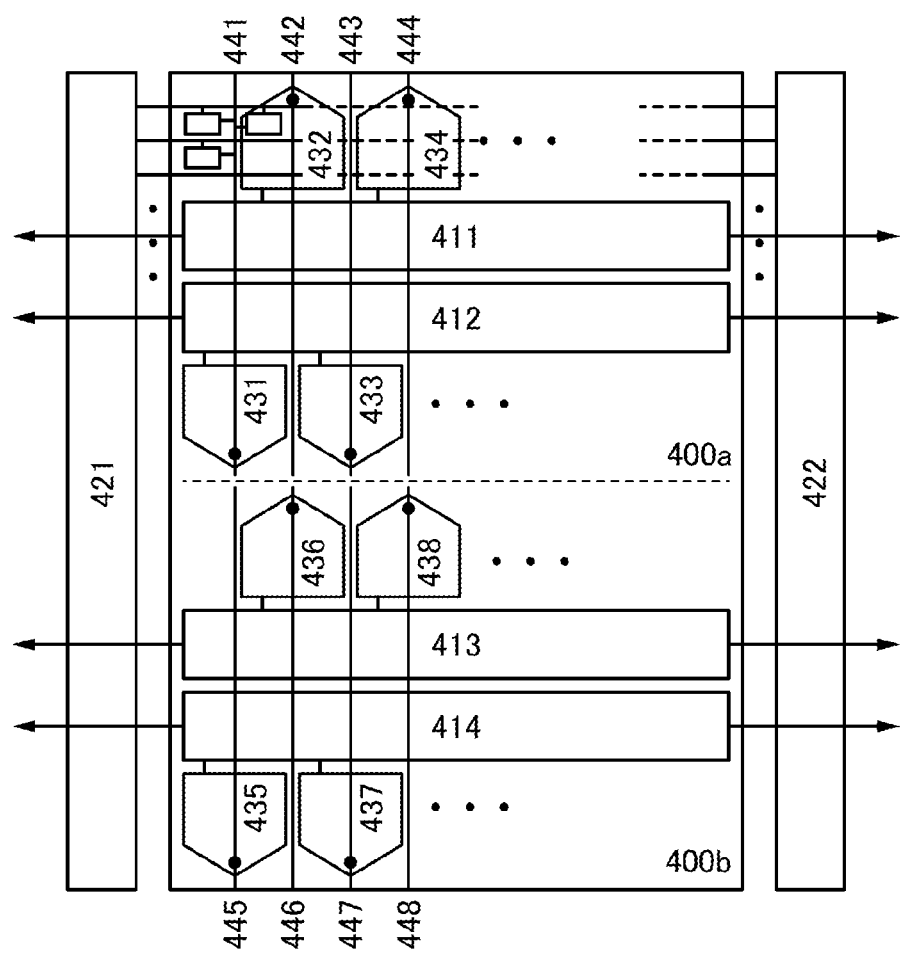
FIG. 16 is a top view illustrating a structure of an imaging device.
Figure 17:
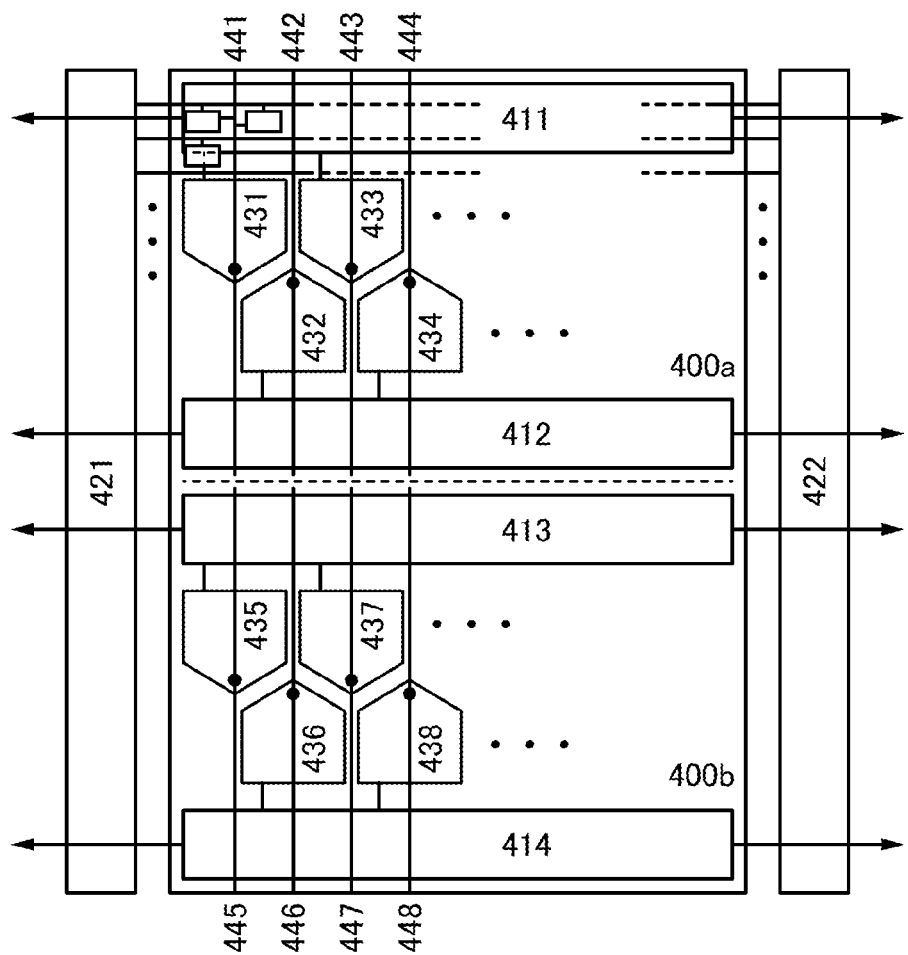
FIG. 17 is a top view illustrating a structure of an imaging device.

The imaging device of one embodiment of the present invention may have a structure illustrated in FIG. 16. In the structure in FIG. 16, the pixel portion is divided into two as in the structure in FIG. 12; however, the row driver is not divided. In the case of the structure, the divided pixel portions 400a and 400b cannot be operated at the same time and are sequentially read in the perpendicular direction. However, column drivers and circuits for processing signals for the pixel portion which is not read out can be off, which leads to the reduction in power consumption. For example, when the pixel portion 400a is read, power supply to the circuits 413, 414, and 435 to 438 can be stopped. Note that as illustrated in FIG. 17, a structure in which the pixel portion is divided into two as in FIG. 13 and the row driver is not divided can be employed. The division number of the pixel portion is not limited to two, and the pixel portion can be divided by a given number which can divide the number of pixels in the perpendicular direction.

Figure 18A:
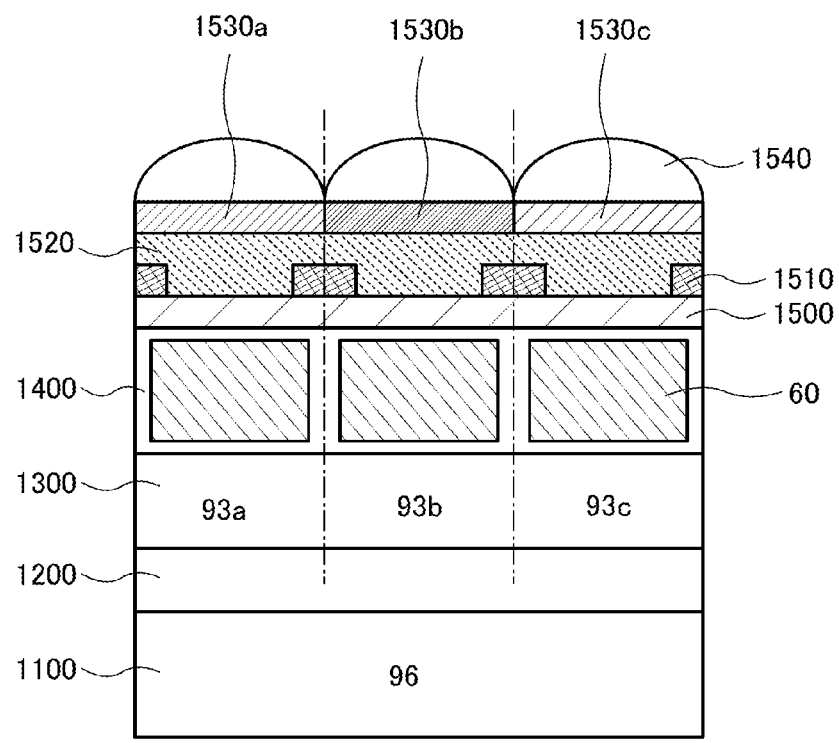
FIGS. 18A and 18B are cross-sectional views each illustrating a structure of an imaging device.

FIG. 18A is a cross-sectional view of an example of a mode in which a color filter and the like are added to the imaging device in FIG. 1A, illustrating three regions (regions 93a, 93b, and 93c) corresponding to three pixels and each including the pixel circuit (e.g., the circuit 91a) and a region 96 including the circuit 92a and the like. An insulating layer 1500 is formed over the photoelectric conversion element 60 formed in the fourth layer 1400. As the insulating layer 1500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 1510 is formed over the insulating layer 1500. The light-blocking layer 1510 has a function of inhibiting color mixing of light passing through the color filter. The light-blocking layer 1510 can be formed of a metal layer of aluminum, tungsten, or the like, or a stack including the metal layer and a dielectric film functioning as an anti-reflection film.

An organic resin layer 1520 is formed as a planarization film over the insulating layer 1500 and the light-blocking layer 1510. A color filter 1530a, a color filter 1530b, and a color filter 1530c are formed over the region 93a, the region 93b, and the region 93c, respectively. Each of the color filters has any of colors of R (red), G (green), B (blue), Y (yellow), C (cyan), and M (magenta), whereby a color image can be obtained.

A microlens array 1540 is provided over the color filters 1530a, 1530b, and 1530c. Thus, light penetrating lenses included in the microlens array 1540 go through the color filters positioned therebelow to reach the photoelectric conversion element.

Figure 18B:
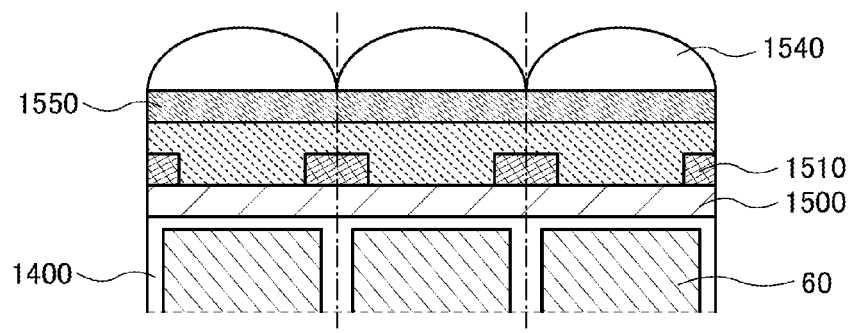

In the structure of the imaging device, an optical conversion layer 1550 (see FIG. 18B) may be used instead of the color filters 1530a, 1530b, and 1530c. Such a structure enables the imaging device to take images in various wavelength regions.

For example, when a filter which blocks light having a wavelength shorter than or equal to that of visible light is used as the optical conversion layer 1550, an infrared imaging device can be obtained. When a filter which blocks light having a wavelength shorter than or equal to that of infrared light is used as the optical conversion layer 1550, a far-infrared imaging device can be obtained. When a filter which blocks light having a wavelength longer than or equal to that of visible light is used as the optical conversion layer 1550, an ultraviolet imaging device can be obtained.

Furthermore, when a scintillator is used as the optical conversion layer 1550, an imaging device which takes an image visualizing the intensity of radiation and is used for an X-ray imaging device, for example, can be obtained. Radiation such as X-rays passes through a subject to enter a scintillator, and then is converted into light (fluorescence) such as visible light or ultraviolet light owing to a phenomenon known as photoluminescence. Then, the photoelectric conversion element 60 detects the light to obtain image data. Furthermore, the imaging device having the structure may be used in a radiation detector or the like.

A scintillator is formed of a substance that, when irradiated with radiation such as X-rays or gamma-rays, absorbs energy of the radiation to emit visible light or ultraviolet light. For example, materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed can be used.

In the photoelectric conversion element 60 using a selenium-based material, radiation such as X-rays can be directly converted into electrical charges; thus, the scintillator is not necessarily used.

As illustrated in FIGS. 19A1 and 19B1, the imaging device may be bent. FIG. 19A1 illustrates a state in which the imaging device is bent in the direction of dashed-two dotted line X1-X2. FIG. 19A2 is a cross-sectional view illustrating a portion indicated by dashed-two dotted line X1-X2 in FIG. 19A1. FIG. 19A3 is a cross-sectional view illustrating a portion indicated by dashed-two dotted line Y1-Y2 in FIG. 19A1.

FIG. 19B1 illustrates a state where the imaging device is bent in the direction of dashed-two dotted line X3-X4 and the direction of dashed-two dotted line Y3-Y4. FIG. 19B2 is a cross-sectional view illustrating a portion indicated by dashed-two dotted line X3-X4 in FIG. 19B1. FIG. 19B3 is a cross-sectional view illustrating a portion indicated by dashed-two dotted line Y3-Y4 in FIG. 19B1.

Bending the imaging device can reduce field curvature and astigmatism. Thus, the optical design of lens and the like, which are used in combination of the imaging device, can be facilitated. For example, the number of lenses used for aberration correction can be reduced; accordingly, the size or weight of semiconductor devices including the imaging device can be easily reduced. In addition, the quality of a captured image can be improved.

In this embodiment, one embodiment of the present invention has been described. Other embodiments of the present invention are described in the other embodiments. Note that one embodiment of the present invention is not limited thereto. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example.

This embodiment can be combined with any of the structures described in the other embodiments as appropriate.

(Embodiment 2)

In this embodiment, the pixel circuit described in Embodiment 1 is described.

Figure 20A:
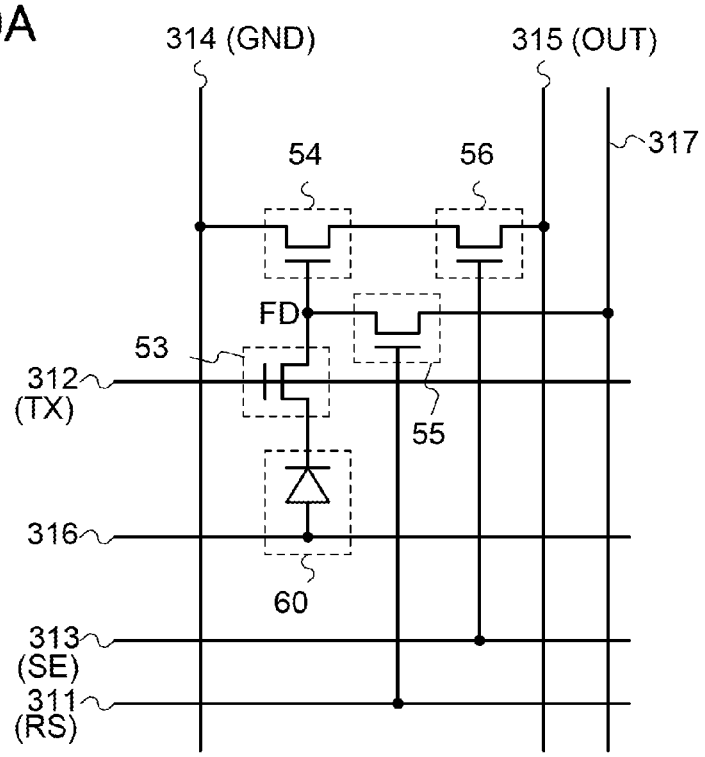
FIGS. 20A and 20B each illustrate a configuration of a pixel circuit.

FIG. 20A shows details of connections between the pixel circuit (corresponding to the circuit 91*a*) in FIG. 4A and a variety of wirings. The circuit in FIG. 20A includes the photoelectric conversion element 60, the transistor 53, the transistor 54, the transistor 55, and a transistor 56.

The anode of the photoelectric conversion element 60 is electrically connected to a wiring 316, and the cathode of the photoelectric conversion element 60 is electrically connected to one of the source and the drain of the transistor 53. The other of the source and the drain of the transistor 53 is electrically connected to the charge storage portion (FD), and a gate of the transistor 53 is electrically connected to a wiring 312 (TX). One of a source and a drain of the transistor 54 is electrically connected to a wiring 314 (GND), the other of the source and the drain of the transistor 54 is electrically connected to one of a source and a drain of the transistor 56, and the gate of the transistor 54 is electrically connected to the charge storage portion (FD). One of the source and the drain of the transistor 55 is electrically connected to the charge storage portion (FD), the other of the source and the drain of the transistor 55 is electrically connected to a wiring 317, and a gate of the transistor 55 is electrically connected to a wiring 311 (RS). The other of the source and the drain of the transistor 56 is electrically connected to a wiring 315 (OUT), and a gate of the transistor 56 is electrically connected to a wiring 313 (SE). Note that all the above connections are electrical connections.

A potential such as GND, VSS, or VDD may be supplied to the wiring 314. Here, a potential or a voltage has a relative value. Therefore, the potential GND is not necessarily 0 V.

The photoelectric conversion element 60 is a light-receiving element and has a function of generating current corresponding to the amount of light incident on the pixel circuit. The transistor 53 has a function of controlling supply of charge from the photoelectric conversion element 60 to the charge storage portion (FD) performed by the photoelectric conversion element 60. The transistor 54 has a function of outputting a signal which corresponds to the potential of the charge storage portion (FD). The transistor 55 has a function of resetting the potential of the charge storage portion (FD). The transistor 56 has a function of controlling selection of the pixel circuit at the time of reading.

Note that the charge storage portion (FD) is a charge retention node and retains charge that is changed depending on the amount of light received by the photoelectric conversion element 60.

Note that the transistor 54 and the transistor 56 only need to be connected in series between the wiring 315 and the wiring 314. Hence, the wiring 314, the transistor 54, the transistor 56, and the wiring 315 may be arranged in order, or the wiring 314, the transistor 56, the transistor 54, and the wiring 315 may be arranged in order.

The wiring 311 (RS) functions as a signal line for controlling the transistor 55. The wiring 312 (TX) functions as a signal line for controlling the transistor 53. The wiring 313 (SE) functions as a signal line for controlling the transistor 56. The wiring 314 (GND) functions as a signal line for supplying a reference potential (e.g., GND). The wiring 315 (OUT) functions as a signal line for reading a signal output from the transistor 54. The wiring 316 functions as a signal line for outputting charge from the charge storage portion (FD) through the photoelectric conversion element 60 and is a low-potential line in the circuit in FIG. 20A. The wiring 317 functions as a signal line for resetting the potential of the charge storage portion (FD) and is a high-potential line in the circuit in FIG. 20A.

Figure 20B:
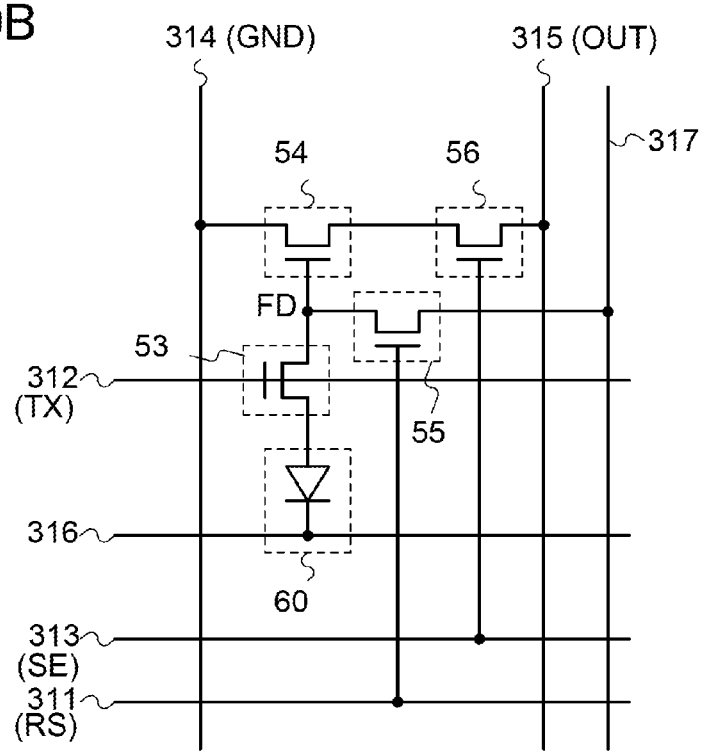

The pixel circuit of one embodiment of the present invention may have a configuration illustrated in FIG. 20B. The circuit illustrated in FIG. 20B includes the same components as those in the circuit in FIG. 20A but is different from the circuit in that the anode of the photoelectric conversion element 60 is electrically connected to one of the source and the drain of the transistor 53 and the cathode of the photoelectric conversion element 60 is electrically connected to the wiring 316. In this case, the wiring 316 functions as a signal line for supplying charge to the charge storage portion (FD) through the photoelectric conversion element 60 and is a high-potential line in the circuit in FIG. 20B. Furthermore, the wiring 317 is a low-potential line.

Next, a structure of each component illustrated in FIGS. 20A and 20B is described.

As described in Embodiment 1, an element formed using a selenium-based material and a conductive layer or an element in which a PIN junction is formed using a silicon layer can be used as the photoelectric conversion element 60.

Although a silicon semiconductor such as amorphous silicon, microcrystalline silicon, polycrystalline silicon, or single crystal silicon can be used to form the transistor 53, the transistor 54, the transistor 55, and the transistor 56, an oxide semiconductor is preferably used to form the transistors. A transistor in which a channel formation region is formed of an oxide semiconductor has an extremely low off-state current.

In particular, when the transistors 53 and 55 connected to the charge storage portion (FD) has a high leakage current, charge accumulated in the charge storage portion (FD) cannot be retained for a sufficiently long time. The use of an oxide semiconductor for the transistors 52 and 55 prevents unwanted output of charge from the charge storage portion (FD).

Unwanted output of charge also occurs in the wiring 314 or the wiring 315 when the transistor 54 and the transistor 56 have a large leakage current; thus, transistors in which a channel formation region is formed of an oxide semiconductor are preferably used as these transistors.

Figure 21A:
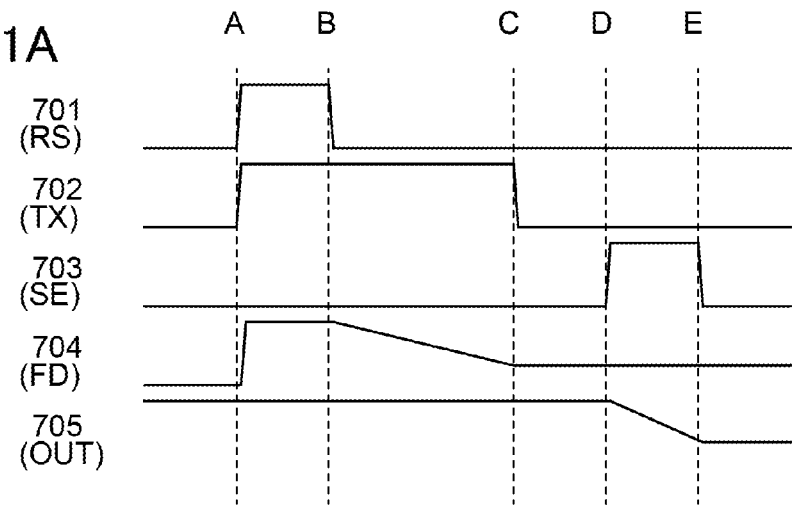
FIGS. 21A to 21C are timing charts each illustrating an operation of a pixel circuit.

An example of the operation of the circuit in FIG. 20A is described using a timing chart shown in FIG. 21A.

In FIG. 21A, a potential of each wiring is denoted as a signal which varies between two levels for simplicity. Note that because each potential is an analog signal, the potential can, in practice, have various levels in accordance with situations without being limited to two levels. In the drawing, a signal 701 corresponds to the potential of the wiring 311 (RS); a signal 702, the potential of the wiring 312 (TX); a signal 703, the potential of the wiring 313 (SE); a signal 704, the potential of the charge storage portion (FD); and a signal 705, the potential of the wiring 315 (OUT). Note that the potential of the wiring 316 is always at low level, and the potential of the wiring 317 is always at high level.

At time A, the potential of the wiring 311 (signal 701) is at high level and the potential of the wiring 312 (signal 702) is at high level, so that the potential of the charge storage portion (FD) (signal 704) is initialized to the potential of the wiring 317 (high level), and reset operation is started. Note that the potential of the wiring 315 (signal 705) is precharged to high level.

At time B, the potential of the wiring 311 (signal 701) is set at low level, whereby the reset operation is terminated to start accumulation operation. Here, a reverse bias is applied to the photoelectric conversion element 60, whereby the potential of the charge storage portion (FD) (signal 704) starts to decrease due to a reverse current. Since irradiation of the photoelectric conversion element 60 with light increases the reverse current, the rate of decrease in the potential of the charge storage portion (FD) (signal 704) changes depending on the amount of the light irradiation. In other words, channel resistance between the source and the drain of the transistor 54 changes depending on the amount of light emitted to the photoelectric conversion element 60.

At time C, the potential of the wiring 312 (signal 702) is set to low level to terminate the accumulation operation, so that the potential of the charge storage portion (FD) (signal 704) becomes constant. Here, the potential is determined by the amount of electrical charge generated by the photoelectric conversion element 60 during the accumulation operation. That is, the potential changes depending on the amount of light emitted to the photoelectric conversion element 60. Furthermore, since the transistor 53 and the transistor 55 are each a transistor which includes a channel formation region formed of an oxide semiconductor layer and which has an extremely small off-state current, the potential of the charge storage portion (FD) can be kept constant until a subsequent selection operation (read operation) is performed.

Note that when the potential of the wiring 312 (signal 702) is set at low level, the potential of the charge storage portion (FD) might change owing to parasitic capacitance between the wiring 312 and the charge storage portion (FD). In the case where this potential change is large, the amount of electrical charge generated by the photoelectric conversion element 60 during the accumulation operation cannot be obtained accurately. Examples of effective measures to reduce the amount of change in the potential include reducing the capacitance between the gate and the source (or between the gate and the drain) of the transistor 53, increasing the gate capacitance of the transistor 54, and providing a storage capacitor to connect the charge storage portion (FD). Note that in this embodiment, the change in the potential can be ignored by the adoption of these measures.

At time D, the potential of the wiring 313 (signal 703) is set at high level to turn on the transistor 56, whereby selection operation starts and the wiring 314 and the wiring 315 are electrically connected to each other through the transistor 54 and the transistor 56. Also, the potential of the wiring 315 (signal 705) starts to decrease. Note that precharge of the wiring 315 is terminated before the time D. Here, the rate at which the potential of the wiring 315 (signal 705) decreases depends on the current between the source and the drain of the transistor 54. That is, the potential of the wiring 315 (signal 705) changes depending on the amount of light emitted to the photoelectric conversion element 60 during the accumulation operation.

At time E, the potential of the wiring 313 (signal 703) is set at low level to turn off the transistor 56, so that the selection operation is terminated and the potential of the wiring 315 (signal 705) becomes a constant value. Here, the constant value changes depending on the amount of light emitted to the photoelectric conversion element 60. Therefore, the amount of light emitted to the photoelectric conversion element 60 during the accumulation operation can be determined by measuring the potential of the wiring 315.

Specifically, when the photoelectric conversion element 60 is irradiated with light with high intensity, the potential of the charge storage portion (FD), that is, the gate voltage of the transistor 54 is low. Therefore, current flowing between the source and the drain of the transistor 54 becomes small; as a result, the potential of the wiring 315 (signal 705) is gradually lowered. Thus, a relatively high potential can be read from the wiring 315.

In contrast, when the photoelectric conversion element 60 is irradiated with light with low intensity, the potential of the charge storage portion (FD), that is, the gate voltage of the transistor 54 is high. Therefore, the current flowing between the source and the drain of the transistor 54 becomes large; thus, the potential of the wiring 315 (signal 705) rapidly decreases. Thus, a relatively low potential can be read from the wiring 315.

Figure 21B:
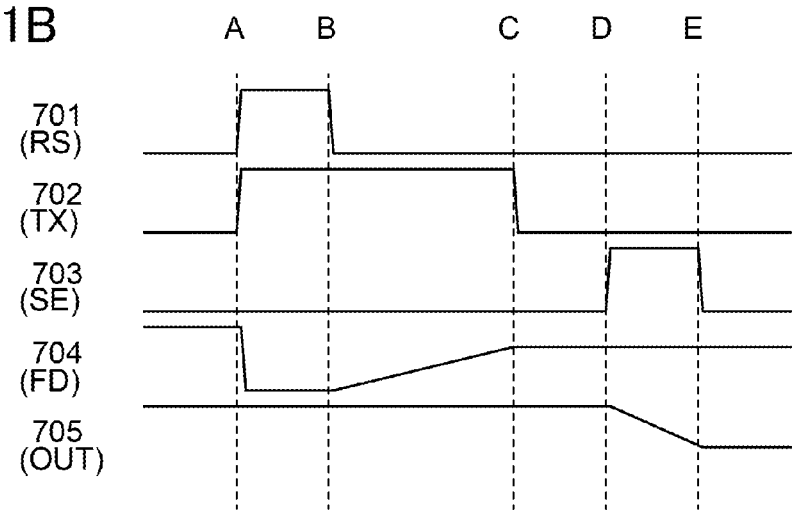

Next, an example of the operation of the circuit in FIG. 20B is described with reference to a timing chart in FIG. 21B. Note that the wiring 316 is always at high level, and the potential of the wiring 317 is always at low level.

At time A, the potential of the wiring 311 (signal 701) is at high level and the potential of the wiring 312 (signal 702) is at high level, so that the potential of the charge storage portion (FD) (signal 704) is initialized to the potential of the wiring 317 (low level), and reset operation is started. Note that the potential of the wiring 315 (signal 705) is precharged to high level.

At time B, the potential of the wiring 311 (signal 701) is set at low level, whereby the reset operation is terminated to start accumulation operation. Here, a reverse bias is applied to the photoelectric conversion element 60, whereby the potential of the charge storage portion (FD) (signal 704) starts to increase due to a reverse current.

The description of the timing chart of FIG. 21A can be referred to for operations at and after the time C. The amount of light emitted to the photoelectric conversion element 60 during the accumulation operation can be determined by measuring the potential of the wiring 315 at time E.

Figure 46:
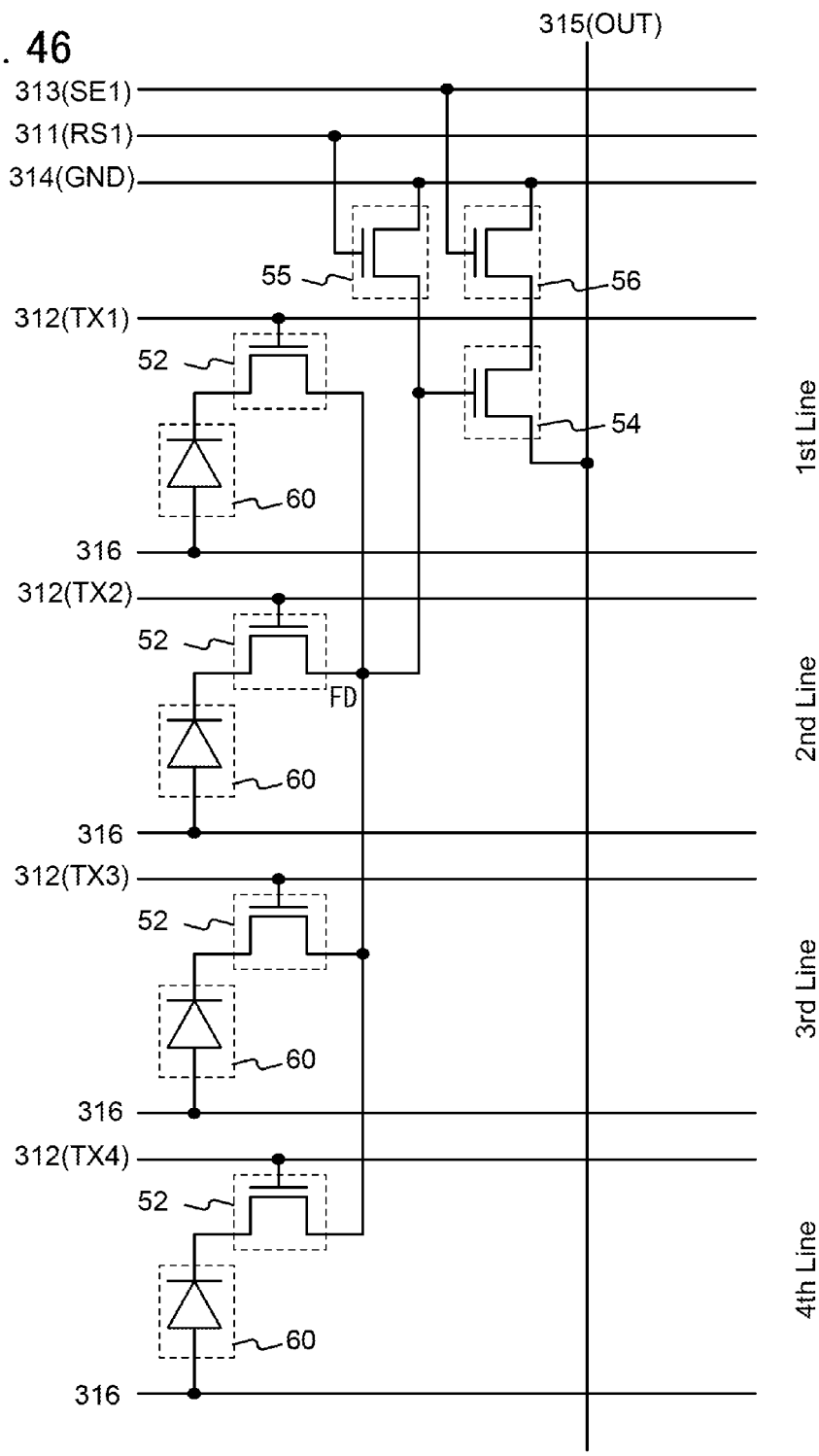
FIG. 46 illustrates a configuration of a pixel circuit.

Note that the pixel circuit in FIG. 20A may have a configuration in which the transistors 54 to 56 are shared among a plurality of pixels as illustrated in FIG. 46. FIG. 46 illustrates a configuration in which the transistors 54 to 56 are shared among a plurality of pixels in the perpendicular direction; however, the transistors 54 to 56 may be shared among a plurality of pixels in the horizontal direction or in the horizontal and perpendicular direction. With such a structure, the number of transistors included in one pixel can be reduced. FIG. 46 illustrates a configuration in which the transistors 54 to 56 are shared among four pixels; however, the transistors 54 to 56 may be shared among two pixels, three pixels, five pixels or more. Furthermore, the pixel circuit in FIG. 20B can have a configuration similar to that of the pixel circuit in FIG. 46.

Figure 22A:
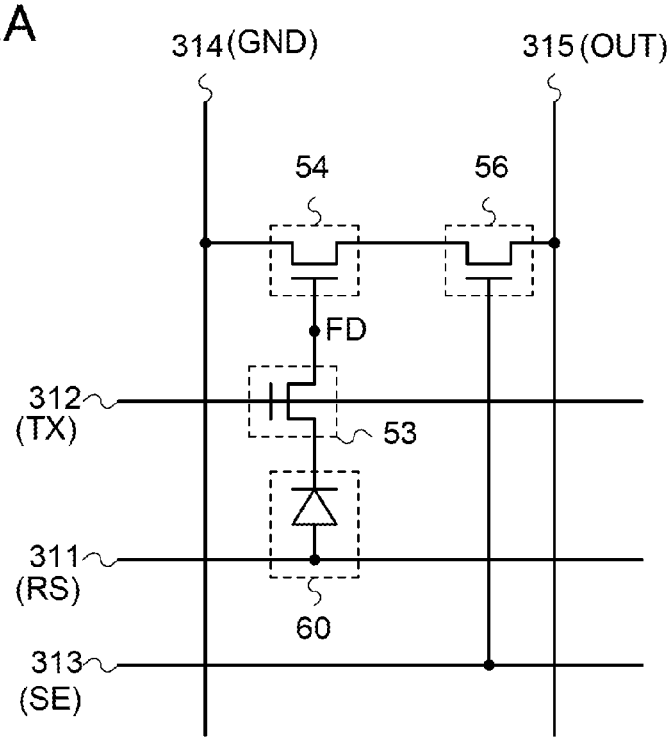
FIGS. 22A and 22B each illustrate a configuration of a pixel circuit.
Figure 22B:
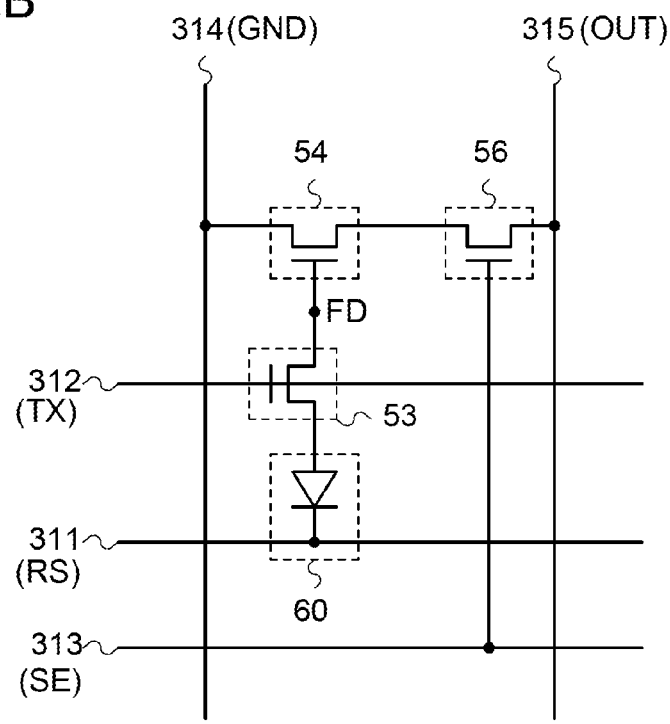

The pixel circuit of one embodiment of the present invention may have any of configurations illustrated in FIGS. 22A and 22B.

The configuration of a circuit in FIG. 22A is different from that of the circuit in FIG. 20A in that the transistor 55, the wiring 316, and the wiring 317 are not provided, and the wiring 311 (RS) is electrically connected to the anode of the photoelectric conversion element 60. The other structures are the same as those in the circuit in FIG. 20A.

The circuit in FIG. 22B includes the same components as those in the circuit in FIG. 22A but is different from the circuit in that the anode of the photoelectric conversion element 60 is electrically connected to one of the source and the drain of the transistor 53 and the cathode of the photoelectric conversion element 60 is electrically connected to the wiring 311 (RS).

Like the circuit in FIG. 20A, the circuit in FIG. 22A can be operated in accordance with the timing chart shown in FIG. 21A.

At time A, the potential of the wiring 311 (signal 701) is set at high level and the potential of the wiring 312 (signal 702) is set at high level, whereby a forward bias is applied to the photoelectric conversion element 60 and the potential of the charge storage portion (FD) (signal 704) is set at high level. In other words, the potential of the charge storage portion (FD) is initialized to the potential of the wiring 311 (RS) (high level) and brought into a reset state. The above is the start of the reset operation. Note that the potential of the wiring 315 (signal 705) is precharged to high level.

At time B, the potential of the wiring 311 (signal 701) is set at low level, whereby the reset operation is terminated to start accumulation operation. Here, a reverse bias is applied to the photoelectric conversion element 60, whereby the potential of the charge storage portion (FD) (signal 704) starts to decrease due to a reverse current.

The description of the circuit configuration of FIG. 20A can be referred to for operations at and after time C. The amount of light emitted to the photoelectric conversion element 60 during the accumulation operation can be determined by measuring the potential of the wiring 315 at time E.

Figure 21C:
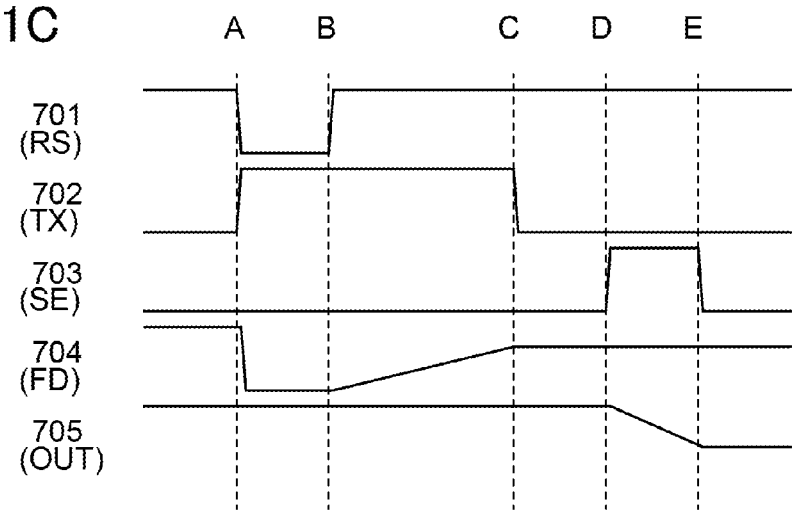

The circuit in FIG. 22B can be operated in accordance with the timing chart shown in FIG. 21C.

At time A, the potential of the wiring 311 (signal 701) is set at low level and the potential of the wiring 312 (signal 702) is set at high level, whereby a forward bias is applied to the photoelectric conversion element 60 and the potential of the charge storage portion (FD) (signal 704) is set at low level to be in a reset state. The above is the start of the reset operation. Note that the potential of the wiring 315 (signal 705) is precharged to high level.

At time B, the potential of the wiring 311 (signal 701) is set at high level, whereby the reset operation is terminated to start accumulation operation. Here, a reverse bias is applied to the photoelectric conversion element 60, whereby the potential of the charge storage portion (FD) (signal 704) starts to increase due to a reverse current.

The description of the circuit configuration of FIG. 20A can be referred to for operations at and after time C. The amount of light emitted to the photoelectric conversion element 60 during the accumulation operation can be determined by measuring the potential of the wiring 315 at time E.

Figure 47:
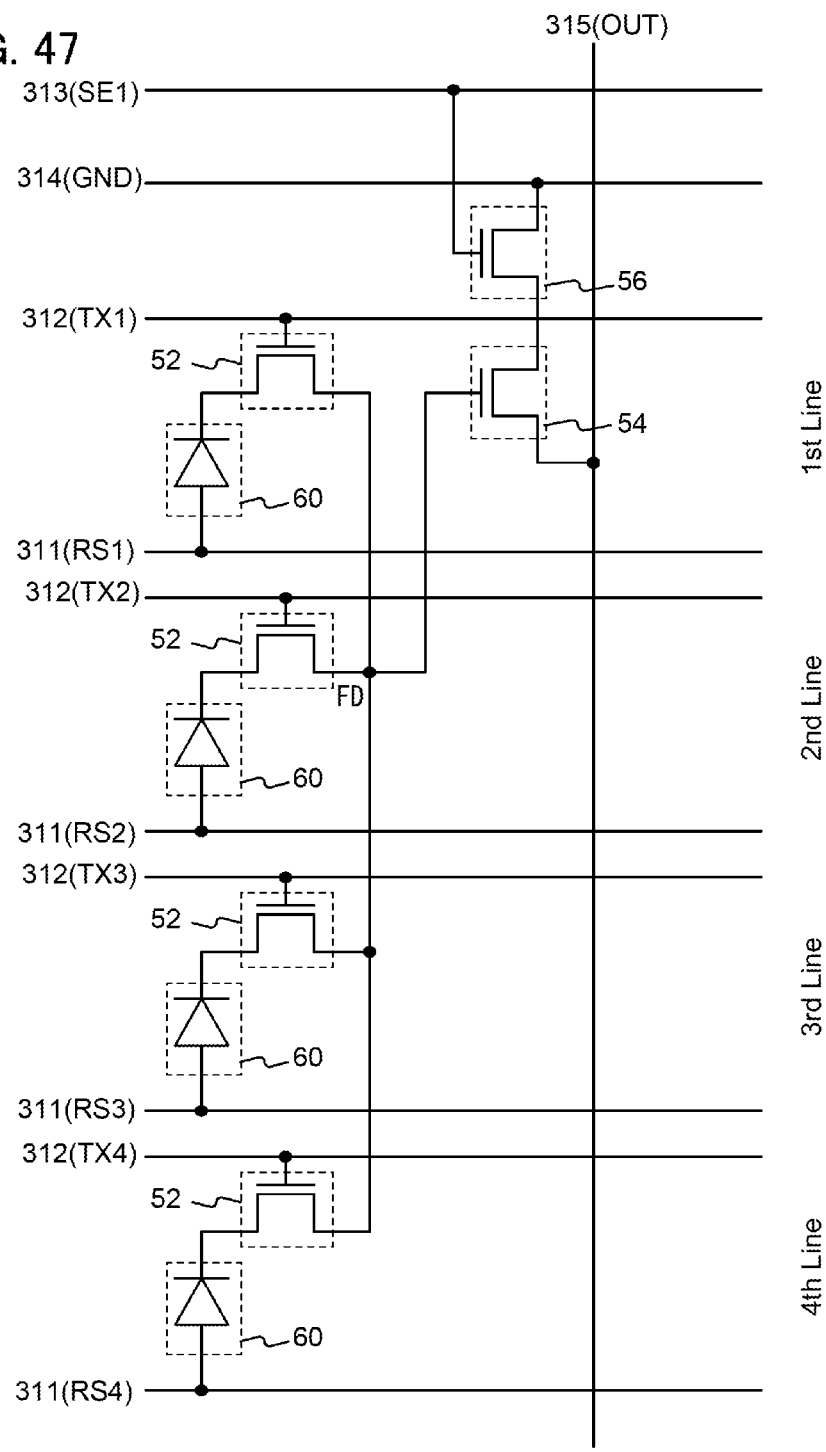
FIG. 47 illustrates a configuration of a pixel circuit.

Note that the pixel circuit in FIG. 22A may have a configuration in which the transistors 54 to 56 are shared among a plurality of pixels as illustrated in FIG. 47. FIG. 47 illustrates a configuration in which the transistors 54 to 56 are shared among a plurality of pixels in the perpendicular direction; however, the transistors 54 to 56 may be shared among a plurality of pixels in the horizontal direction or in the horizontal and perpendicular direction. FIG. 47 illustrates a configuration in which the transistors 54 to 56 are shared among four pixels; however, the transistors 54 to 56 may be shared among two pixels, three pixels, five pixels or more. Furthermore, the pixel circuit in FIG. 22B can have a configuration similar to that of the pixel circuit in FIG. 47.

Figure 23A:
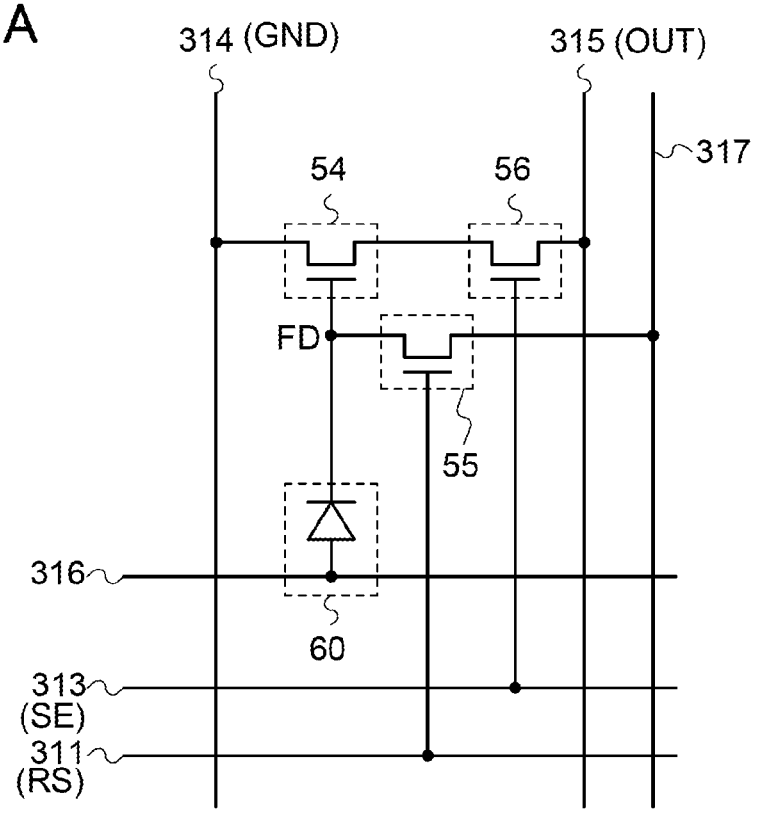
FIGS. 23A and 23B each illustrate a configuration of a pixel circuit.
Figure 23B:
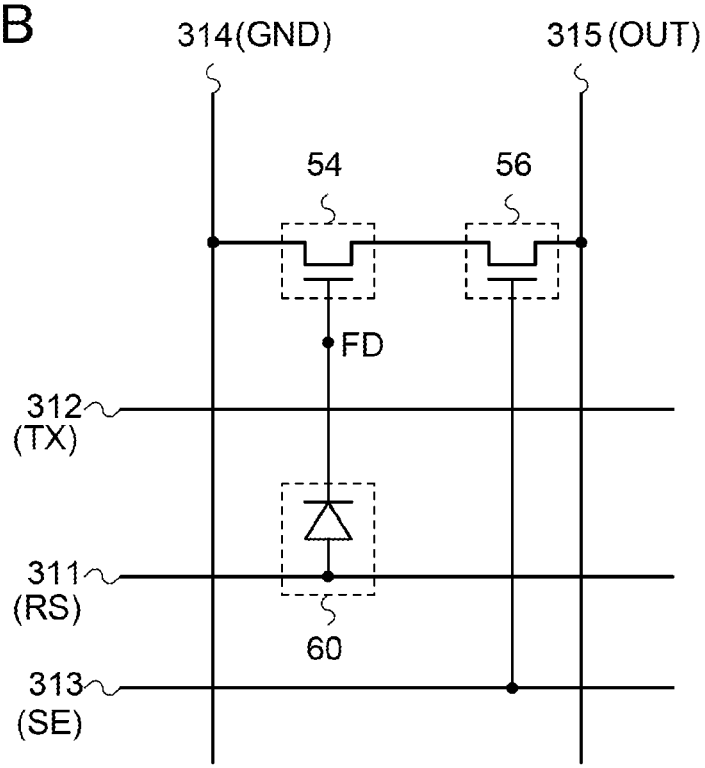

Note that FIGS. 20A and 20B and FIGS. 22A and 22B each show the example in which the transistor 53 is provided; however, one embodiment of the present invention is not limited thereto. As shown in FIGS. 23A and 23B, the transistor 53 may be omitted.

Figure 24A:
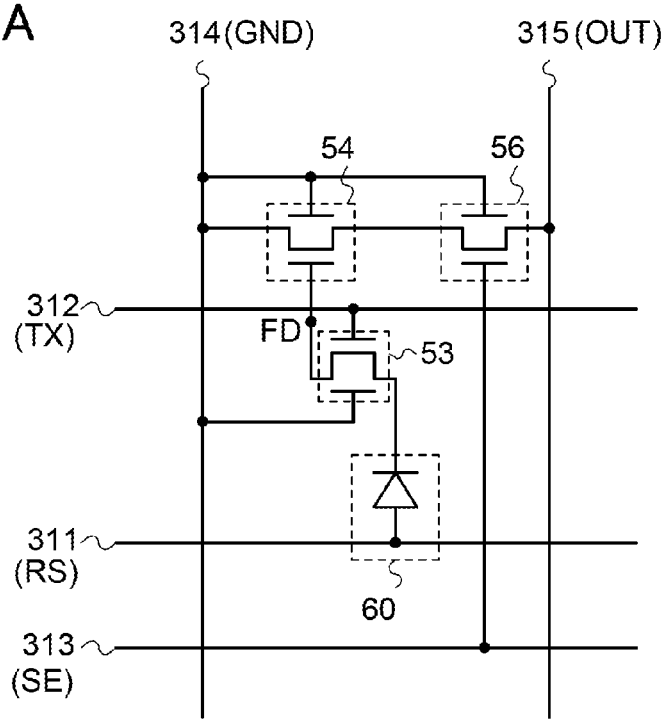
FIGS. 24A and 24B each illustrate a configuration of a pixel circuit.
Figure 24B:
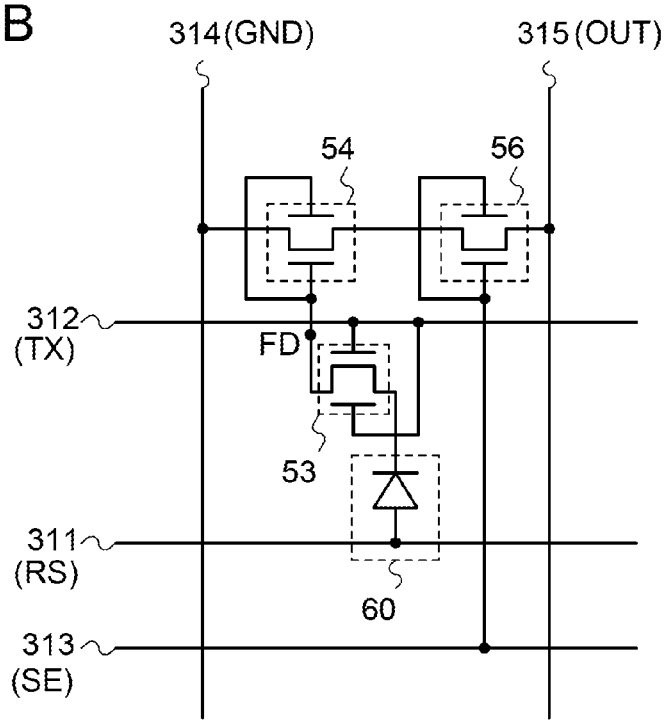

The transistor 53, the transistor 54, and the transistor 56 in the pixel circuit may each have a back gate as illustrated in FIGS. 24A and 24B. FIG. 24A illustrates a configuration of applying a constant potential to the back gates, which enables control of the threshold voltages. FIG. 24B illustrates a configuration in which the back gates are supplied with the same potential as their respective front gates, which enables an increase in on-state current. Although the back gates are electrically connected to the wiring 314 (GND) in FIG. 24A, they may be electrically connected to a different wiring to which a constant potential is supplied. Furthermore, although FIGS. 24A and 24B each illustrate an example in which back gates are provided in the transistors of the circuit in FIG. 22A, the circuits in FIGS. 20A and 20B, FIG. 22B, and FIGS. 23A and 23B may have a similar configuration. Moreover, a configuration of applying the same potential to a front gate and a back gate, a configuration of applying a constant potential to a back gate, and a configuration without a back gate may be arbitrarily combined as necessary for the transistors in one circuit.

Figure 48:
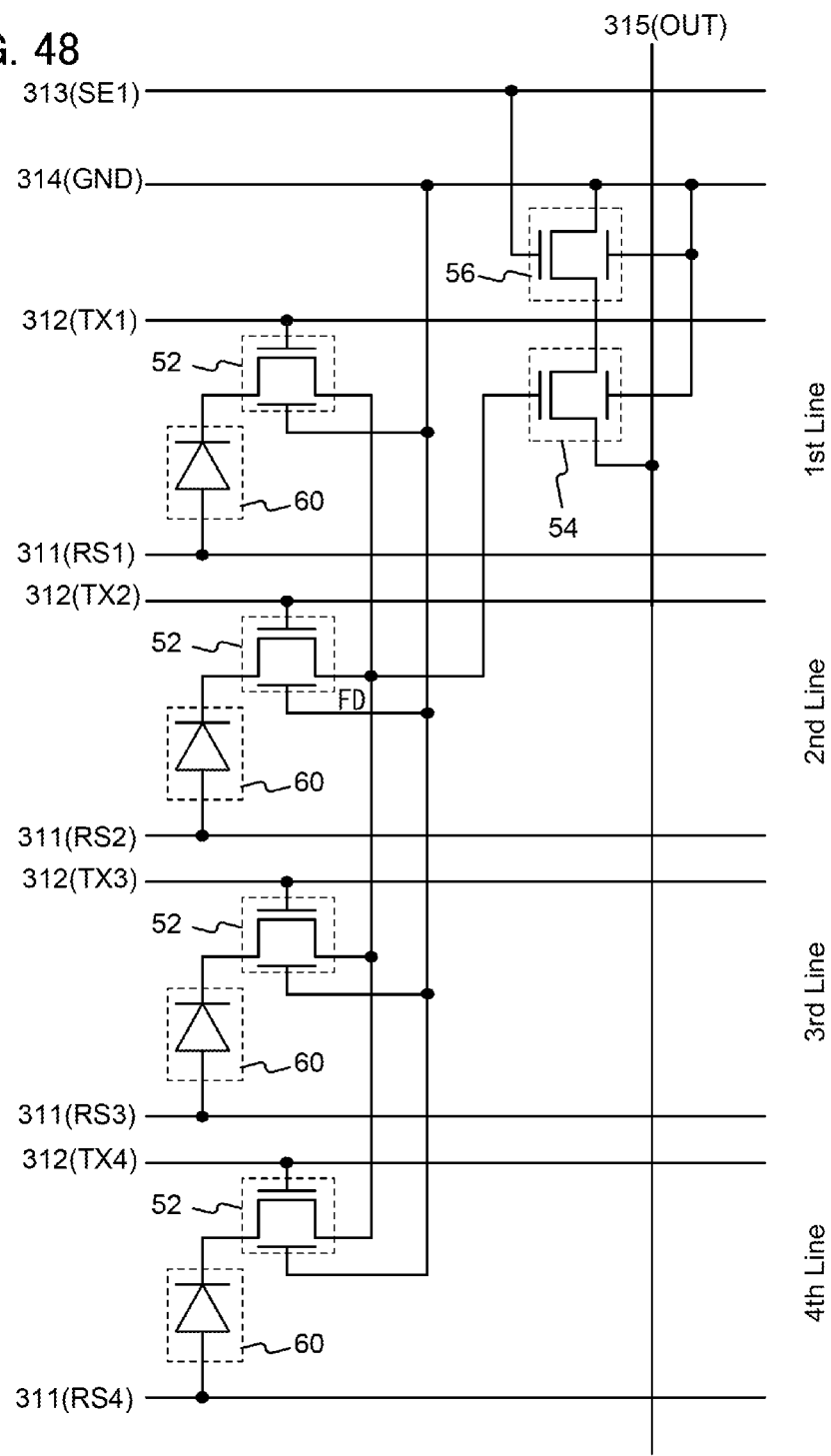
FIG. 48 illustrates a configuration of a pixel circuit.
Figure 49:
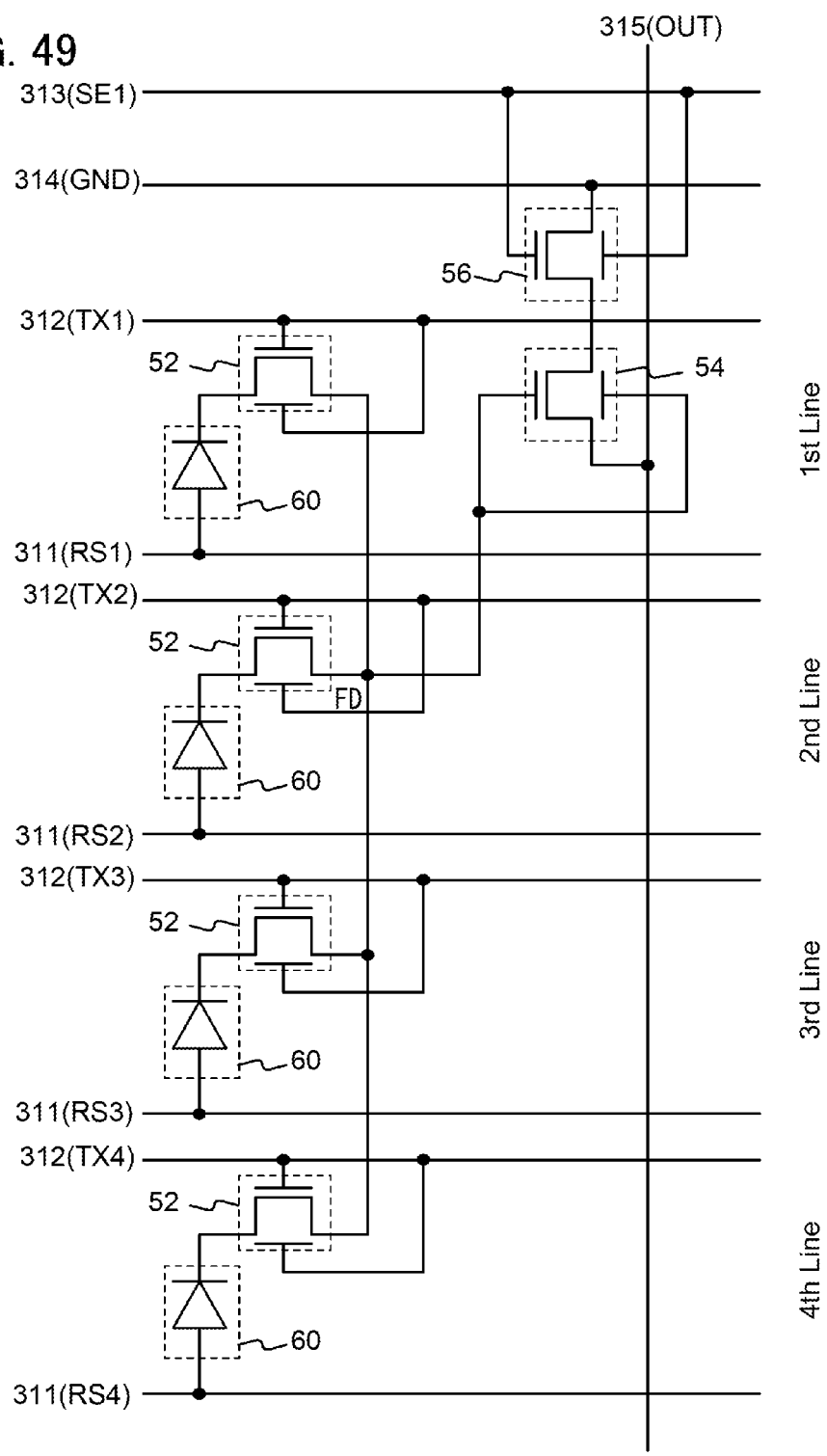
FIG. 49 illustrates a configuration of a pixel circuit.

Note that the pixel circuit in FIG. 24A may have a configuration in which the transistors 54 to 56 are shared among a plurality of pixels as illustrated in FIG. 48. Furthermore, the pixel circuit in FIG. 24B may have a configuration in which the transistors 54 to 56 are shared among a plurality of pixels as illustrated in FIG. 49.

This embodiment can be implemented in an appropriate combination with any of the structures described in the other embodiments.

(Embodiment 3)

In this embodiment, an example of a driving method of a pixel circuit is described.

As described in Embodiment 2, the operation of the pixel circuit is repetition of the reset operation, the accumulation operation, and the selection operation. As imaging modes in which the whole pixel matrix is controlled, a global shutter system and a rolling shutter system are known.

FIG. 25A shows a timing chart in a global shutter system. FIG. 25A shows operations of an imaging device in which a plurality of pixel circuits illustrated in FIG. 20A are arranged in a matrix. Specifically, FIG. 25A show operations of the pixel circuits from the first row to the n-th row (n is a natural number of three or more). The following description for operation can be applied to any of the circuits in FIG. 20B, FIGS. 22A and 22B, and FIGS. 23A and 23B.

In FIG. 25A, a signal 501, a signal 502, and a signal 503 are input to the wirings 311 (RS) connected to the pixel circuits in the first row, the second row, and the n-th row, respectively. A signal 504, a signal 505, and a signal 506 are input to the wirings 312 (TX) connected to the pixel circuits in the first row, the second row, and the n-th row, respectively. A signal 507, a signal 508, and a signal 509 are input to the wirings 313 (SE) connected to the pixel circuits in the first row, the second row, and the n-th row, respectively.

A period 510 is a period required for one imaging. In a period 511, the pixel circuits in each row perform the reset operation at the same time. In a period 520, the pixel circuits in each row perform the accumulation operation at the same time. Note that the selection operation is sequentially performed in the pixel circuits for each row. For example, in a period 531, the selection operation is performed in the pixel circuits in the first row. As described above, in the global shutter system, the reset operation is performed in all the pixel circuits substantially at the same time, the accumulation operation is performed in all the pixel circuits substantially at the same time, and then the read operation is sequentially performed for each row.

That is, in the global shutter system, since the accumulation operation is performed in all the pixel circuits substantially at the same time, imaging is simultaneously performed in the pixel circuits in all the rows. Therefore, an image with little distortion can be obtained even in the case of a moving object.

On the other hand, FIG. 25B is a timing chart of the case where a rolling shutter system is used. The description of FIG. 25A can be referred to for the signals 501 to 509. A period 610 is the time taken for one imaging. A period 611, a period 612, and a period 613 are reset periods in the first row, the second row, and the n-th row, respectively. A period 621, a period 622, and a period 623 are accumulation operation periods in the first row, the second row, and the n-th row, respectively. In a period 631, the selection operation is performed in the pixel circuits in the first row. As described above, in the rolling shutter system, the accumulation operation is not performed at the same time in all the pixel circuits but is sequentially performed for each row; thus, imaging is not simultaneously performed in the pixel circuits in all the rows. Therefore, the timing of imaging in the first row is different from that of imaging in the last row, and thus an image with large distortion is obtained in the case of a moving object.

To perform the global shutter system, the potential of the charge storage portion (FD) in each pixel circuit needs to be kept for a long time until sequential reading of signals from the pixels is terminated. When a transistor including a channel formation region formed of an oxide semiconductor and having an extremely small off-state current is used as the transistor 53 and the like, the potential of the charge storage portion (FD) can be kept for a long time. In the case where a transistor including a channel formation region formed of silicon or the like is used as the transistor 53 and the like, the potential of the charge storage portion (FD) cannot be kept for a long time because of a high off-state current, which makes it difficult to use the global shutter system.

The use of transistors including a channel formation region formed of an oxide semiconductor in the pixel circuits makes it easy to perform the global shutter system.

This embodiment can be implemented in an appropriate combination with any of the structures described in the other embodiments.

(Embodiment 4)

In this embodiment, a transistor including an oxide semiconductor that can be used in one embodiment of the present invention is described with reference to drawings. In the drawings in this embodiment, some components are enlarged, reduced in size, or omitted for easy understanding.

Figure 26A:
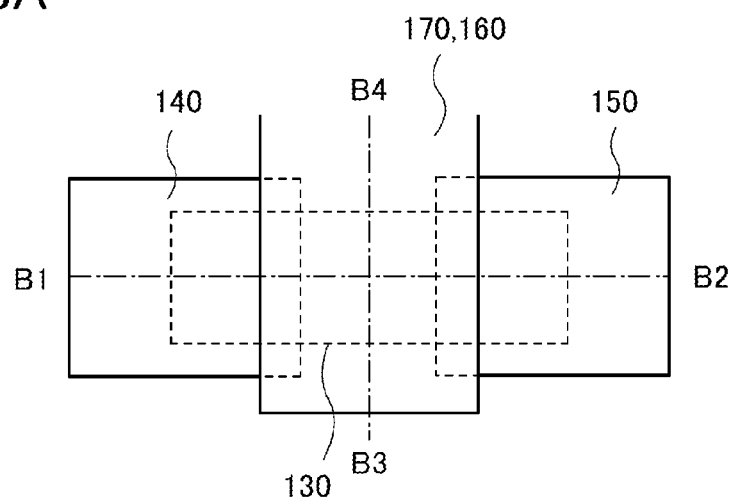
FIGS. 26A and 26B are a top view and a cross-sectional view illustrating a transistor.
Figure 26B:
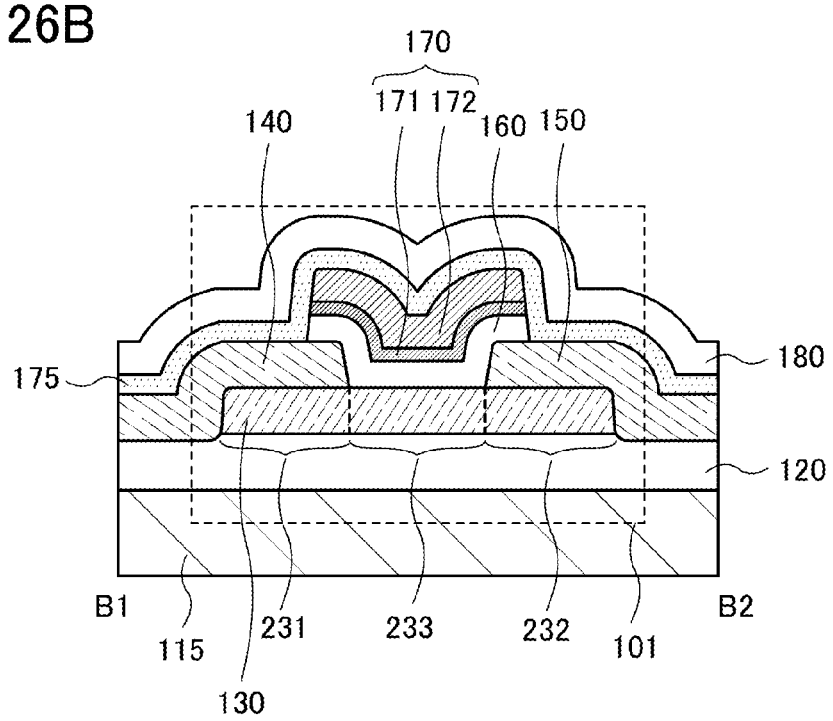
Figure 32A:
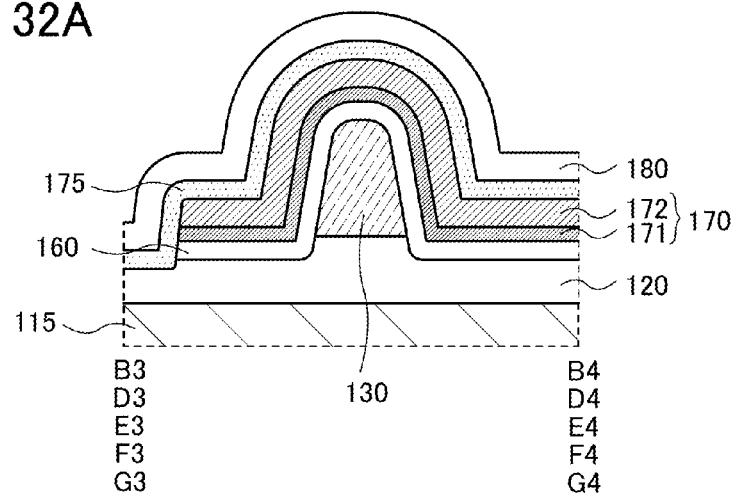
FIGS. 32A to 32D each illustrate a cross section of a transistor in a channel width direction.

FIGS. 26A and 26B are a top view and a cross-sectional view illustrating a transistor 101 in one embodiment of the present invention. FIG. 26A is the top view, and FIG. 26B illustrates a cross section taken along dashed-dotted line B1-B2 in FIG. 26A. A cross section in the direction of dashed-dotted line B3-B4 in FIG. 26A is illustrated in FIG. 32A. In some cases, the direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 26B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, for example, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be changed into the term "wiring".

The conductive layer 170 includes two layers, conductive layers 171 and 172, but also may be a single layer or a stack of three or more layers. The same applies to other transistors described in this embodiment.

Each of the conductive layers 140 and 150 is a single layer, but also may be a stack of two or more layers. The same applies to other transistors described in this embodiment.

Figure 27A:
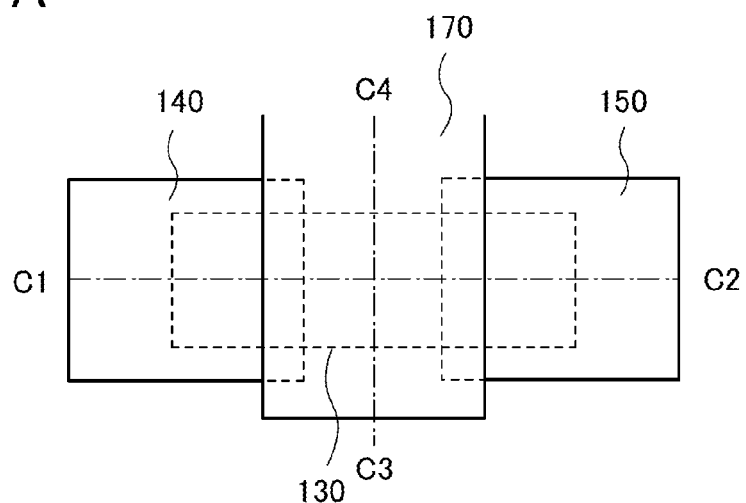
FIGS. 27A and 27B are a top view and a cross-sectional view illustrating a transistor.
Figure 27B:
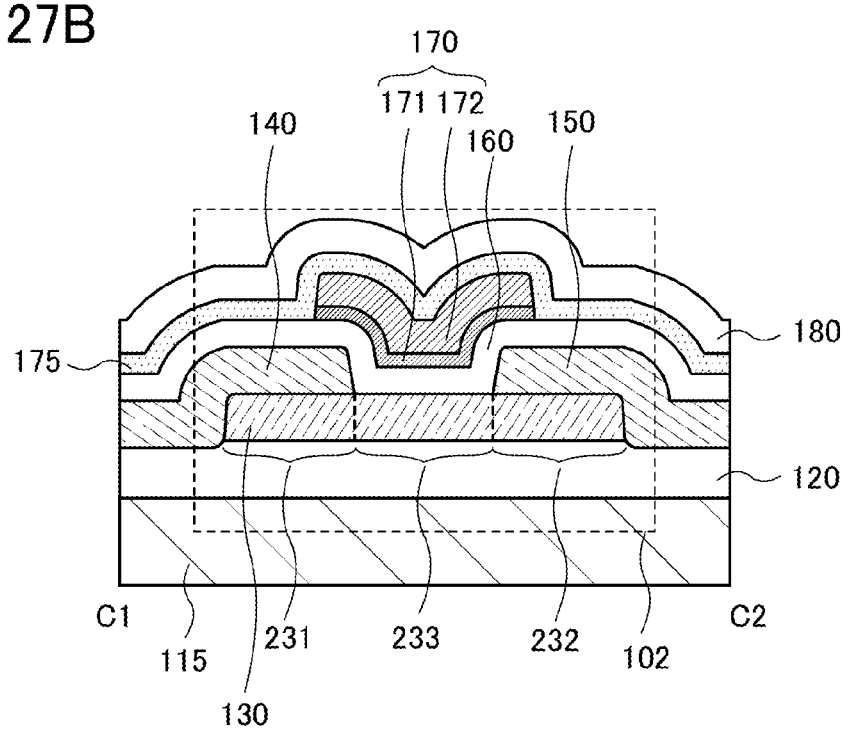
Figure 32B:
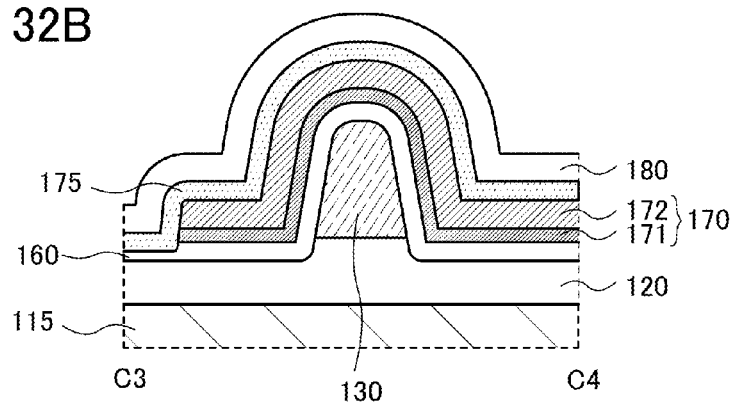

The transistor in one embodiment of the present invention may have a structure illustrated in FIGS. 27A and 27B. FIG. 27A is a top view of a transistor 102. A cross section in the direction of dashed-dotted line C1-C2 in FIG. 27A is illustrated in FIG. 27B. A cross section in the direction of dashed-dotted line C3-C4 in FIG. 27A is illustrated in FIG. 32B. In some cases, the direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with high on-state current can be easily formed.

Figure 28A:
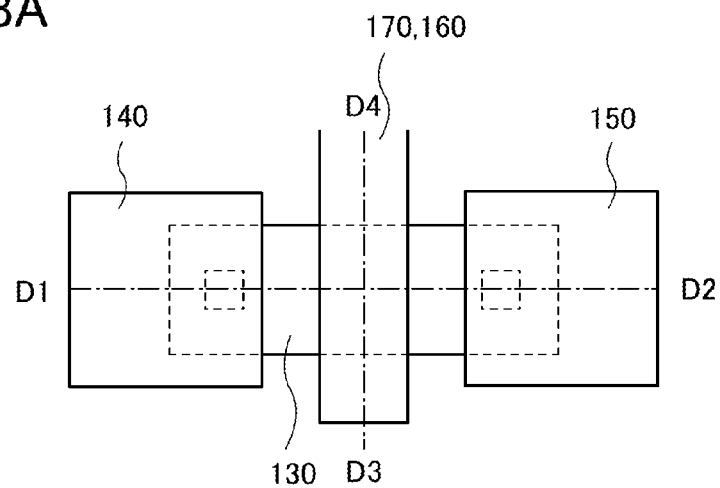
FIGS. 28A and 28B are a top view and a cross-sectional view illustrating a transistor.
Figure 28B:
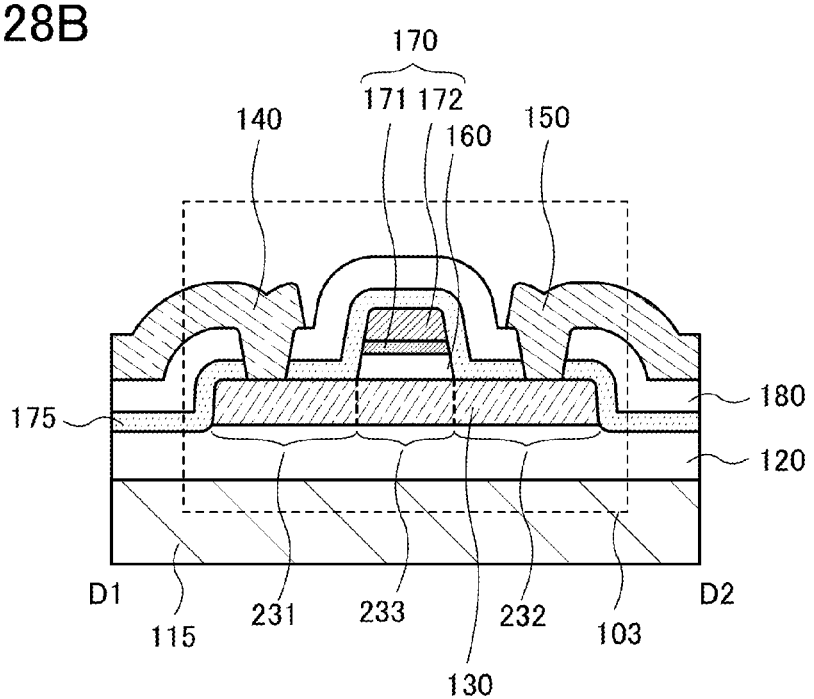

The transistor in one embodiment of the present invention may have a structure illustrated in FIGS. 28A and 28B. FIG. 28A is a top view of a transistor 103. A cross section in the direction of dashed-dotted line D1-D2 in FIG. 28A is illustrated in FIG. 28B. A cross section in the direction of dashed-dotted line D3-D4 in FIG. 28A is illustrated in FIG. 32A. In some cases, the direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 28B can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 29A:
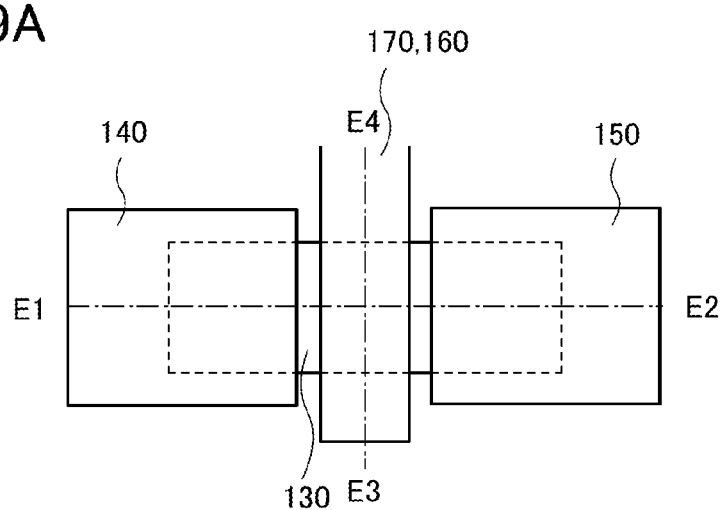
FIGS. 29A and 29B are a top view and a cross-sectional view illustrating a transistor.
Figure 29B:
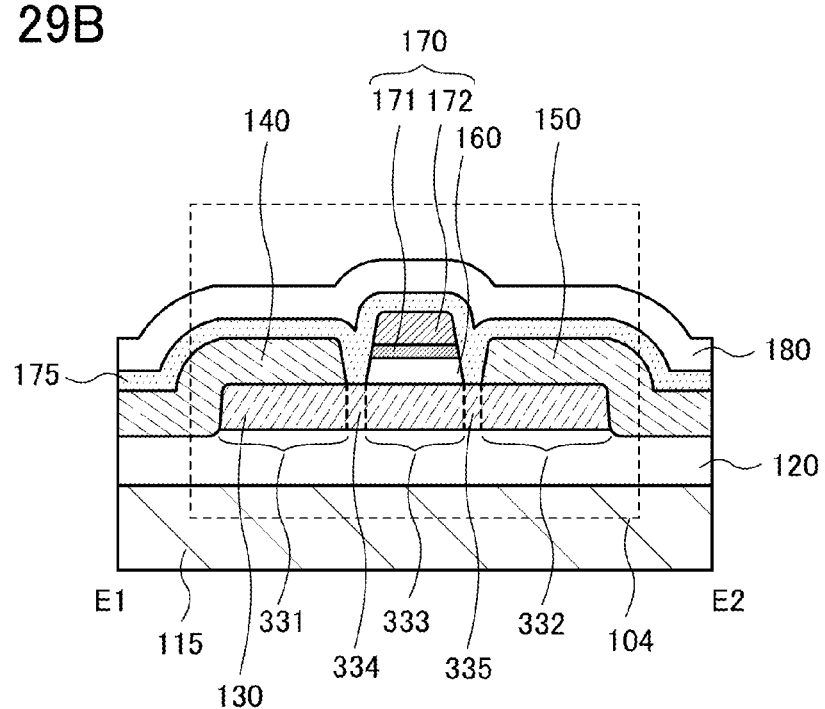

The transistor in one embodiment of the present invention may have a structure illustrated in FIGS. 29A and 29B. FIG. 29A is a top view of a transistor 104. A cross section in the direction of dashed-dotted line E1-E2 in FIG. 29A is illustrated in FIG. 29B. A cross section in the direction of dashed-dotted line E3-E4 in FIG. 29A is illustrated in FIG. 32A. In some cases, the direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 29B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the width of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 30A:
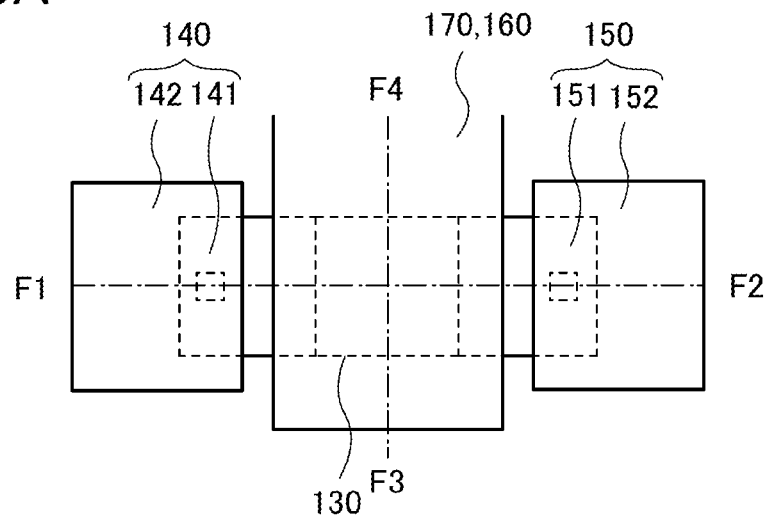
FIGS. 30A and 30B are a top view and a cross-sectional view illustrating a transistor.
Figure 30B:
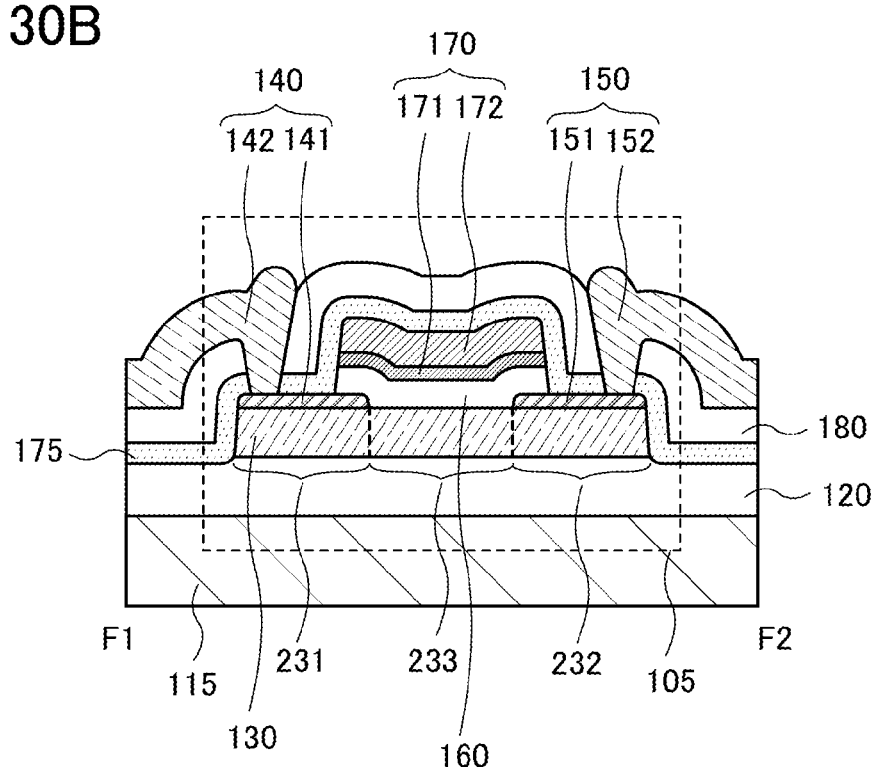

The transistor in one embodiment of the present invention may have a structure illustrated in FIGS. 30A and 30B. FIG. 30A is a top view of a transistor 105. A cross section in the direction of dashed-dotted line F1-F2 in FIG. 30A is illustrated in FIG. 30B. A cross section in the direction of dashed-dotted line F3-F4 in FIG. 30A is illustrated in FIG. 32A. In some cases, the direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 31A:
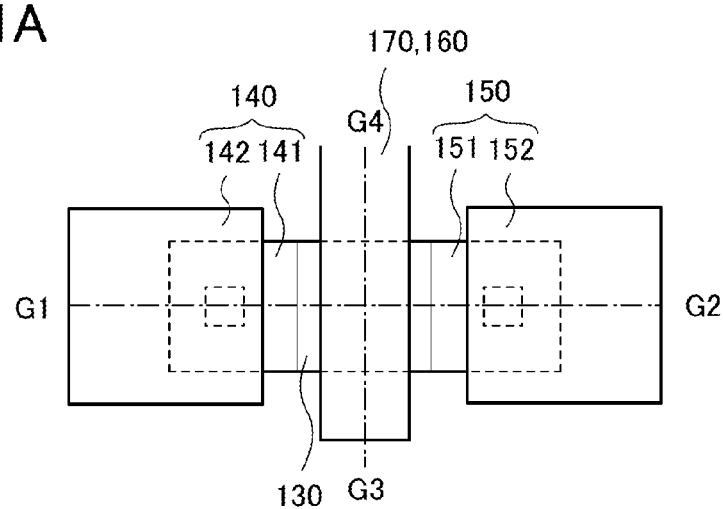
FIGS. 31A and 31B are a top view and a cross-sectional view illustrating a transistor.
Figure 31B:
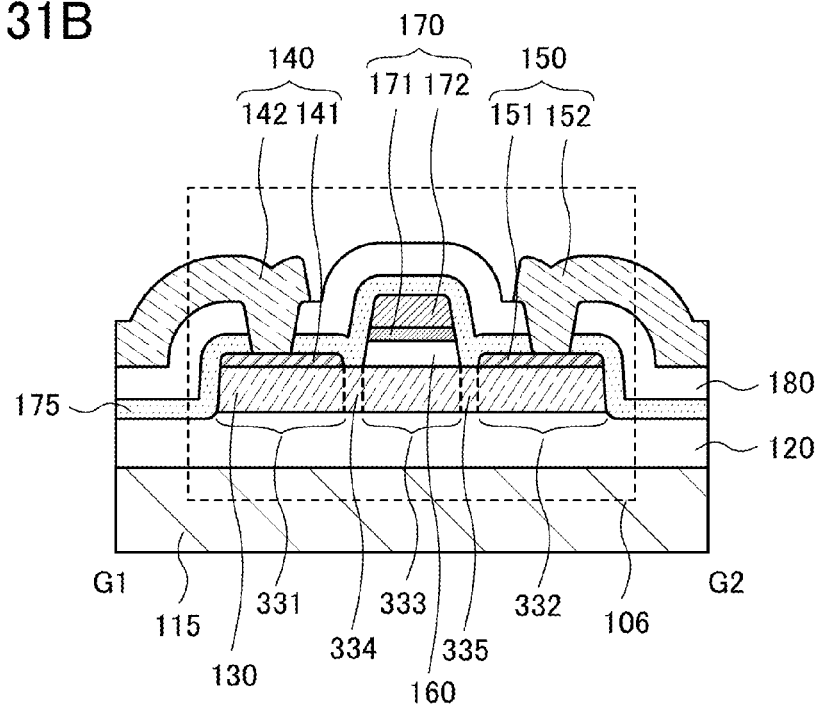

The transistor in one embodiment of the present invention may have a structure illustrated in FIGS. 31A and 31B. FIG. 31A is a top view of a transistor 106. A cross section in the direction of dashed-dotted line G1-G2 in FIG. 31A is illustrated in FIG. 31B. A cross section in the direction of dashed-dotted line G3-G4 in FIG. 31A is illustrated in FIG. 32A. In some cases, the direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property in a manner similar to the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 32C:
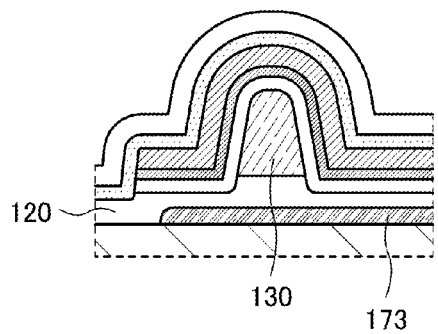
Figure 32D:
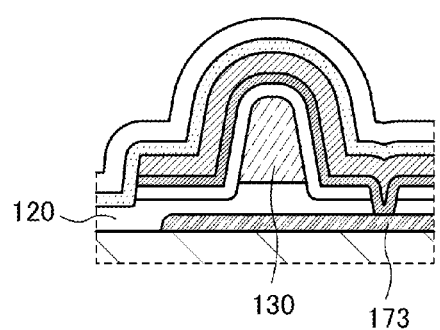

The transistor in one embodiment of the present invention may include a conductive layer 173 between the oxide semiconductor layer 130 and the substrate 115 as illustrated in cross-sectional views in the channel length direction in FIGS. 33A to 33F and cross-sectional views in the channel width direction in FIGS. 32C and 32D. When the conductive layer 173 is used as a second gate electrode layer (back gate), the on-state current can be increased or the threshold voltage can be controlled. In the cross-sectional views in FIGS. 33A to 33F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 32D, the conductive layers 170 and 173 may be electrically connected to each other through a contact hole.

Although the transistors 101 to 106 in FIGS. 26A and 26B, FIGS. 27A and 27B, FIGS. 28A and 28B, FIGS. 29A and 29B, FIGS. 30A and 30B, and FIGS. 31A and 31B are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIG. 34B, 34C, 34D, or 34E.

Figure 34A:
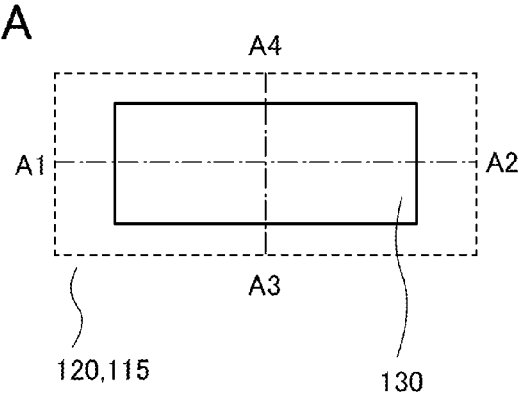
FIGS. 34A to 34E are a top view and cross-sectional views illustrating a semiconductor layer.
Figure 34B:
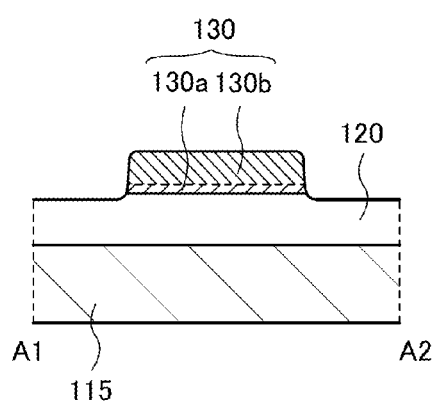
Figure 34D:
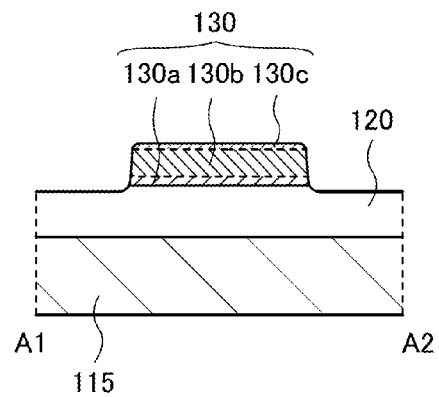
Figure 34C:
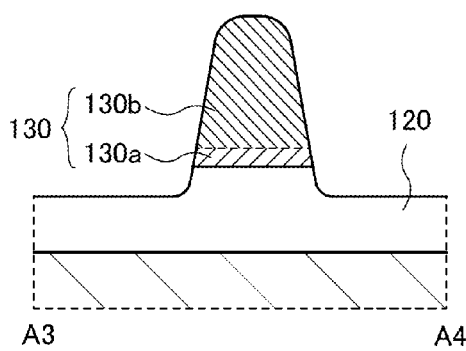
Figure 34E:
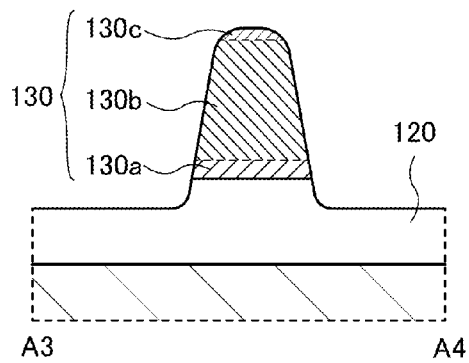

FIG. 34A is a top view of the oxide semiconductor layer 130, and FIGS. 34B and 34C are cross-sectional views of the oxide semiconductor layer 130 with a two-layer structure. FIGS. 34D and 34E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 35A:
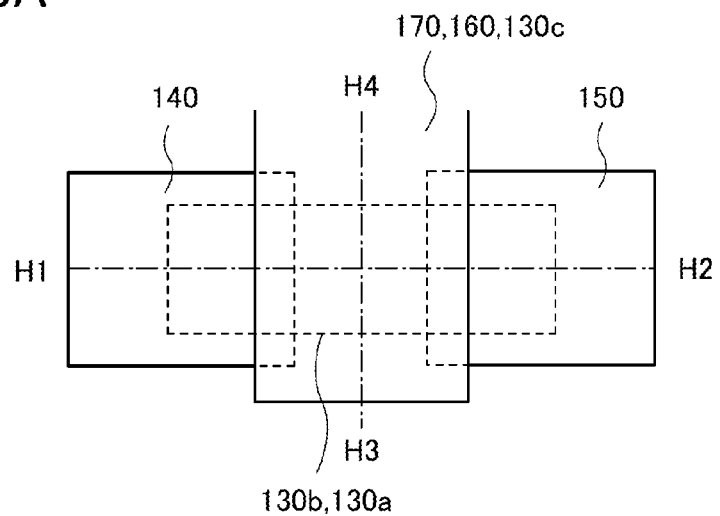
FIGS. 35A and 35B are a top view and a cross-sectional view illustrating a transistor.
Figure 35B:
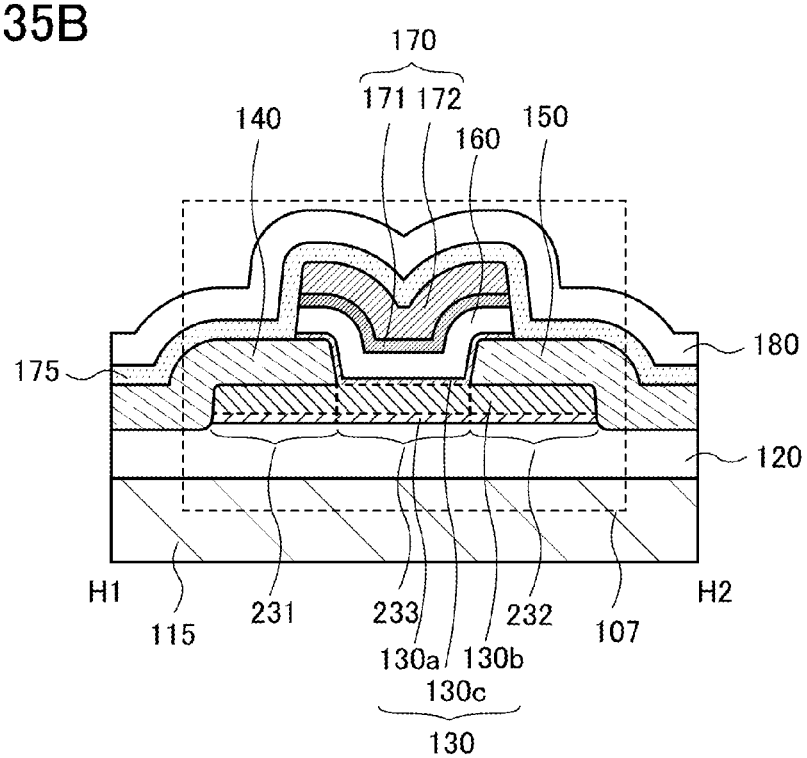
Figure 41A:
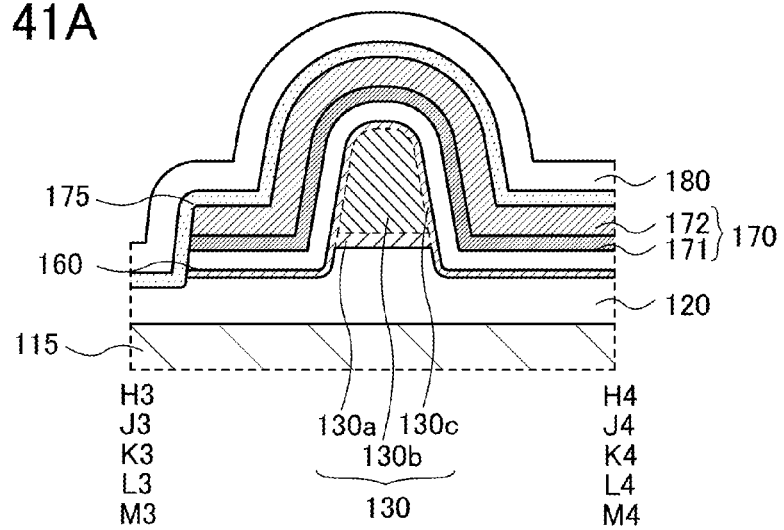
FIGS. 41A to 41D each illustrate a cross section of a transistor in a channel width direction.

The transistor in one embodiment of the present invention may have a structure illustrated in FIGS. 35A and 35B. FIG. 35A is a top view of a transistor 107. A cross section in the direction of dashed-dotted line H1-H2 in FIG. 35A is illustrated in FIG. 35B. A cross section in the direction of dashed-dotted line H3-H4 in FIG. 35A is illustrated in FIG. 41A. In some cases, the direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 36A:
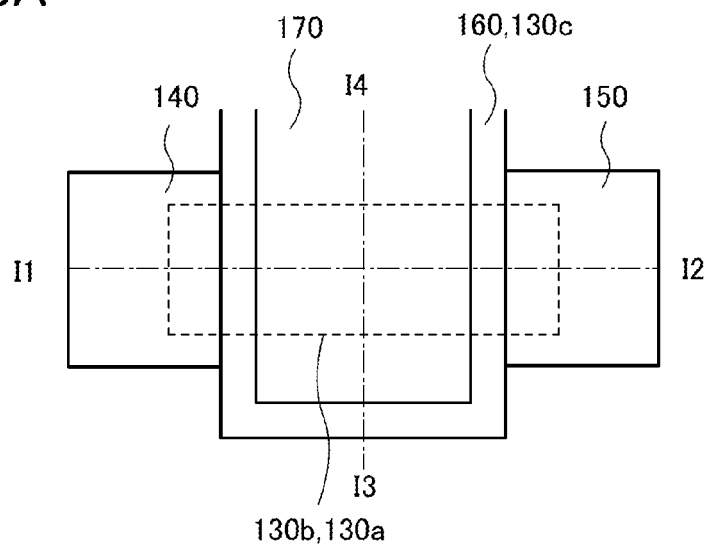
FIGS. 36A and 36B are a top view and a cross-sectional view illustrating a transistor.
Figure 36B:
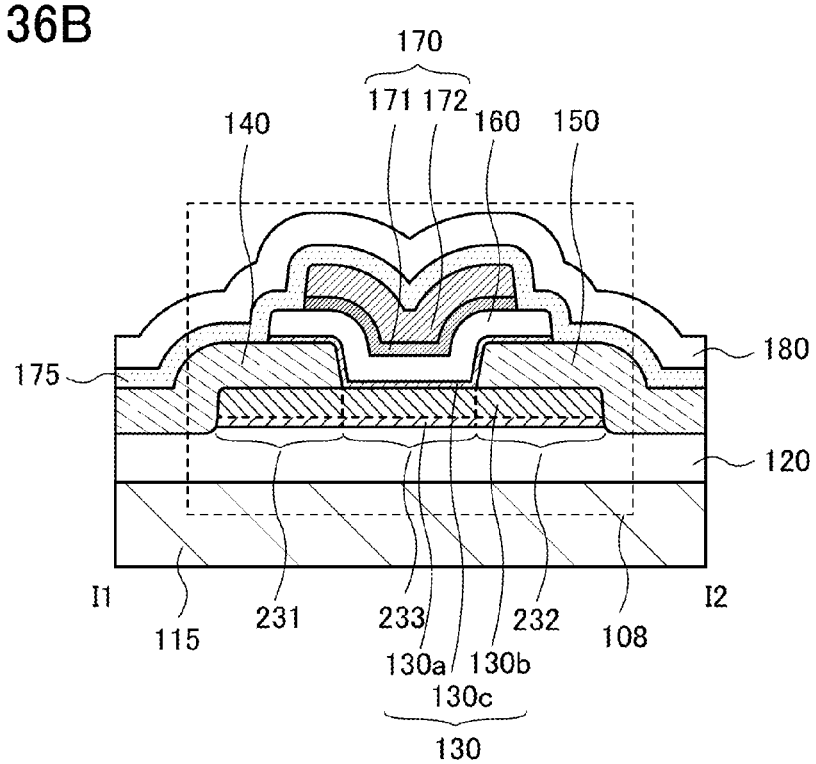
Figure 41B:
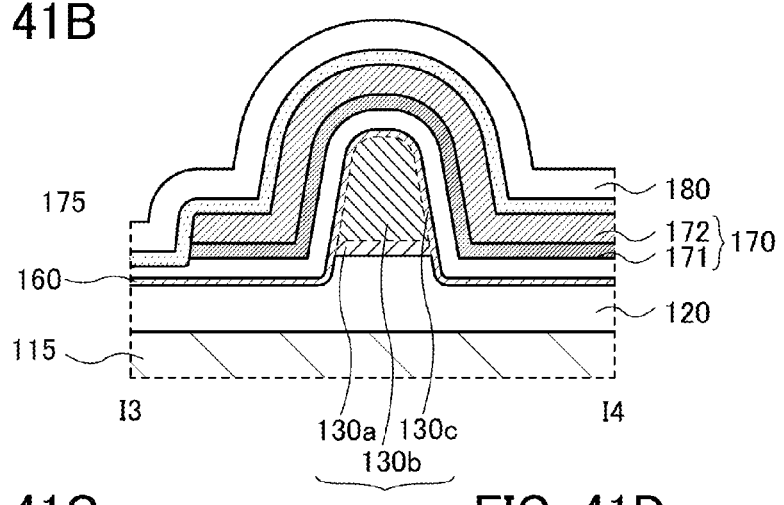

The transistor in one embodiment of the present invention may have a structure illustrated in FIGS. 36A and 36B. FIG. 36A is a top view of a transistor 108. A cross section in the direction of dashed-dotted line I1-I2 in FIG. 36A is illustrated in FIG. 36B. A cross section in the direction of dashed-dotted line I3-I4 in FIG. 36A is illustrated in FIG. 41B. In some cases, the direction of dashed-dotted line I1-I2 is referred to as a channel length direction, and the direction of dashed-dotted line I3-I4 is referred to as a channel width direction.

The transistor 108 has the same structure as the transistor 102 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 37A:
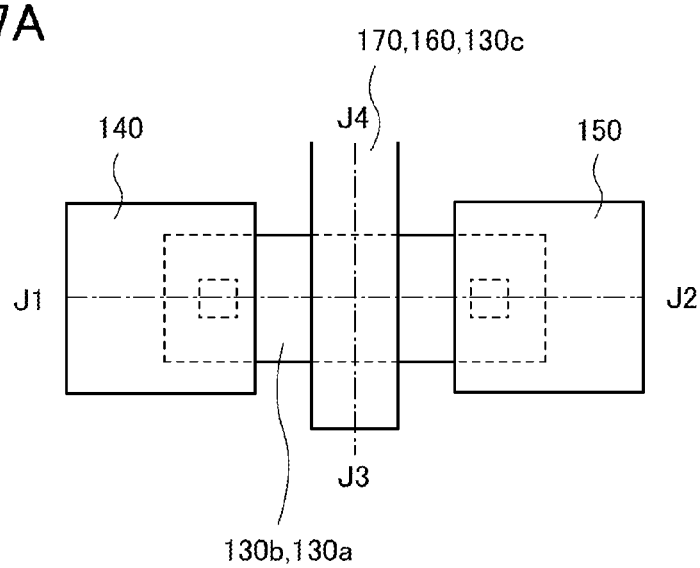
FIGS. 37A and 37B are a top view and a cross-sectional view illustrating a transistor.
Figure 37B:
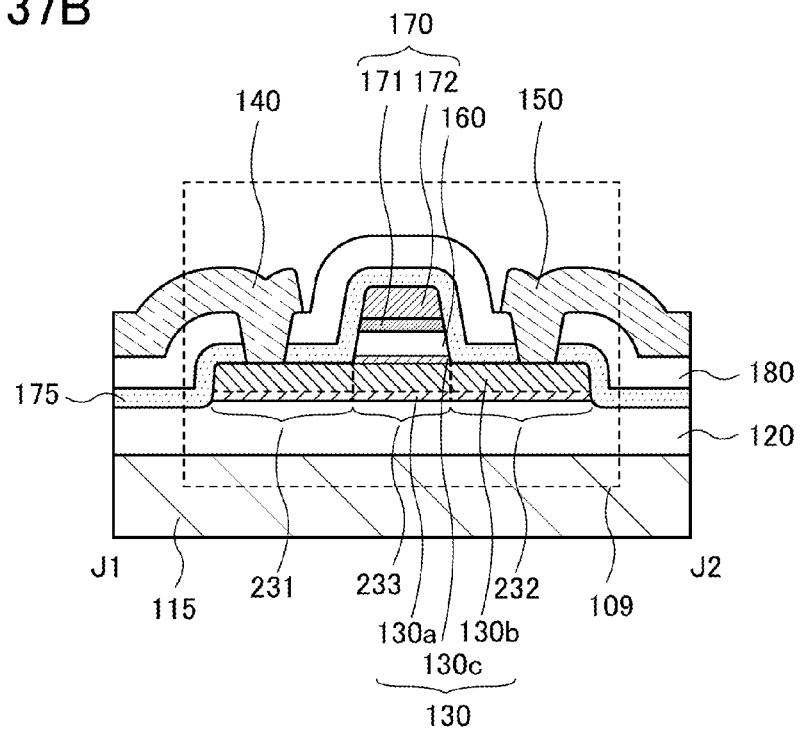

The transistor in one embodiment of the present invention may have a structure illustrated in FIGS. 37A and 37B. FIG. 37A is a top view of a transistor 109. A cross section in the direction of dashed-dotted line J1-J2 in FIG. 37A is illustrated in FIG. 37B. A cross section in the direction of dashed-dotted line J3-J4 in FIG. 37A is illustrated in FIG. 41A. In some cases, the direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 38A:
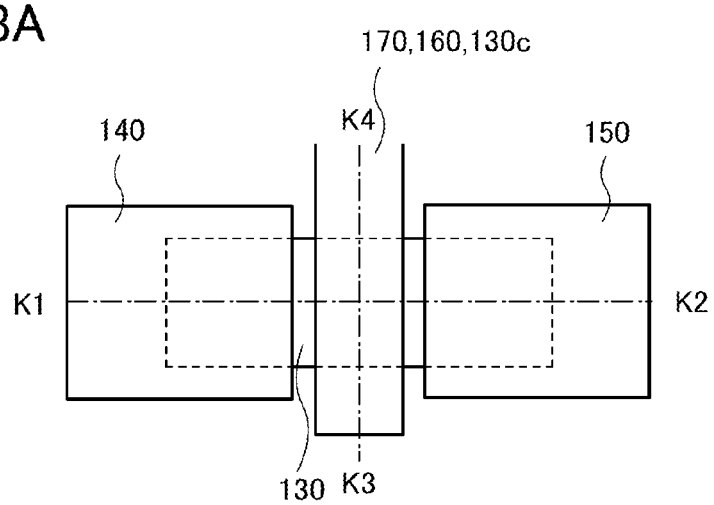
FIGS. 38A and 38B are a top view and a cross-sectional view illustrating a transistor.
Figure 38B:
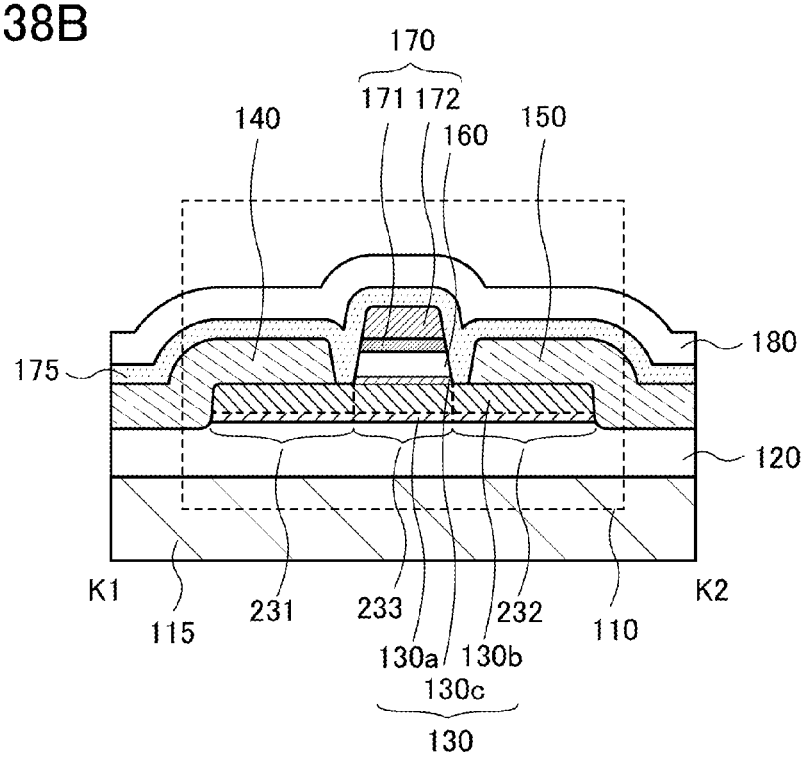

The transistor in one embodiment of the present invention may have a structure illustrated in FIGS. 38A and 38B. FIG. 38A is a top view of a transistor 110. A cross section in the direction of dashed-dotted line K1-K2 in FIG. 38A is illustrated in FIG. 38B. A cross section in the direction of dashed-dotted line K3-K4 in FIG. 38A is illustrated in FIG. 41A. In some cases, the direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 39A:
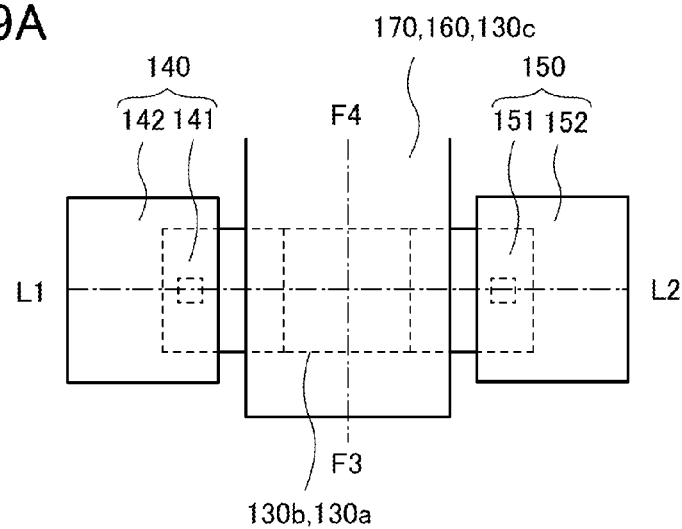
FIGS. 39A and 39B are a top view and a cross-sectional view illustrating a transistor.
Figure 39B:
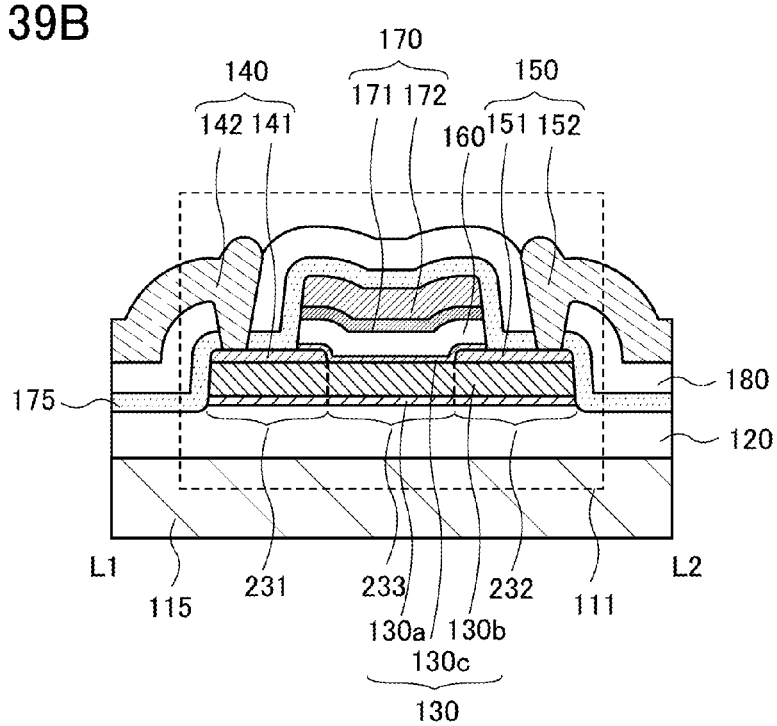

The transistor in one embodiment of the present invention may have a structure illustrated in FIGS. 39A and 39B. FIG. 39A is a top view of a transistor 111. A cross section in the direction of dashed-dotted line L1-L2 in FIG. 39A is illustrated in FIG. 39B. A cross section in the direction of dashed-dotted line L3-L4 in FIG. 39A is illustrated in FIG. 41A. In some cases, the direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 40A:
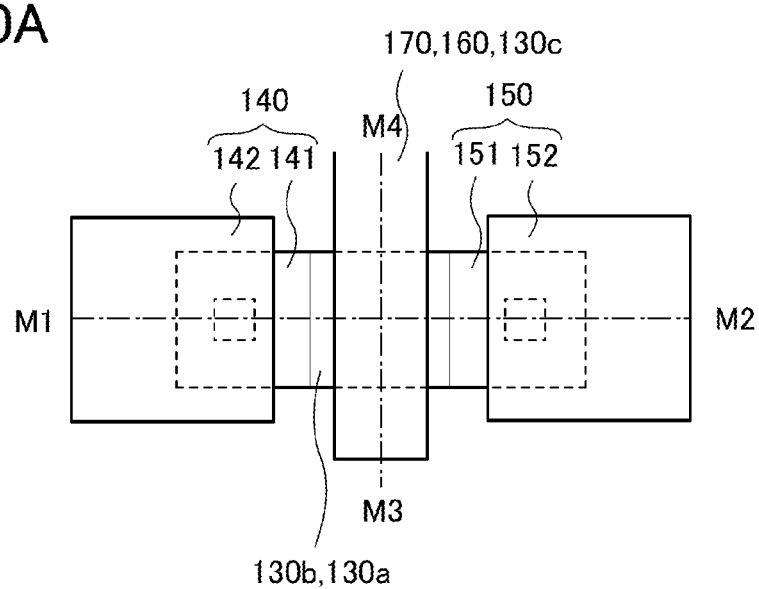
FIGS. 40A and 40B are a top view and a cross-sectional view illustrating a transistor.
Figure 40B:
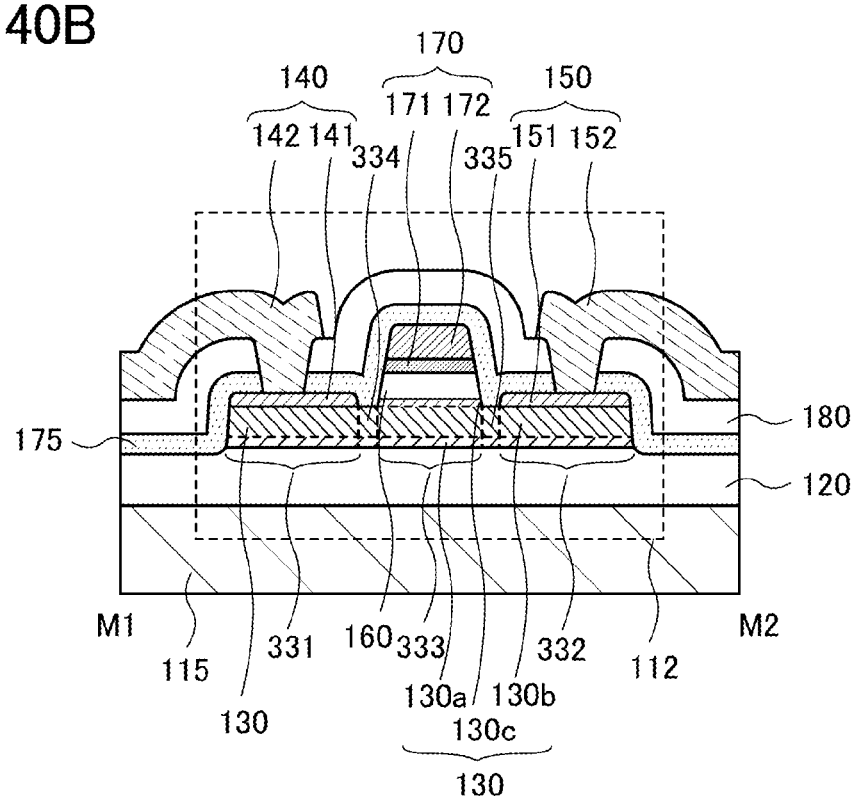

The transistor in one embodiment of the present invention may have a structure illustrated in FIGS. 40A and 40B. FIG. 40A is a top view of a transistor 112. A cross section in the direction of dashed-dotted line M1-M2 in FIG. 40A is illustrated in FIG. 40B. A cross section in the direction of dashed-dotted line M3-M4 in FIG. 40A is illustrated in FIG. 41A. In some cases, the direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 41C:
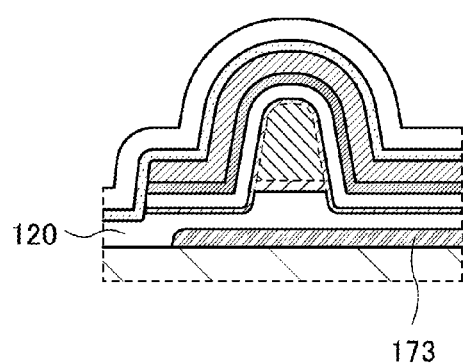
Figure 41D:
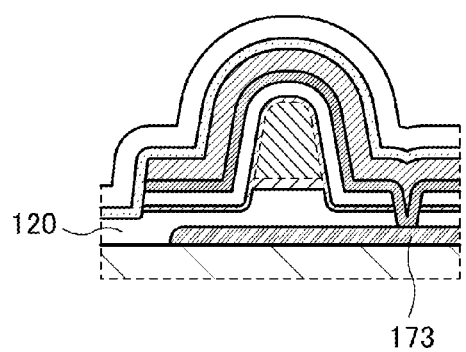
Figure 42A:
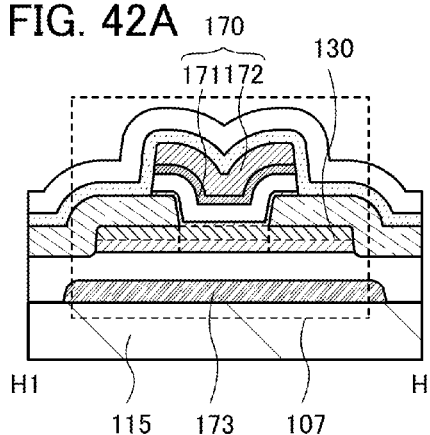
FIGS. 42A to 42F each illustrate a cross section of a transistor in a channel length direction.
Figure 42B:
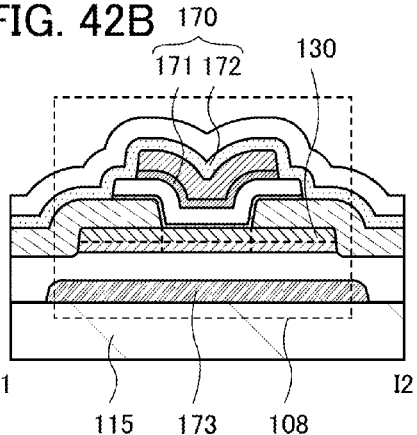
Figure 42C:
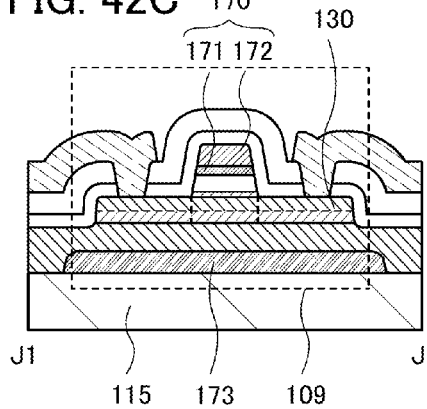
Figure 42D:
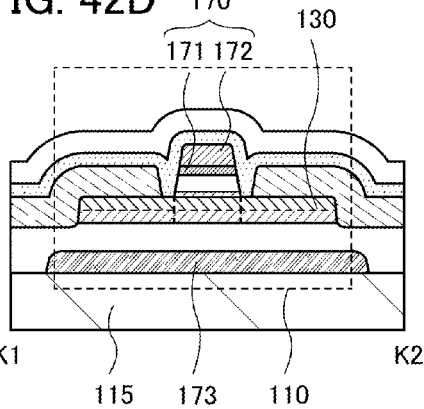
Figure 42E:
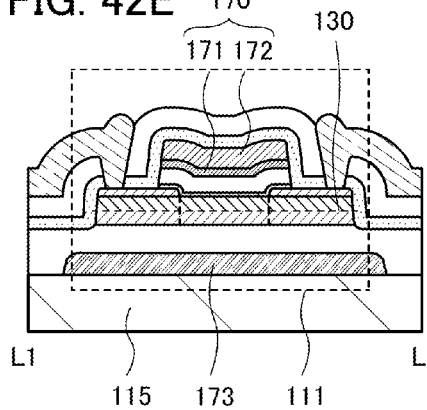
Figure 42F:
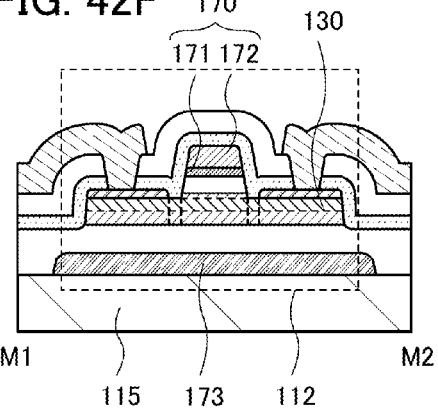

The transistor in one embodiment of the present invention may include the conductive layer 173 between the oxide semiconductor layer 130 and the substrate 115 as illustrated in cross-sectional views in the channel length direction in FIGS. 42A to 42F and cross-sectional views in the channel width direction in FIGS. 41C and 41D. When the conductive layer is used as a second gate electrode layer (back gate), the on-state current can be increased or the threshold voltage can be controlled. In the cross-sectional views in FIGS. 42A to 42F, the width of the conductive layer 173 may be shorter than that of the oxide semiconductor layer 130. Moreover, the width of the conductive layer 173 may be shorter than that of the conductive layer 170.

Figure 43A:
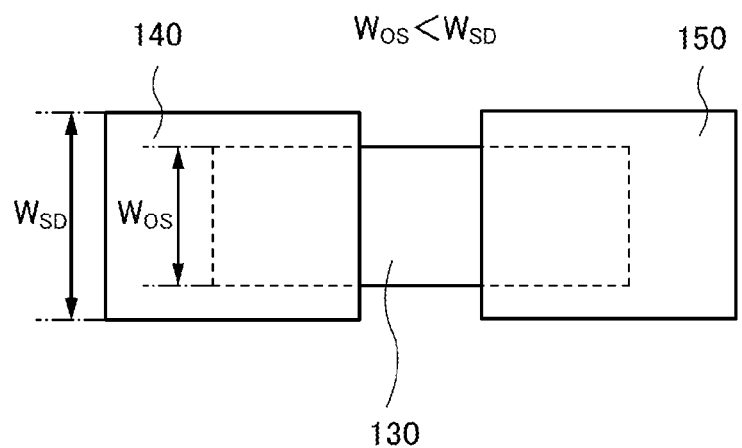
FIGS. 43A and 43B are top views illustrating transistors.
Figure 43B:
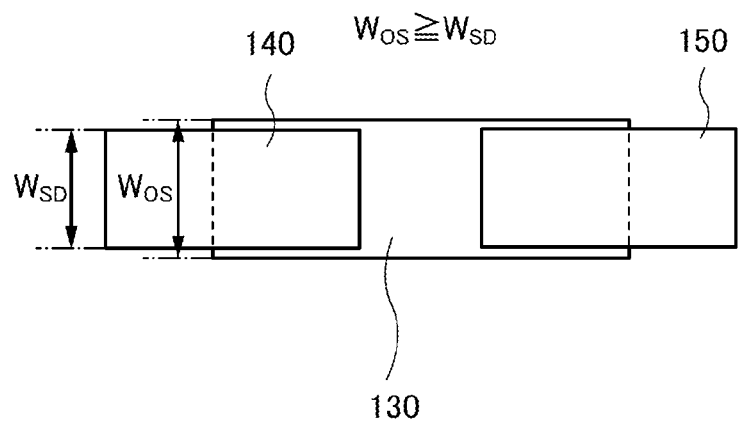

Furthermore, as shown in the top views in FIGS. 43A and 43B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor in one embodiment of the present invention (any of the transistors 101 to 112), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows to the oxide semiconductor layer 130b, the current is hardly influenced by interface scattering, leading to high on-state current. Note that increasing the thickness of the oxide semiconductor layer 130b can increase the on-state current. The thickness of the oxide semiconductor layer 130b may be, for example, 100 nm to 200 nm.

A semiconductor device including a transistor with any of the above structures can have favorable electrical characteristics.

The structure described above in this embodiment can be combined with any of the structures described in the other embodiments as appropriate.

(Embodiment 5)

In this embodiment, components of the transistors described in Embodiment 4 are described in detail.

The substrate 115 can include a silicon substrate provided with a transistor; and an insulating layer, a wiring, a conductor functioning as a contact plug, and the like that are provided over the silicon substrate. Note that when p-channel transistors are formed using the silicon substrate, a silicon substrate with n$^-$-type conductivity is preferably used. Alternatively, an SOI substrate including an n$^-$-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. For example, the insulating layer 120 is a film of which the amount of released oxygen when converted into oxygen atoms is $1.0 \times 10^{19}$ atoms/cm$^3$ or more in thermal desorption spectroscopy (TDS) analysis performed such that the surface temperature is higher than or equal to 100° C. and lower than or equal to 700° C., preferably higher than or equal to 100° C. and lower than or equal to 500° C. Note that the temperature of the film surface in the TDS analysis is preferably higher than or equal to 100° C. and lower than or equal to 700° C., or higher than or equal to 100° C. and lower than or equal to 500° C. In the case where the substrate 115 is provided with another device as described above, the insulating layer 120 also has a function as an interlayer insulating film. In that case, the insulating layer 120 is preferably subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which a layer corresponding to the oxide semiconductor layer 130a and a layer corresponding to the oxide semiconductor layer 130b are sequentially stacked from the insulating layer 120 side described in this embodiment is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 times or more, preferably 2 times or more, further preferably 3 times or more as large as that in the oxide semiconductor layer 130b. Any of the above metal elements is strongly bonded to oxygen and thus has a function of suppressing generation of an oxygen vacancy in the oxide semiconductor layers 130a and 130c. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)n$ (n>0, where n is an integer) may be used.

Note that when each of the oxide semiconductor layers 130a to 130c is an In-M-Zn oxide containing at least indium, zinc, and M (M is a metal such as Al, Ti, Ga, Ge, Y, Zr, Sn, La, Ce, or Hf), in the case where the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 130a and 130c are preferably less than 50 atomic % and greater than or equal to 50 atomic %, respectively, further preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, further preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, further preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor layer 130b is preferably thicker than the oxide semiconductor layers 130a and 130c.

Note that in order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1\times10^{17}/cm^3$, lower than $1\times10^{15}/cm^3$, or lower than $1\times10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of silicon estimated by secondary ion mass spectrometry (SIMS) is lower than $1\times10^{19}$ atoms/cm$^3$, preferably lower than $5\times10^{18}$ atoms/cm$^3$, further preferably lower than $1\times10^{18}$ atoms/cm$^3$. In addition, the oxide semiconductor layer is controlled to have a region in which the concentration of hydrogen is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. In addition, the oxide semiconductor layer is controlled to have a region in which the concentration of nitrogen is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The high concentration of silicon or carbon might reduce the crystallinity of the oxide semiconductor layer. In order not to lower the crystallinity of the oxide semiconductor layer, for example, the oxide semiconductor layer is controlled to have a region in which the concentration of silicon is lower than $1\times10^{19}$ atoms/cm$^3$, preferably lower than $5\times10^{18}$ atoms/cm$^3$, further preferably lower than $1\times10^{18}$ atoms/cm$^3$. Furthermore, the oxide semiconductor layer is controlled to have a region in which the concentration of carbon is lower than $1\times10^{19}$ atoms/cm$^3$, preferably lower than $5\times10^{18}$ atoms/cm$^3$, further preferably lower than $1\times10^{18}$ atoms/cm$^3$.

A transistor in which a highly purified oxide semiconductor film is used for a channel formation region exhibits extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor in one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimums of the oxide semiconductor layers 130a to 130c are continuous. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga and Zn is 1:1:1, 2:1:3, 5:5:6, or 3:1:2 can be used for the oxide semiconductor layer 130b. In the case where each of the oxide semiconductor layers 130a, 130b, and 130c is formed using the above oxide as a sputtering target, the atomic ratio of each sputtering target and that of each formed oxide semiconductor layer are not necessarily consistent with each other and different within a range of ±40%.

The oxide semiconductor layer 130b of the oxide semiconductor layer 130 serves as a well, so that a channel is formed in the oxide semiconductor layer 130b. Note that since the conduction band minimums are continuous, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in a positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus makes subsequent process temperatures comparatively high. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor film that is in contact with any of the above materials, oxygen is released from the oxide semiconductor film and an oxygen vacancy is formed. Hydrogen slightly contained in the film and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, by using hafnium oxide or aluminum oxide, the thickness of the insulating layer 160 can be larger than silicon oxide; thus, leakage current due to tunnel current can be low. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide becomes high in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 4, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 4. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an effect of making an interface state less likely to be formed is obtained. In the transistor in one embodiment of the present invention in which the oxide semiconductor layer 130 has a three-layer structure, since the oxide semiconductor layer 130b is positioned at the middle of the three-layer structure, an effect of eliminating the influence of an impurity that enters from upper and lower layers on the oxide semiconductor layer 130b is obtained as well. Therefore, the transistor can achieve not only the increase in the on-state current of the transistor but also stabilization of the threshold voltage and a reduction in the S value (subthreshold value). Thus, current when gate voltage VG is 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. The chemical formula of trimethylgallium is $Ga(CH_3)_3$. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as hafnium tetrakis(dimethylamide) hafnium (TDMAH, $Hf[N(CH_3)_2]_4$) and tetrakis(ethylmethylamide)hafnium) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

The structure described above in this embodiment can be combined with any of the structures described in the other embodiments as appropriate.

(Embodiment 6)

The structure of an oxide semiconductor film that can be used for one embodiment of the present invention is described below.

In this specification, the term "parallel" indicates that the angle formed between two straight lines is greater than or equal to −10° and less than or equal to 10°, and accordingly includes the case where the angle is greater than or equal to −5° and less than or equal to 5°. The term "perpendicular" indicates that an angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is roughly classified into a non-single-crystal oxide semiconductor film and a single-crystal oxide semiconductor film. The non-single-crystal oxide semiconductor film means any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image, a crystal grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, circumferentially distributed spots are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

Note that an oxide semiconductor film may be a stacked film including two or more films of an amorphous oxide semiconductor film, an amorphous-like OS film, a microcrystalline oxide semiconductor film, and a CAAC-OS film, for example.

The structure described above in this embodiment can be combined with any of the structures described in the other embodiments as appropriate.

(Embodiment 7)

An imaging device in one embodiment of the present invention and a semiconductor device including the imaging device can be used for display devices, personal computers, or image reproducing devices provided with recording media (typically, devices that reproduce the content of recording media such as digital versatile discs (DVDs) and have displays for displaying the reproduced images). Furthermore, as electronic devices that can include the imaging device in one embodiment of the present invention and the semiconductor device including the imaging device, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 44A to 44F illustrate specific examples of these electronic devices.

Figure 44A:
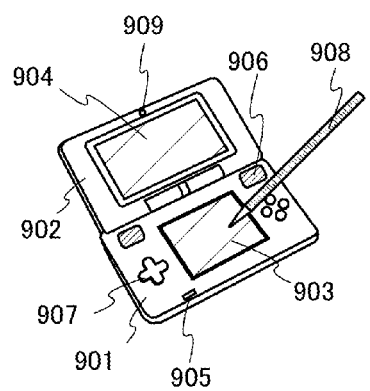
FIGS. 44A to 44F each illustrate an electronic device.

FIG. 44A illustrates a portable game machine, which includes housings 901 and 902, display portions 903 and 904, a microphone 905, speakers 906, an operation key 907, a stylus 908, a camera 909, and the like. Although the portable game machine in FIG. 44A has the two display portions 903 and 904, the number of display portions included in the portable game machine is not limited to this. The imaging device in one embodiment of the present invention can be used for the camera 909.

Figure 44B:
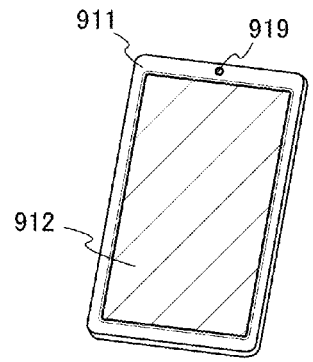

FIG. 44B illustrates a portable data terminal, which includes a first housing 911, a display portion 912, a camera 919, and the like. The touch panel function of the display portion 912 enables input and output of information. The imaging device in one embodiment of the present invention can be used for the camera 919.

Figure 44C:
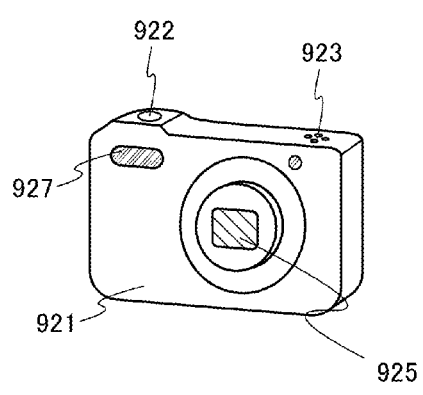

FIG. 44C illustrates a digital camera, which includes a housing 921, a shutter button 922, a microphone 923, a light-emitting portion 927, a lens 925, and the like. The imaging device in one embodiment of the present invention can be provided in a focus position of the lens 925.

Figure 44D:
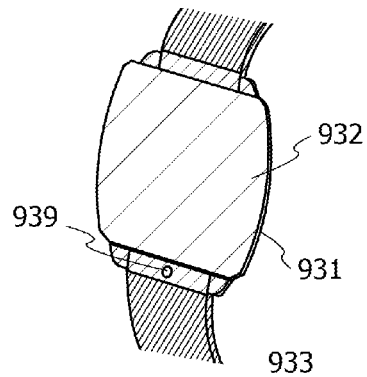

FIG. 44D illustrates a wrist-watch-type information terminal, which includes a housing 931, a display portion 932, a wristband 933, a camera 939, and the like. The display portion 932 may be a touch panel. The imaging device in one embodiment of the present invention can be used for the camera 939.

Figure 44E:
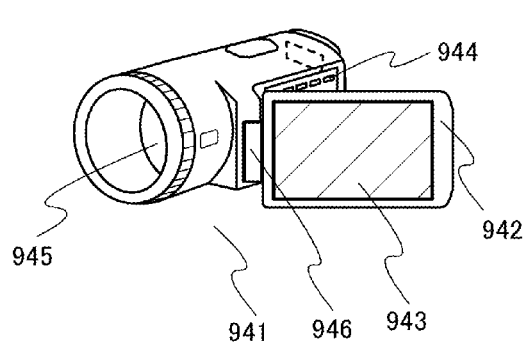

FIG. 44E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and an angle between the first housing 941 and the second housing 942 can be changed with the joint 946. An image displayed on the display portion 943 may be switched in accordance with the angle between the first housing 941 and the second housing 942 at the joint 946. The imaging device in one embodiment of the present invention can be provided in a focus position of the lens 945.

Figure 44F:
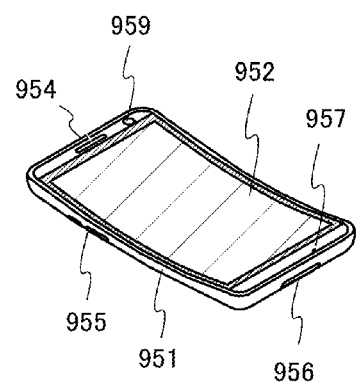

FIG. 44F illustrates a cellular phone, which includes a display portion 952, a microphone 957, a speaker 954, a camera 959, an input/output terminal 956, an operation button 955, and the like in a housing 951. The imaging device in one embodiment of the present invention can be used for the camera 959.

Note that this embodiment can be combined with any of the other embodiments described in this specification as appropriate.

REFERENCE NUMERALS

40: silicon substrate, 41: substrate, 51: transistor, 52: transistor, 53: transistor, 54: transistor, 55: transistor, 56: transistor, 58: capacitor, 59: active layer, 60: photoelectric conversion element, 61: photoelectric conversion layer, 62: light-transmitting conductive layer, 63: semiconductor layer, 64: semiconductor layer, 65: semiconductor layer, 70: conductor, 71: wiring, 72: wiring, 73: wiring, 74: partition wall, 75: wiring, 80: insulating layer, 91: pixel circuit, 91a: circuit, 91b: circuit, 92a: circuit, 92b: circuit, 93: circuit, 93a: region, 93b: region, 93c: region, 94: circuit, 95: circuit, 96: region, 101: transistor, 102: transistor, 103: transistor, 104: transistor, 105: transistor, 106: transistor, 107: transistor, 108: transistor, 109: transistor, 110: transistor, 111: transistor, 112: transistor, 115: substrate, 120: insulating layer, 130: oxide semiconductor layer, 130*a*: oxide semiconductor layer, 130*b*: oxide semiconductor layer, 130*c*: oxide semiconductor layer, 140: conductive layer, 141: conductive layer, 142: conductive layer, 150: conductive layer, 151: conductive layer, 152: conductive layer, 160: insulating layer, 170: conductive layer, 171: conductive layer, 172: conductive layer, 173: conductive layer, 175: insulating layer, 180: insulating layer, 231: region, 232: region, 233: region, 311: wiring, 312: wiring, 313: wiring, 314: wiring, 315: wiring, 316: wiring, 317: wiring, 331: region, 332: region, 333: region, 334: region, 335: region, 400: pixel portion, 400*a*: pixel portion, 400*b*: pixel portion, 400*d*: pixel portion, 400*h*: pixel portion, 400*p*: pixel portion, 411: circuit, 412: circuit, 413: circuit, 414: circuit, 421: circuit, 422: circuit, 423: circuit, 424: circuit, 431: circuit, 432: circuit, 433: circuit, 434: circuit, 435: circuit, 438: circuit, 441: data line, 442: data line, 443: data line, 444: data line, 445: data line, 448: data line, 450: circuit, 501: signal, 502: signal, 503: signal, 504: signal, 505: signal, 506: signal, 507: signal, 508: signal, 509: signal, 510: period, 511: period, 520: period, 531: period, 610: period, 611: period, 612: period, 621: period, 622: period, 623: period, 631: period, 701: signal, 702: signal, 703: signal, 704: signal, 705: signal, 901: housing, 902: housing, 903: display portion, 904: display portion, 905: microphone, 906: speaker, 907: operation key, 908: stylus, 909: camera, 911: housing, 912: display portion, 919: camera, 921: housing, 922: shutter button, 923: microphone, 925: lens, 927: light-emitting portion, 931: housing, 932: display portion, 933: wristband, 939: camera, 941: housing, 942: housing, 943: display portion, 944: operation key, 945: lens, 946: joint, 951: housing, 952: display portion, 954: speaker, 955: button, 956: input/output terminal, 957: microphone, 959: camera, 1100: layer, 1200: layer, 1300: layer, 1400: layer, 1500: insulating layer, 1510: light-blocking layer, 1520: organic resin layer, 1530*a*: color filter, 1530*b*: color filter, 1530*c*: color filter, 1540: microlens array, 1550: optical conversion layer.

This application is based on Japanese Patent Application serial no. 2014-196247 filed with Japan Patent Office on Sep. 26, 2014, the entire contents of which are hereby incorporated by reference.

The invention claimed is:

1. An imaging device comprising:
a first region to an n-th region (n is a natural number of 2 or more and 16 or less); and
a first circuit, a second circuit, a third circuit, and a fourth circuit in each of the first region to the n-th region,
wherein the first to third circuits each include a transistor including silicon in a channel formation region,
wherein the fourth circuit includes a photoelectric conversion element and a transistor including an oxide semiconductor in a channel formation region,
wherein the first circuit is configured to read out a first signal from the third circuit,
wherein the second circuit is configured to output a second signal for driving the fourth circuit,
wherein the third circuit is configured to process a third signal output from the fourth circuit,
wherein the fourth circuit is configured to convert light into the third signal,
wherein the first circuit includes a region overlapping with the fourth circuit, and
wherein the third circuit includes a region overlapping with the fourth circuit.

2. The imaging device according to claim 1, wherein the oxide semiconductor includes In, Zn, and M (M is Al, Ti, Ga, Sn, Y, Zr, La, Ce, Nd, or Hf).

3. The imaging device according to claim 1, wherein the photoelectric conversion element includes selenium.

4. The imaging device according to claim 1, wherein the first circuit and the second circuit each include a shift register circuit and a buffer circuit.

5. The imaging device according to claim 1, wherein the third circuit includes a correlated double sampling circuit, an analog-to-digital converter circuit, and a latch circuit.

6. The imaging device according to claim 1, wherein the first circuit is divided and positioned in two regions.

7. The imaging device according to claim 1, wherein the second circuit is divided and positioned in two regions.

8. The imaging device according to claim 1,
wherein the first circuit, the second circuit, and the third circuit are in a first layer,
wherein the transistor included in the fourth circuit is in a second layer,
wherein the photoelectric conversion element is in a third layer, and
wherein the second layer is between the first layer and the third layer.

9. An electronic device comprising:
the imaging device according to claim 1; and
a display device.

10. An imaging device comprising a pixel portion, the imaging device comprising:
a first circuit, a second circuit, a third circuit, and a fourth circuit,
wherein the first to third circuits each include a transistor including silicon in a channel formation region,
wherein the pixel portion includes the fourth circuit,
wherein the fourth circuit includes a photoelectric conversion element and a transistor including an oxide semiconductor in a channel formation region,
wherein the first circuit is configured to read out a first signal from the third circuit,
wherein the second circuit is configured to output a second signal for driving the fourth circuit,
wherein the third circuit is configured to process a third signal output from the fourth circuit,
wherein the fourth circuit is configured to convert light into the third signal,
wherein the first circuit includes a region overlapping with the pixel portion, and
wherein the third circuit includes a region overlapping with the pixel portion.

11. The imaging device according to claim 10, wherein the oxide semiconductor includes In, Zn, and M (M is Al, Ti, Ga, Sn, Y, Zr, La, Ce, Nd, or Hf).

12. The imaging device according to claim 10, wherein the photoelectric conversion element includes selenium.

13. The imaging device according to claim 10, wherein the first circuit and the second circuit each include a shift register circuit and a buffer circuit.

14. The imaging device according to claim 10, wherein the third circuit includes a correlated double sampling circuit, an analog-to-digital converter circuit, and a latch circuit.

15. The imaging device according to claim 10, wherein the first circuit is divided and positioned in two regions.

16. The imaging device according to claim 10, wherein the second circuit is divided and positioned in two regions.

17. The imaging device according to claim 10,
wherein the first circuit, the second circuit, and the third circuit are in a first layer,
wherein the transistor included in the fourth circuit is in a second layer,
wherein the photoelectric conversion element is in a third layer, and
wherein the second layer is between the first layer and the third layer.

18. An electronic device comprising:
the imaging device according to claim 10; and
a display device.

* * * * *